(12) United States Patent
Higashi

(10) Patent No.: US 7,460,988 B2
(45) Date of Patent: Dec. 2, 2008

(54) TEST EMULATOR, TEST MODULE EMULATOR, AND RECORD MEDIUM STORING PROGRAM THEREIN

(75) Inventor: Shinsaku Higashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 493 days.

(21) Appl. No.: 10/404,002

(22) Filed: Mar. 31, 2003

(65) Prior Publication Data

US 2004/0210798 A1    Oct. 21, 2004

(51) Int. Cl.
G06F 17/50 (2006.01)
G06F 7/62 (2006.01)
G06F 9/45 (2006.01)
G06F 9/455 (2006.01)
H03K 17/693 (2006.01)

(52) U.S. Cl. .............. 703/13; 703/14; 703/15; 703/22; 703/23; 703/24; 703/25; 703/26; 703/27; 703/28; 716/5; 716/16

(58) Field of Classification Search ............. 703/13–15, 703/22–28; 714/24; 716/5, 16
See application file for complete search history.

(56) References Cited

U.S. PATENT DOCUMENTS 5,384,533 A * 1/1995 Tokuda et al. ............ 324/158.1
5,425,036 A * 6/1995 Liu et al. .................... 714/735
5,841,967 A * 11/1998 Sample et al. ................ 714/33
5,951,704 A    9/1999 Sauer et al.

(Continued)

FOREIGN PATENT DOCUMENTS

JP    6-160482    6/1994

(Continued)

OTHER PUBLICATIONS

Sunburst-Design.com, "Sunburst Design—Introduction to Verilog-2001 Design", http://www.sunburst-design.com/verilog_training/Intro_Verilog_Training.pdf, Feb. 2003.*

(Continued)

*Primary Examiner*—Kamini S Shah
*Assistant Examiner*—David Silver
(74) *Attorney, Agent, or Firm*—Osha•Liang LLP

(57) ABSTRACT

There is provided a test emulator for emulating a test apparatus including a plurality of test modules for supplying test signal to devices under test respectively, including: a plurality of test module emulation sections for emulating the plurality of test modules generating the test signal based on different cycles, a control emulation section for emulating a control apparatus for controlling the test of the devices under test, a synchronous emulation section for generating test signal generating timings, at which each of the plurality of test module emulation sections is to generate the test signal in simulation corresponding to cycle time of the test module emulation section, based on instructions from the control emulation section, a timing alignment section for aligning the plurality of test signal generating timings generated by the synchronous emulation section in order of time, and outputting them one by one, and a schedule section for causing the test module emulation section corresponding to one of the test signal generating timings output by the timing alignment section to generate the test signal in simulation in the cycle time corresponding to the test signal generating timing.

4 Claims, 7 Drawing Sheets

U.S. PATENT DOCUMENTS

| | | | | |
|---|---|---|---|---|
| 5,991,907 | A * | 11/1999 | Stroud et al. | 714/725 |
| 6,009,256 | A * | 12/1999 | Tseng et al. | 703/13 |
| 6,026,230 | A * | 2/2000 | Lin et al. | 703/13 |
| 6,077,304 | A * | 6/2000 | Kasuya | 703/14 |
| 6,108,806 | A * | 8/2000 | Abramovici et al. | 714/725 |
| 6,112,312 | A * | 8/2000 | Parker et al. | 714/32 |
| 6,202,182 | B1 * | 3/2001 | Abramovici et al. | 714/725 |
| 6,487,700 | B1 | 11/2002 | Fukushima | |
| 6,631,487 | B1 * | 10/2003 | Abramovici et al. | 714/725 |
| 6,785,873 | B1 | 8/2004 | Tseng | |
| 6,842,865 | B2 * | 1/2005 | Nee et al. | 714/28 |
| 6,978,234 | B1 * | 12/2005 | Battaline et al. | 703/28 |
| 2001/0016922 | A1 | 8/2001 | Takasugi et al. | |
| 2002/0038203 | A1 * | 3/2002 | Tsuchiya | 703/15 |
| 2002/0193980 | A1 | 12/2002 | Higashi et al. | |

FOREIGN PATENT DOCUMENTS

| | | |
|---|---|---|
| JP | 10-320229 | 12/1998 |
| JP | 2000-267881 | 9/2000 |
| JP | 2001-51025 | 2/2001 |
| JP | 2001-134457 | 5/2001 |
| JP | 2002-141414 | 5/2002 |
| JP | 2002-333469 | 11/2002 |
| WO | WO-2004/090562 A1 | 10/2004 |

OTHER PUBLICATIONS

Donna Mitchell, "Manual and Automatic VHDL/Verilog Test Bench Coding Techniques", 2001, http://www.omimo.be/magazine/01q2/2001q2_p027.pdf.*

Patent Abstracts of Japan, Publication No. 2001-051025 dated Feb. 23, 2001, with full translation, 11 pages.

Patent Abstracts of Japan, Publication No. 2001-134457 dated May 18, 2001, with full translation, 12 pages.

Supplementary European Search Report issued in European application No. EP 04 72 4396 mailed on Mar. 31, 2006, 3 pages.

Xia J.Q. et al: "Dynamic Test Emulation for EDA-Based Mixed-Signal Test Development Automation" Proceedings of The International Test Conference (ITC). Washington, Oct. 21-25, 1995, New York, IEEE, US, Oct. 21, 1995, pp. 761-770, XP000552879 ISBN: 0-7803-2992-9.

Patent Abstracts of Japan, Publication No. 06-160482, Dated Jul. 6, 1994, 2 pages.

International Search Report, Int'l Appl. No. PCT/JP2004/004527, dated Jul. 1, 2004, 1 page.

Japanese Office Action for Japanese Application No. 2005-505208 mailed on Aug. 23, 2005 and English translation thereof, 4 pages.

U.S. Office Action issued in U.S. Appl. No. 10/814,603 mailed on Jun. 25, 2007, 21 pages.

Explanation of Circumstances Relating To Accelerated Examination submitted in Japanese Application No. 2004-380598 dated Mar. 1, 2007 and English translation thereof, 8 pages.

European Search Report issued in European Application No. EP 06 07 7162 dated Feb. 23, 2007, 6 pages.

Xia J.Q. et al: "Dynamic Test Emulation for EDA-Based Mixed-Signal Test Development Automation" Proceedings of The International Test Conference (ITC). Washington, Oct. 21-25, 1995, New York, IEEE, US, Oct. 21, 1995, pp. 761-770, XP000552879 ISBN: 0-7803-2992-9.

Castelnuovo A. et al: "Emulation-based Design Errors Identification" Defect and Fault Tolerance in VLSI Systems, 2002, DFR 2002. Proceedings. 17th IEEE International Symposium on Nov. 6-8, 2002, Piscataway, NJ, USA, IEEE, Nov. 6, 2002, pp. 365-371, XP010625026 ISBN: 0-7695-1831-1.

Japanese Office Action "Notification of Reasons for Rejection" issued in Japanese Application No. 2004-380598 mailed on Apr. 3, 2007 and English translation thereof, 7 pages.

Dearborn, W.R., Perkins, E.G., Wong, J.J., Rolince, D., The Virtual Test program (VTest), Autotestcon '98. IEEE Systems Readiness Technology Conference, 1998 IEEE, USA, Aug. 27, 1998, pp. 149-159.

Japanese Office Action "Notification of Reasons for Refusal" issued in Japanese Application No. 2004-380598 mailed on Aug. 21, 2007 and English translation thereof, 8 pages.

Japanese Office Action "Final Rejection" issued in Japanese Application No. 2004-380598 mailed on Dec. 11, 2007 and English translation thereof, 4 pages.

* cited by examiner ns of the present invention.
TEST EMULATOR, TEST MODULE EMULATOR, AND RECORD MEDIUM STORING PROGRAM THEREIN

BACKGROUND OF THE INVENTION

1. Field of the Invention

The present invention relates to a test emulator, a test module emulator, and a record medium storing program therein. More particularly, the present invention relates to a test emulator, a test module emulator, and a record medium storing program therein for emulating test apparatuses including a plurality of exchangeable test modules for supplying a test signal to DUTs respectively, and verifying a test environment without using real things such as a DUT or a test module.

2. Description of Related Art

Conventionally, technologies are disclosed in Japanese patent application publications No. 10-320229, No. 2000-267881, No. 2001-51025, No. 2001-134457, and No. 2002-333469, as means for verifying test environment without using real things such as a DUT or a test apparatus.

The Japanese patent application publications No. 10-320229 discloses: each emulator unit for emulating function of each hardware unit of a semiconductor test apparatus; a device emulator for emulating function of DUT; means for collecting data required for execution of a test program from each of the emulator units based on a test program; and an emulator including a device test emulator for generating a test signal in a device emulator based on the collected data, comparing result signals from the device emulator, and storing the result therein.

The Japanese patent application publication No.2000-267881 discloses a semiconductor simulating apparatus for accurately simulating voltage and current which change depending on internal resistance of the DUT.

The Japanese patent application publications No.2001-51025 discloses a program debugging apparatus for a semiconductor test including: tester emulation means for emulating operation of the semiconductor test apparatus; hardware description language simulating means for simulating the DUT based on the hardware description language; and debugging means for debugging the program for the semiconductor test based on the simulating result of the DUT.

The Japanese patent application publications No. 2001-134457 discloses a program debugging apparatus for a semiconductor test for composing data points corresponding to each pin at high speed when emulating operation of the semiconductor test apparatus.

The Japanese patent application publications No. 2002-333469 discloses a program debugging apparatus for a semiconductor test for verifying program for the semiconductor test being composed for a semiconductor device including an analog output terminal.

SUMMARY OF THE INVENTION

It is premised that the emulators of the test apparatuses described above are used for the test apparatus having a proprietary architecture basically developed by a test apparatus vender. On the other hand, in test apparatuses in the future, a method for constructing the test apparatus by combining modules developed by various venders, which is realized by an open architecture, is expected. Therefore, It is desirable to offer an emulator for appropriately emulating the test apparatus constructed by the various modules.

Therefore, it is an object of the present invention to provide a test emulator, a test module emulator, and a record medium storing program therein which can solve the foregoing problem. The above and other objects can be achieved by combinations described in the independent claims. The dependent claims define further advantageous and exemplary combinations of the present invention.

Therefore, according to the first aspect of the present invention, there is provided a test emulator for emulating a test apparatus including a plurality of test modules for supplying a test signal to devices under test respectively. The test emulator includes: a plurality of test module emulation sections for emulating the plurality of test modules generating the test signal based on different cycles; a control emulation section for emulating a control apparatus for controlling the test of the devices under test; a synchronous emulation section for generating test signal generating timings, at which each of the plurality of test module emulation sections is to generate the test signal in simulation corresponding to cycle time of the test module emulation section, based on instructions from the control emulation section; a timing alignment section for aligning the plurality of test signal generating timings generated by the synchronous emulation section in order of time, and outputting them one by one; and a schedule section for causing the test module emulation section corresponding to one of the test signal generating timings output by the timing alignment section to generate the test signal in simulation in the cycle time corresponding to the test signal generating timing.

The synchronous emulation section may further generate interruption collection timings for collecting interruption to the control apparatus generated in simulation by each of the plurality of test module emulation sections during the generation of the test signal in the cycle time corresponding to the test signal generating timings, the timing alignment section may align the plurality of test signal generating timings and the plurality of interruption collection timings in order of time, and outputs them one by one, and the schedule section may cause the test module emulation section corresponding to the interruption collection timing to notify the control emulation section of the interruption generated in simulation in the cycle time at which the test module emulation section generates the test signal just before the interruption collection timing, in case that the timing alignment section outputs one of the interruption collection timings.

Each of the plurality of test module emulation sections may generate change timing of the test signal in the cycle time at the generation of the test signal in the cycle time corresponding to the test signal generating timing, and the test emulator may further include a DUT connection section for acquiring the plurality of change timings generated by the plurality of test module emulation sections, and for changing the test signal in simulation one by one in order of time based on the plurality of change timings.

The DUT connection section supplies the plurality of change timings acquired from the plurality of test module emulation sections to the timing alignment section, the timing alignment section may align the plurality of change timings, the plurality of test signal generating timings, and the plurality of interruption collection timings in order of time, and outputs them one by one, and the schedule section may cause the DUT connection section to change the test signal in simulation at the change timing, in case that the timing alignment section outputs one of the change timings.

Each of the plurality of the test module emulation sections may notify the synchronous emulation section of the cycle end timing at which the cycle time ends during the generation of the test signal in the cycle time corresponding to the test signal generating timing, and the synchronous emulation section may generate the test signal generating timings at which the test module emulation section generates the test signal in simulation corresponding to next cycle time based on the cycle end timing notified from each of the plurality of test module emulation sections.

The schedule section may cause the interruption generated in simulation by the test module emulation section corresponding to the test signal generating timing to be notified to the control emulation section during the generation of the test signal in the cycle time just before the test signal generating timing, in case that the timing alignment section outputs the test signal generating timing corresponding to the next cycle time.

Each of the plurality of test module emulation sections may be controlled by operating a test module emulation program, which is provided to drive the test module emulation section, by using a computer, and the test module emulation program may include: a plurality of hardware emulation functions, being provided corresponding to a plurality of commands received by the test module from the control apparatus respectively, for emulating operation of the test module corresponding to the command; and a control function used in order for the schedule section to cause the test emulator to generate the test signal in the cycle time corresponding to the test signal generating timing.

According to the second aspect of the present invention, there is provided a record medium storing therein program for causing a computer to function as a test emulator for emulating test apparatuses including a plurality of test modules for supplying test signal to devices under test respectively. The program causes the computer to function as: a plurality of test module emulation sections for emulating the plurality of test modules generating the test signal based on different cycles; a control emulation section for emulating a control apparatus for controlling the test of the devices under test; a synchronous emulation section for generating test signal generating timings, at which each of the plurality of test module emulation sections is to generate the test signal in simulation corresponding to cycle time of the test module emulation section, based on instructions from the control emulation section; a timing alignment section for aligning the plurality of test signal generating timings generated by the synchronous emulation section in order of time, and outputting them one by one; and a schedule section for causing the test module emulation section corresponding to one of the test signal generating timings output by the timing alignment section to generate the test signal in simulation in the cycle time corresponding to the test signal generating timing.

According to the third aspect of the present invention, there is provided a test module emulator for emulating a test module among a plurality of test modules by a test emulator for emulating test apparatuses including the plurality of test modules for supplying test signal to devices under test respectively based on a different cycle. The test emulator includes: a control emulation section for emulating a control apparatus for controlling the test of the devices under test; a synchronous emulation section for generating test signal generating timings, at which each of the plurality of test module emulation sections is to generate the test signal in simulation corresponding to cycle time of the test module emulation section, based on instructions from the control emulation section; a timing alignment section for aligning the plurality of test signal generating timings generated by the synchronous emulation section in order of time, and outputting them one by one; and a schedule section for causing the test module emulation section corresponding to one of the test signal generating timings output by the timing alignment section to generate the test signal in simulation in the cycle time corresponding to the test signal generating timing, and the test module emulator includes a pattern generator emulation section for generating the test signal in simulation in the cycle time corresponding to one of the test signal generating timings based on instructions from the schedule section.

The test module emulator may further includes a test module interface emulation section for notifying a synchronous emulation section of cycle end timing at which the cycle corresponding to one of the test signal generating timings ends, and causing the synchronous emulation section to further generate the test signal generating timing at which the test module emulator is to generate the test signal in simulation for the next time based on the cycle end timing.

According to the fourth aspect of the present invention, there is provided a record medium storing therein program for causing a computer to function as a test module emulator for emulating a test module among a plurality of test modules as for a test emulator for emulating test apparatuses including the plurality of test modules for supplying test signal to devices under test respectively based on a different cycle. The test emulator includes: a control emulation section for emulating a control apparatus for controlling the test of the devices under test; a synchronous emulation section for generating test signal generating timings, at which each of the plurality of test module emulation sections is to generate the test signal in simulation corresponding to cycle time of the test module emulation section, based on instructions from the control emulation section; a timing alignment section for aligning the plurality of test signal generating timings generated by the synchronous emulation section in order of time, and outputting them one by one; and a schedule section for causing the test module emulation section corresponding to one of the test signal generating timings output by the timing alignment section to generate the test signal in simulation in the cycle time corresponding to the test signal generating timing, and the program causes the computer to function as a pattern generator emulation section for generating the test signal in simulation in the cycle time corresponding to one of the test signal generating timings based on instructions from the schedule section.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
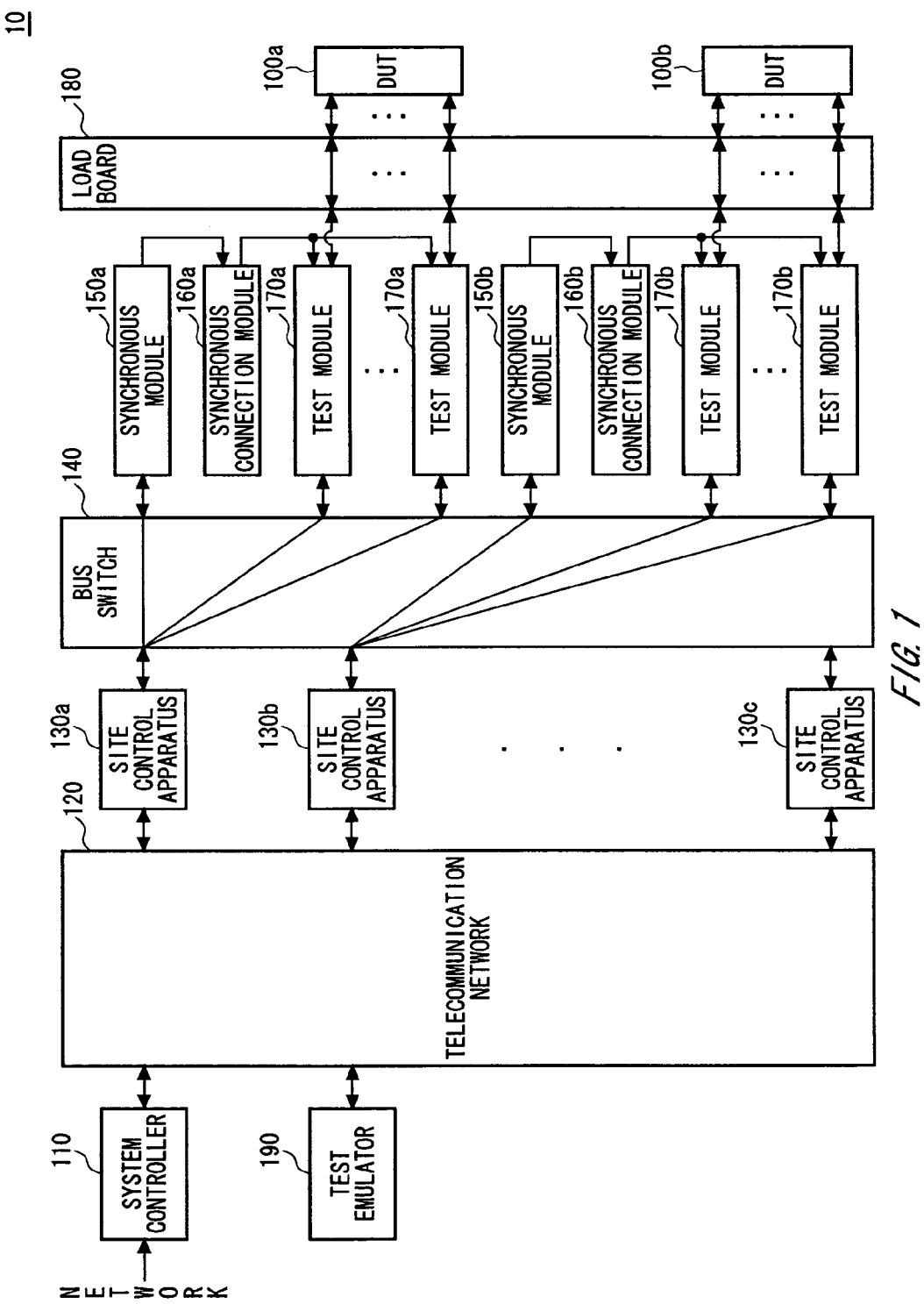
FIG. 1 is a block diagram showing a configuration of a test apparatus 10 according to an embodiment of the present invention.

FIG. 1 is a block diagram showing a configuration of a test apparatus 10 according to an embodiment of the present invention. The test apparatus 10 generates a test signal, supplies it to a DUT 100 (Device Under Test), and judges acceptability of the DUT 100 based on whether a result signal, which is output from the DUT 100 as a result of the DUT 100 being operated based on the test signal, coincides with an expected value. The test apparatus 10 according to the present embodiment is realized by an open architecture, and various kinds of modules based on the open architecture are used as a test module 170 and the like for supplying the test signal to the DUT 100. Moreover, the test apparatus 10 includes a test emulator 190 for emulating a real test of the test apparatus 10, and the test emulator 190 provides an emulation environment for appropriately changing a configuration in response to the change of the test module 170 and the like used for the real test, and for appropriately emulating the real test of the test apparatus 10.

The test apparatus 10 includes a system controller 110, a telecommunication network 120, site control apparatuses 130a-130c, a bus switch 140, synchronous modules 150a-150b, synchronous connection modules 160a-160b, the test modules 170a-170b, a load board 180, and the test emulator 190. The test apparatus 10 connects with the DUTs 100a-100b.

The system controller 110 receives and stores test control program, test program, test data and the like, which is used for the test of the DUTs 100a-100b by the test apparatus 10, through an external network or the like. The telecommunication network 120 connects the system controller 110, the site control apparatuses 130a-130c, and the test emulator 190, and relays communication between them.

The site control apparatuses 130a-130c are examples of the control apparatus according to the present invention, and control the test of the DUTs 100. Here, each of the plurality of site control apparatuses 130 controls the test of one of the DUTs 100 respectively. For example, in FIG. 1, the site control apparatus 130a controls the test of the DUT 100a, and the site control apparatus 130b controls the test of the DUT 100b. Alternatively, the plurality of site control apparatuses 130 control the test of the plurality of DUTs 100 respectively.

More specifically, the site control apparatus 130 acquires the test control program from the system controller 110 through the telecommunication network 120 and executes it. Next, based on the test control program, the site control apparatus 130 acquires the test program and the test data used for the test of the DUT 100 from the system controller 110, and stores them in a module, such as the synchronous modules 150 or one or a plurality of the test module 170, which is used for the test of the DUT 100, through the bus switch 140. Next, the site control apparatus 130 instructs the start of the test to the synchronous module 150 through the bus switch 140 based on the test program and the test data. Then, the site control apparatus 130 receives an interruption, which indicates that the test is completed, from, for example, the synchronous module 150, and causes each of the modules to perform the next test based on the test result.

The bus switch 140 connects each of the plurality of site control apparatuses 130 to the synchronous modules 150 and one or a plurality of the test modules 170 which are controlled by the site control apparatus 130, and relays the communication between them. Here, a predetermined site control apparatus 130 sets up the bus switch 140 in order to connect each of the plurality of site control apparatuses 130 with the synchronous module 150 and one or a plurality of the test modules 170 used by the site control apparatus 130 for the test of the DUT 100, based on the instruction of a user of the test apparatus 10, the test control program, etc. For example, in FIG. 1, the site control apparatus 130a is set up so that it connects with the synchronous module 150a and the plurality of test modules 170a, thereby the DUT 100a is tested. Moreover, the site control apparatus 130b is set up so that it connects with the synchronous module 150b and the plurality of test modules 170b, thereby the DUT 100b is tested.

Here, since configuration and operation of the site control apparatus 130b for testing the DUT 100b using the synchronous module 150b, the synchronous connection modules 160b and one or a plurality of the test module 170b are substantially the same as configuration and operation of the site control apparatus 130a for testing the DUT 100a using the synchronous module 150a, the synchronous connection modules 160a and one or a plurality of the test module 170a, the configuration and the operation of the site control apparatus 130a for testing the DUT 100a will be mainly described hereinafter unless there is no difference.

The synchronous module 150a generates a test signal generating timing, at which the plurality of test modules 170 used for the test of the DUT 100a are to generate the test signal, based on the instruction of the site control apparatus 130a. Moreover, the synchronous module 150a receives the test result from one or a plurality of the test modules 170a through the synchronous connection module 160a, and causes one or a plurality of the test module 170a to perform sequence of the test program according to the acceptability of the test result.

The synchronous connection module 160a notifies the test module 170a of the test signal generating timing generated by the synchronous module 150a, where the test module 170a is to be operated corresponding to the test signal generating timing. Then, the synchronous connection module 160a causes each of one or a plurality of the test modules 170a to operate at a predetermined timing. Moreover, the synchronous connection module 160a receives the test result from one or a plurality of the test modules 170a, and transmits it to the synchronous module 150a.

The plurality of test modules 170a connect with a part of a plurality of terminals of the 100a respectively, and tests the DUT 100a based on the test program and the test data stored in the site control apparatus 130a. During the test of the DUT 100a, test module 170a generates the test signal from the test data based on the sequence defined by the test program, and supplies the test signal to the terminals of the DUT 100a connected to the test modules 170a. Next, test module 170a acquires the result signal, which is output as a result of the DUT 100a being operated based on the test signal, and the result signal is compared with an expected value. Then, the test module 170a transmits the comparison result of the result signal and the expected value to the synchronous connection module 160a as the test result. Here, the plurality of test modules 170a generate the test signal based on different cycles in order to change the cycle of the test signal dynamically based on the test program and the test data.

Moreover, the test module 170a generates an interruption to the site control apparatus 130a, when the processing of the test program is completed, or when an abnormality occurs during the execution of the test program. This interruption is notified to the site control apparatus 130a corresponding to the test module 170a through the bus switch 140, and interruption processing is performed by the processor of the site control apparatus 130a.

The plurality of DUTs 100 are mounted on the load board 180, by which the plurality of test modules 170 and the corresponding terminals of the DUTs 100 are connected.

The test emulator 190 emulates the test apparatus 10 based on the test control program, the test program, and the test data stored in the system controller 110. Then, the test emulator 190 simulates the test of the DUT 100 using the simulation model of the DUT 100. In the present embodiment, the test emulator 190 simulates the operation of the site control apparatus 130, the synchronous module 150 and the synchronous connection modules 160 and one or a plurality of the test modules 170 controlled by the site control apparatus 130, and the DUT 100 which is to be tested by the corresponding site control apparatus 130. By using the test emulator 190, the user of the test apparatus 10 starts the verification of the test control program, the test program, and/or the test data prior to the preparation of the DUT 100, the synchronous module 150, the synchronous connection module 160, the test module 170, etc. Moreover, by providing the plurality of test emulators 190, the test control program, the test program, and/or the test data are developed, without each of the plurality of users occupying the expensive real test environment.

As stated above, the test apparatus 10 is realized by an open architecture and various kinds of modules, which fulfill the specification of the open architecture, are utilized. Then, the test apparatus 10 is used by inserting the modules, such as the synchronous module 150, the synchronous connection module 160, and the test module 170, into arbitrary connection slots of the bus switch 140. At this time, the user of the test apparatus 10 etc. changes topology of the bus switch 140 through the site control apparatus 130a for example, causes the plurality of modules used for the test of the DUT 100 to connect with the site control apparatus 130 for controlling the test of the DUT 100. Thereby, the user of the test apparatus 10 selects a suitable module according to the number of the terminals, the arrangement of the terminals, the kind of the terminals, or the kind of the test for each of the plurality of the DUTs 100, and mounts the module on the test apparatus 10.

Alternatively, as a substitution for the above-mentioned example, the synchronous connection module 160a and the synchronous connection module 160b are realized by a synchronous connection section provided for all of the test modules 170 used for the test apparatus 10. In this case, the user of the test apparatus 10 etc. selects a suitable module according to the property of the plurality of DUTs 100 by changing the topology of the synchronous connection section and the test module 170 with the change of the topology of the bus switch 140.

Figure 2:
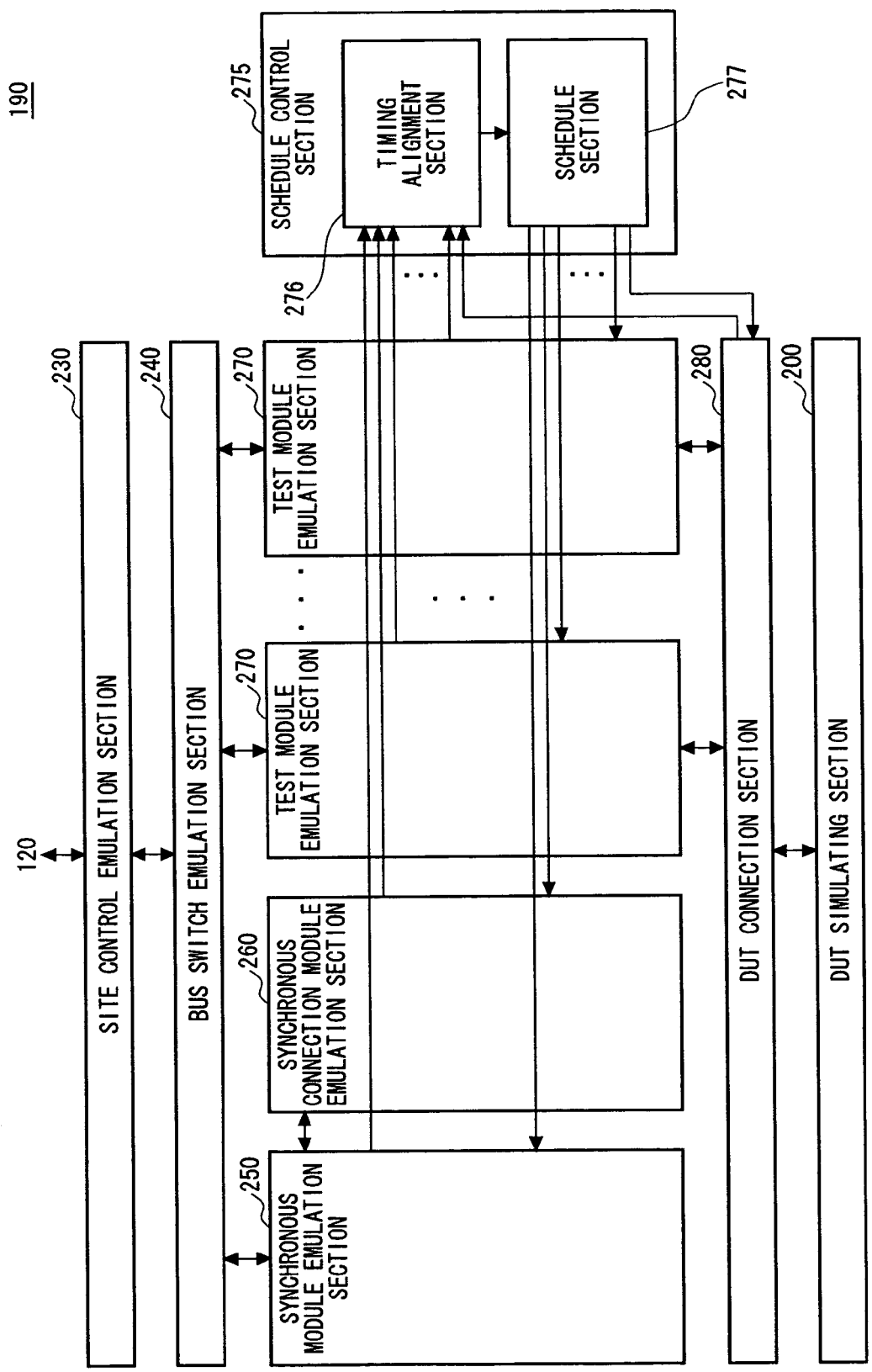
FIG. 2 is a block diagram showing a functional configuration of a test emulator 190 according to the embodiment of the present invention.

FIG. 2 is a block diagram showing a functional configuration of the test emulator 190 according to the embodiment of the present invention. The test emulator 190 includes a site control emulation section 230, a bus switch emulation section 240, a synchronous module emulation section 250, a synchronous connection module emulation section 260, one or a plurality of test module emulation sections 270, a DUT connection section 280, a DUT simulating section 200, and a schedule control section 275. Hereinafter, a case where the test emulator 190 emulates the test of the DUT 100a by the site control apparatus 130a will be explained.

The site control emulation section 230 emulates the site control apparatus 130a shown in FIG. 1. That is, the site control emulation section 230 acquires the test control program from the system controller 110 through the telecommunication network 120 and executes it. Next, the site control emulation section 230 acquires the test program and the test data, which are used for the test of the DUT 100a based on the test control program, from the system controller 110, and stores them in module emulation sections such as the synchronous module emulation section 250 or one or a plurality of the test module emulation sections 270 through the bus switch emulation section 240.

Here, the site control emulation section 230 issues simulation commands, such as read-out access and write-in access from/to a storage area in the module, to the bus switch emulation section 240, where real commands are to be issued by the site control apparatus 130a to the synchronous modules 150a and one or a plurality of the test modules 170a. The site control emulation section 230 stores the test program and the test data in the synchronous module emulation sections 250, one or a plurality of the test module emulation sections 270, etc. through the bus switch emulation section 240 by issuing the write-in access of the test program and the test data in simulation to the bus switch emulation section 240.

Moreover, the site control emulation section 230 receives the interruption simulated by the synchronous module emulation section 250 and the test module emulation section 270 through the bus switch emulation section 240, and simulates the interruption processing of the site control apparatus 130a.

The bus switch emulation section 240 emulates the bus switch 140 shown in FIG. 1, and relays the communication between the site control emulation section 230, and the synchronous module emulation sections 250 and one or a plurality of the test module emulation sections 270.

The synchronous module emulation section 250 emulates the synchronous module 150 shown in FIG. 1, and generates the test signal generating timing, at which each of the plurality of test module emulation sections 270 is to generate the test signal in simulation corresponding to the cycle time of the test module emulation section 270, based on the instructions from the site control emulation section 230. Next, the synchronous module emulation section 250 receives cycle end timing, which is the end timing of the cycle time, from the test module emulation section 270 which generates the test signal. Then, according to the cycle end timing, the synchronous module emulation section 250 generates: a test signal generating timing at which the test module emulation section 270 is to generate the next test signal; a test result collection timing for collecting the test results from the test module emulation section 270; a cycle termination timing for causing the test module emulation section 270 to terminate the processing of the cycle time; and an interruption collection timing for collecting the interruption to the site control emulation section 230 from the test module emulation section 270. Here, the interruption to the site control emulation section 230 from the test module emulation section 270 is the simulated interruption generated by each of the plurality of test module emulation sections 270 for the site control apparatus 130a during the generation of the test signal in the cycle time corresponding to the test signal generating timing.

The synchronous connection module emulation section 260 emulates the synchronous connection module 160 shown in FIG. 1, and notifies the schedule control section 275 of the test signal generating timing generated by the synchronous module emulation section 250 in simulation, the test result collection timing and the cycle termination timing and the interruption collection timing which are generated by the synchronous module emulation section 250 for the emulation. Moreover, the synchronous connection module emulation section 260 receives the test result from one or a plurality of the test module emulation sections 270, and transmits it to the synchronous module emulation section 250.

The test module emulation section 270 receives instruction of a cycle start from the synchronous module emulation section 250 which received instructions of a test signal generation, and generates the test signal in simulation in the cycle time corresponding to the test signal generating timing based on the test program and the test data stored in the site control emulation section 230. More specifically, the test module emulation section 270 generates a change timing of the test signal in simulation in the cycle time during the generation of the test signal in the cycle time corresponding to the test signal generating timing. Alternatively, the test module emulation section 270 generates change timings corresponding to a cycle time as a change timing of the test signal, where the number of the change timings is defined by specification of the test module 170 corresponding to the test module emulation section 270. Moreover, the test module emulation section 270 acquires the output signal output as a result of the DUT simulating section 200 being operated in simulation based on the test signal, and compares the result with the expected value defined based on the test program and the test data. Then, the test module emulation section 270 transmits the comparison result of the result signal and the expected value to the synchronous module emulation section 250 through the synchronous connection module emulation section 260 as the test result.

Moreover, in response to instruction of the interruption from the schedule section 277, the test module emulation section 270 notifies the site control emulation section 230 through the bus switch emulation section 240 of the interruption generated in simulation in the cycle time during which the last test signal before receiving the instruction of the interruption is generated.

The DUT connection section 280 acquires the plurality of change timings generated by the plurality of test module emulation sections 270, and changes the test signal in simulation in order of time based on the plurality of change timings.

The DUT simulating section 200 simulates operation of the DUT 100 described by hardware description languages, such as Verilog-HDL or VHDL, based on the test signal acquired from the DUT connection section 280. Then, the DUT simulating section 200 generates a result signal by the simulation, which is output as a result of the DUT 100 being operated based on the test signal, and supply it to the test module emulation section 270 through the DUT connection section 280.

The schedule control section 275 controls the schedule which operates each of the module emulation sections based on various kinds of timings generated by the plurality of module emulation sections in the simulated test of the DUT 100 by the synchronous module emulation section 250, the synchronous connection module emulation section 260, the plurality of test module emulation sections 270, and the DUT connection section 280. The schedule control section 275 includes a timing alignment section 276 and a schedule section 277.

The timing alignment section 276 aligns the plurality of test signal generating timings, the plurality of interruption collection timings, the plurality of cycle termination timings and the plurality of test result collection timings, which are generated by the synchronous module emulation section 250, and the plurality of change timings that are generated by one or a plurality of the test module emulation sections 270 and are supplied by the DUT connection section 280, in order of time. Then, the timing alignment section 276 outputs these aligned timings to the schedule section 277 one by one. The schedule section 277 notifies the module emulation section and the DUT connection section 280 corresponding to the timings of each of the timings output from the timing alignment section 276 one by one. Then, the schedule section 277 causes the module emulation section or the DUT connection section 280 to perform the operation corresponding to the timings. The operation of the schedule section 277 according to the kind of the timing output from the timing alignment section 276 will be explained hereinafter.

(1) In case that the timing alignment section 276 outputs test signal generating timing The schedule section 277 notifies the synchronous module emulation section 250 of the test signal generating timing, and instructs the generation of the test signal by the test module emulation section 270 corresponding to the test signal generating timing through the synchronous module emulation section 250. Thereby, the schedule section 277 causes the test module emulation section 270 corresponding to the test signal generating timing to generate the test signal in simulation in the cycle time corresponding to the test signal generating timing through the synchronous module emulation section 250.

(2) In case that the timing alignment section 276 outputs the interruption collection timing The schedule section 277 instructs the generation of the interruption to the test module emulation section 270 which is designated corresponding to the interruption collection timing. Thereby, the schedule section 277 causes the test module emulation section 270 to notify the site control emulation section 230 through the bus switch emulation section 240 of the interruption generated in simulation in the cycle time during which the test signal is generated just before the interruption collection timing.

(3) In case that the timing alignment section 276 outputs the cycle termination timing The schedule section 277 notifies the test module emulation section 270 corresponding to the cycle termination timing that the cycle end timing has come.

(4) In case that the timing alignment section 276 outputs the test result collection timing The schedule section 277 notifies the test module emulation section 270 corresponding to the test result collection timing that the test result collection timing has come. In response, the test module emulation section 270 notifies the synchronous module emulation section 250 through the synchronous connection module emulation section 260 of the comparison result of the result signal and the expected value in the cycle time.

(5) In case that the timing alignment section 276 outputs the change timing

The DUT connection section 280 supplies the plurality of change timing acquired from the plurality of test module emulation sections 270 to the timing alignment section 276. In response, the timing alignment section 276 aligns the plurality of change timings and other various timings altogether in order of time.

If the timing alignment section 276 outputs the change timing, the schedule section 277 notifies the DUT connection section 280 that the change timing has come, in order to change the test signal in simulation at the change timing. In response, the DUT connection section 280 changes the test signal in simulation at the change timing.

Here, the test module emulation section 270 notifies the schedule control section 275 of result signal acquisition timing, which is a timing of the acquisition of the result signal. Then, the timing alignment section 276 aligns the result signal acquisition timing and the other various timings in order of time. In this case, when the timing alignment section 276 outputs the result signal acquisition timing, the schedule section 277 causes the DUT connection section 280 to supply the result signal to the test module emulation section 270 which is to acquire the result signal at the result signal acquisition timing.

Moreover, the DUT connection section 280 acquires the plurality of change timings generated by the plurality of test module emulation sections 270, and supplies them to the DUT simulating section 200, without aligning them in order of time. In this case, the DUT simulating section 200 aligns the plurality of supplied change timings in order of time, and performs the simulation of the DUT 100 based on a plurality of aligned change timings.

According to the test emulator 190 described above, by providing the synchronous module emulation section 250, the synchronous connection module emulation section 260 and one or a plurality of the test module emulation sections 270 respectively corresponding to the synchronous module 150, the synchronous connection modules 160 and one or a plurality of the test modules 170 of the real system of the test apparatus 10, the module emulation sections can be easily replaced as other module emulation sections. Thereby, in case that one module is replaced as another modules in the real system of the test apparatus 10, in the test emulator 190, a module emulation section corresponding to the module is replaced by a module emulation section corresponding to the other module. Then substantially the same test environment as the real system of the test apparatus 10 is provided on the test emulator 190.

Figure 3:
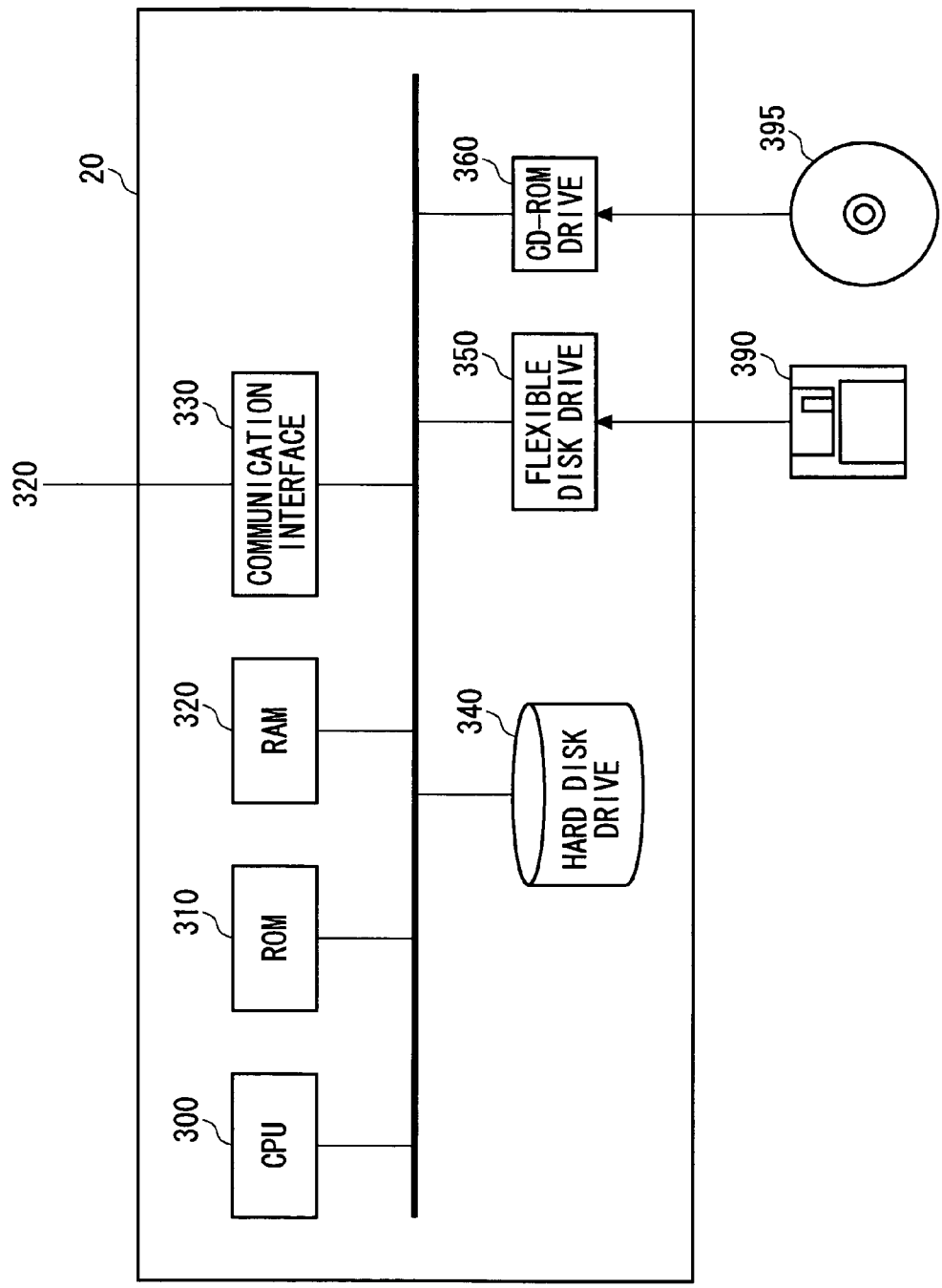
FIG. 3 is a block diagram exemplary showing a hardware configuration of a computer 20 according to the embodiment of the present invention.

FIG. 3 is a block diagram exemplary showing a hardware configuration of the test emulator 190 according to the present embodiment of the invention. The test emulator 190 according to the present embodiment is realized by a computer 20 which includes CPU 300, ROM 310, RAM 320, a communication interface 330, a hard disk drive 340, a flexible disk drive 350, and a CD-ROM drive 360.

The CPU 300 operates based on the program stored in the ROM 310 and the RAM 320, and controls each part. The ROM 310 stores boot program which the CPU 300 executes during startup of a computer 20, program depending on the hardware of the computer 20 and the like. The RAM 320 stores program which the CPU 300 executes, data which the CPU 300 uses. The communication interface 330 communicates with other equipments through a telecommunication network. The hard disk drive 340 stores the program and the data which the computer 20 uses, and supplies them to the CPU 300 through the RAM 320. The flexible disk drive 350 reads program or data in a flexible disk 390, and provides them to the RAM 320. The CD-ROM drive 360 reads program or data in a CD-ROM 395, and provides them to the RAM 320.

The program provided to the CPU 300 through the RAM 320 is stored in a record medium, such as the flexible disk 390, the CD-ROM 395, or an IC card, which is provided by a user. The program is read from the record medium, installed in the computer 20 through the RAM 320, and executed by the computer 20.

The program modules, which are installed and executed in/by the computer 20 and causes the computer 20 to function as the test emulator 190, includes a DUT simulating module, a site control emulation module, a bus switch emulation module, a synchronous module emulation module, a synchronous connection module emulation module, a test module emulation module, a schedule control module, a timing alignment module, a schedule module, and a DUT connection module. The programs or the modules causes the computer 20 to function as the DUT simulating section 200, the site control emulation section 230, the bus switch emulation section 240, the synchronous module emulation section 250, the synchronous connection module emulation section 260, the test module emulation section 270, the schedule control section 275, the timing alignment section 276, the schedule section 277, and the DUT connection section 280 respectively.

Alternatively, the programs or the modules described above are stored in an external record medium. It is possible to use an optical record medium such as DVD or PD, a magneto-optical record medium such as Minidisk, a tape medium, a magnetic record medium or a semiconductor memory such as an IC card as a record medium instead of the flexible disk 390 and the CD-ROM 395. Moreover, a storage device, such as a hard disk or RAM in a server system on a dedicated telecommunication network or the Internet, is used as a record medium and the program may be provided to the computer 20 via the telecommunication network.

Figure 4:
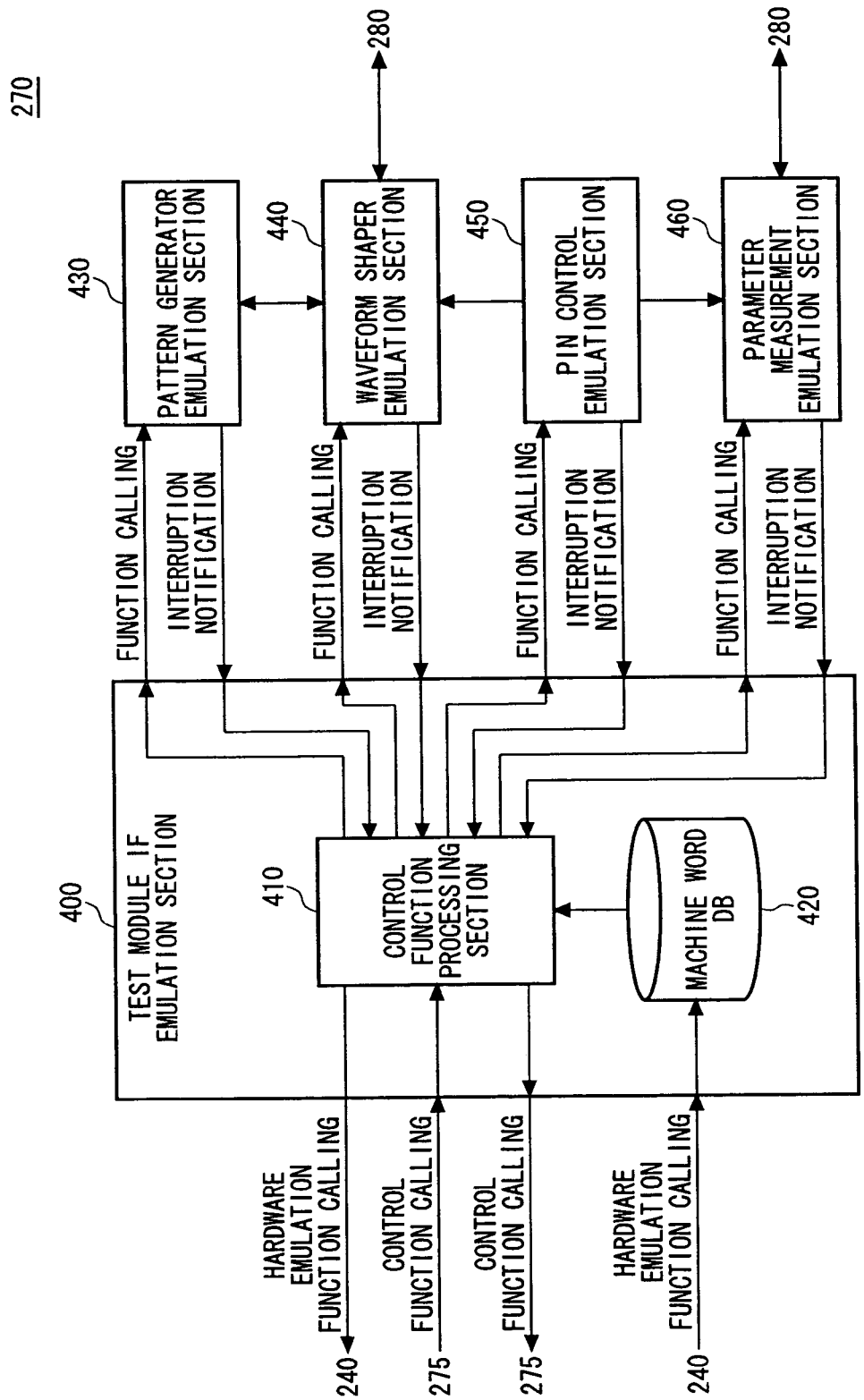
FIG. 4 is a block diagram showing a functional configuration of a test module emulation section 270 according to the embodiment of the present invention.

FIG. 4 is a block diagram showing a functional configuration of the test module emulation section 270 according to the embodiment of the present invention. In FIG. 4, the test module emulation section 270 is realized by operating the test module emulation program or test module emulation module corresponding to the test module emulation section 270 by the computer 20.

The test module emulation section 270 includes a plurality of hardware emulation functions provided corresponding to each of the plurality of commands received by the test module 170 through the bus switch 140 from the site control apparatus 130, and a control function called in order to notify the test module emulation section 270 of various kinds of timings. The test module emulation section 270 operates in response to the call to these functions from the bus switch emulation section 240 and the schedule control section 275. Here, the control function is used in order for the schedule control section 275 to order the generation of the test signal in simulation in the cycle time corresponding to the test signal generating timing, and to order to notify the site control emulation section 230 of the interruption generated in simulation in the cycle time when the test module emulation section 270 generates the test signal just before the interruption collection timing.

The test module emulation section 270 includes a test module IF emulation section 400 (test module interface emulation section), a pattern generator emulation section 430, a waveform shaper emulation section 440, a pin control emulation section 450, and a parameter measurement emulation section 460.

The test module IF emulation section 400 is started-up when the hardware emulation function is called from the bus switch emulation section 240, and when the control function is called from the schedule control section 275. The test module IF emulation section 400 controls the operation of the test module emulation section 270 corresponding to these function calling. The test module IF emulation section 400 includes a machine word DB 420 and a control function processing section 410.

The machine word DB 420 emulates a storage area stored in the storage area provided in the test module 170. When the machine word DB 420 receives a command from the site control emulation section 230 in simulation through the bus switch emulation section 240 by the calling of the hardware emulation function, it accesses the storage area in the machine word DB 420 corresponding to the command.

More specifically, the test module IF emulation section 400 according to the present embodiment stores a plurality of hardware emulation functions for emulating the operation of the test module emulation section 270 corresponding to a plurality of commands, such as read-out access and write-in access, respectively. When the read-out access is received from the site control emulation section 230 through the bus switch emulation section 240, the test module IF emulation section 400 replies the data in the machine word DB 420 corresponding to the storage area for the read-out access, to the site control emulation section 230 through the bus switch emulation section 240. Moreover, when the machine word DB 420 receives the write-in access, it stores the data to be written in the storage area of the machine word DB 420 corresponding to the storage area for the write-in access. For example, when the machine word DB 420 receives the write-in access of the test program or the test data from the site control emulation section 230 through the bus switch emulation section 240, it stores the test programs or the test data in the storage area of the machine word DB 420 corresponding to the write-in access.

When the control function processing section 410 receives the control function call from the schedule control section 275, the control function processing section 410 causes the pattern generator emulation section 430, the waveform shaper emulation section 440, the pin control emulation section 450, and the parameter measurement emulation section 460 to emulate the operation of the test module 170 according to the control function in response to the instruction of the control function. More specifically, when the schedule control section 275 instructs the generation of the test signal using the control function in the cycle time corresponding to the test signal generating timing, the control function processing section 410 reads a part of the program and a part of the data among the test program and the test data stored in the machine word DB 420, where the part of the program and the data are to be processed by the test module emulation section 270 during the cycle time. Then, the control function processing section 410 causes the pattern generator emulation section 430, the waveform shaper emulation section 440, the pin control emulation section 450, and the parameter measurement emulation section 460 to perform the processing corresponding to the part of the program and the part of the data.

The pattern generator emulation section 430 emulates the pattern generator of the test module 170. That is, the pattern generator emulation section 430 receives the test program and the test data stored in the machine word DB 420 from the control function processing section 410 by the function call, for example. Then the instruction, which indicates that the test signal is to be generated for a certain cycle time, is received from the schedule control section 275 by the function call through the control function processing section 410, and the test signal, which is to be generated in the cycle time, is generated in simulation.

Moreover, the pattern generator emulation section 430 acquires the result signal through the DUT connection section 280 and the waveform shaper emulation section 440, which is output in simulation as a result of the DUT simulating section 200 being operated based on the test signal, and the result signal is compared with the expected value.

The waveform shaper emulation section 440 emulates the waveform shaper of the test module 170. That is, the waveform shaper emulation section 440 shapes the waveform of the test signal in simulation in response to the test signal from the pattern generator emulation section 430. Then the waveform is output to the DUT connection section 280.

The pin control emulation section 450 emulates the pin control section of the test module 170. That is, the pin control emulation section 450 sets parameters, such as operating voltage, for each terminal from which the test signal is output in simulation by the waveform shaper emulation section 440 and/or the parameter measurement emulation section 460 based on the test program.

The parameter measurement emulation section 460 emulates the parameter measurement section of the test module 170. That is, for example, the parameter measurement emulation section 460 receives an instruction of a direct current test (DC parametric test) from the schedule control section 275 through the control function processing section 410 by the function call, and generates the test signal in simulation, which is to be generated in the cycle time of the direct current test. Moreover, the parameter measurement emulation section 460 acquires the result signal, which is output in simulation as a result of the DUT simulating section 200 being operated based on the test signal in the direct current test.

Moreover, in case that the test module emulation section 270 generates the test signal in the cycle time corresponding to the test signal generating timing, the control function processing section 410 notifies the synchronous module emulation section 250 of the cycle end timing at which the cycle, which corresponds to the test signal generating timing, ends.

As stated above, the control function processing section 410 notifies the synchronous module emulation section 250 through the schedule control section 275 of the cycle end timing at which the cycle ends in the generation of the test signal in the cycle time corresponding to the test signal generating timing. Thereby, the control function processing section 410 causes the synchronous module emulation section 250 to further generate the test signal generating timing at which the test module emulation section 270 is to generate the test signal in simulation for the next time based on the cycle end timing.

Moreover, when the control function processing section 410 receives the instruction of the interruption generation from the schedule control section 275, the control function processing section 410 transmits the instruction of the interruption generation to the pattern generator emulation section 430, the waveform shaper emulation section 440, and the pin control emulation section 450 by the function call, for example. The pattern generator emulation section 430, the waveform shaper emulation section 440, and the pin control emulation section 450, which receive the instruction of the interruption generation, notify the control function processing section 410 of the interruption generated in simulation in the cycle time just before the interruption collection timing among the cycle times during which the test module emulation section 270 generates the test signal. When the interruption is notified, the control function processing section 410 notifies the site control emulation section 230 of the interruption through the bus switch emulation section 240 by calling the hardware emulation function for the notification of the interruption included in the bus switch emulation section 240, for example.

Figure 5:
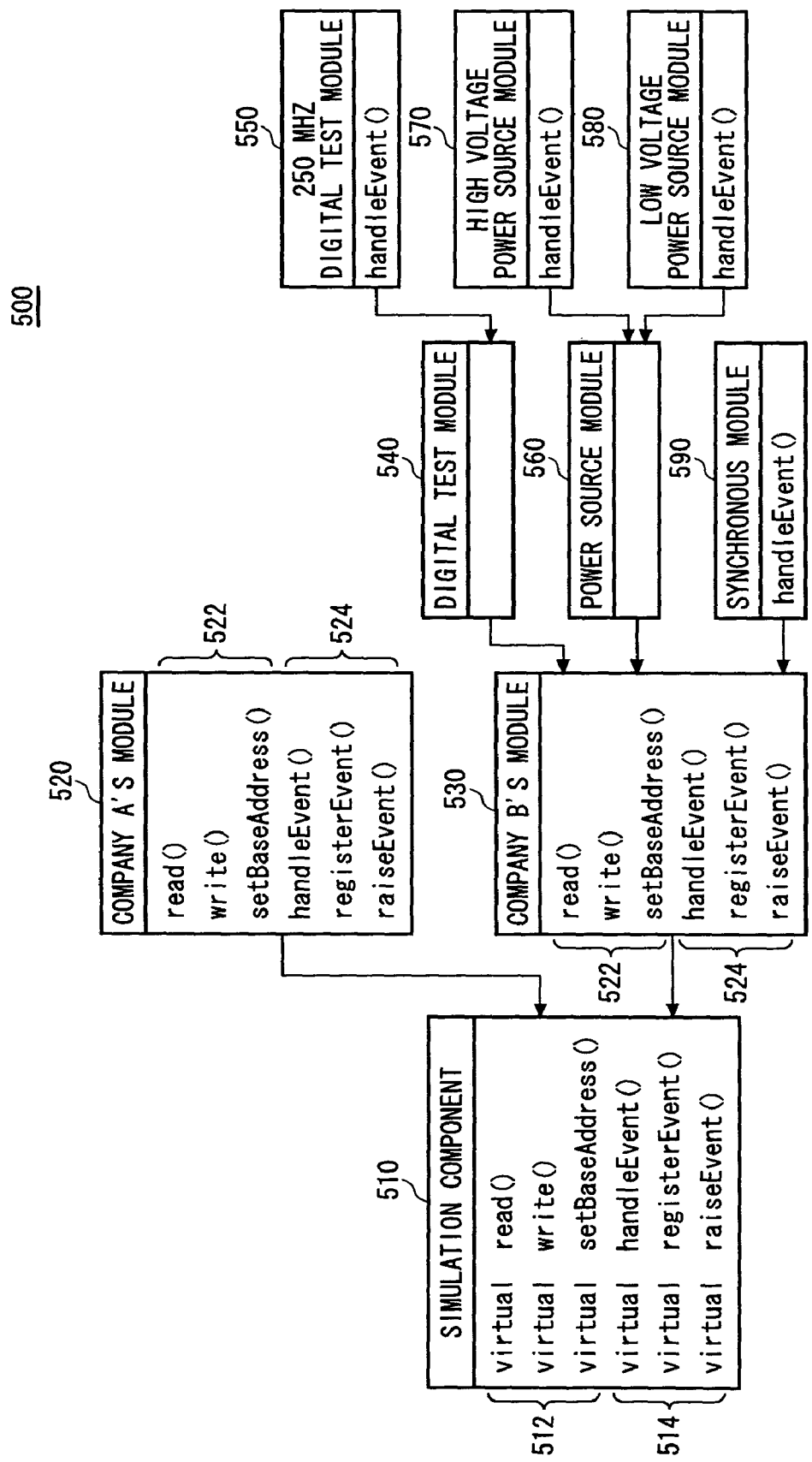
FIG. 5 shows an example of a class hierarchical structure 500 according to the embodiment of the present invention.

FIG. 5 shows an example of a class hierarchical structure 500 according to the embodiment of the present invention. In the present embodiment, module emulation program, which realizes the module emulation sections such as the synchronous module emulation section 250, the synchronous connection module emulation section 260, and the test module emulation section 270, is created using class functions, which are frameworks of the module emulation program defined in order to realize the open architecture of the test apparatus 10 in simulation.

The simulation component class 510 is a class which defines rules for calling a plurality of parameters, return values and etc. of method functions, which are to be included in the module emulation program, with a virtual method function. The simulation component class 510 includes a plurality of virtual hardware emulation functions 512 and a plurality of virtual control functions 514.

Here, read( ) is a method function for emulating the operation of the module corresponding to the read-out access which is called when the site control emulation section 230 issues the read-out access command in simulation. write( ) is a method function for emulating operation of the module corresponding to the write-in access which is called when the site control emulation section 230 issues the write-in access command in simulation. setBaseAddress( ) is a method function which is called when the site control emulation section 230 issues in simulation the base address setting command, which is issued by the site control apparatus 130 when the base address of the storage area of the test module 170 is set up. registerEvent( ) is a method function which is called when the synchronous connection module emulation section 260, the test module emulation section 270, and the DUT connection section 280, which receive the notices from the synchronous module emulation section 250, notify the timing alignment section 276 of the interruption collection timing, the change timing, the result signal acquisition timing, etc. and register the timings to the timing alignment section 276. handleEvent( ) is a method function which is called by the schedule control section 275, in order to cause the synchronous module emulation section 250, the synchronous connection module emulation section 260, the test module emulation section 270, and the DUT connection section 280 to perform the processing in response to the timings when the test signal generating timing, the interruption collection timing, the change timing, the result signal acquisition timing, etc. have come. raiseEvent( ) is a method function which is called when the synchronous module emulation section 250, the synchronous connection module emulation section 260, the test module emulation section 270, and the DUT connection section 280 notify the schedule control section 275 of an event which is to be processed asynchronously without regard to the timings.

A Company A's module class 520 and a Company B's module class 530 are classes derived from the simulation component class 510, i.e., module emulation programs, which are supplied by manufacturers of the modules for example, for emulating common function included in the modules of the manufacturers in common. The Company A's module class 520 and the Company B's module class 530 include a plurality of real hardware emulation functions 522 and a plurality of real control functions 524 respectively. Each of the plurality of real hardware emulation functions 522 and the plurality of real control functions 524 are module emulation programs which are described corresponding to the plurality of virtual hardware emulation functions 512 and the plurality of virtual control functions 514 respectively, and describe the contents of the processing of the real method functions (non-virtual method functions) corresponding to the virtual method functions.

The Company A's module class 520 and the Company B's module class 530 include classes which are further derived. For example, in FIG. 5, the Company B's module class 530 is further derived in a digital test module class 540, a power source module class 560, and a synchronous module class 590.

The digital test module class 540 is a class of test module emulation program for emulating the test module 170 for performing the functional test of the DUT 100. The digital test module class 540 is further derived in a 250 MHz digital test module class 550 for emulating the test module 170 which performs the functional test of the DUT 100 at a frequency of 250 MHz. The power source module class 560 is a class of module emulation program for emulating the module for supplying electric power to the DUT 100. The power source module class 560 is further derived in a high voltage power source module class 570 for emulating the module which supplies high voltage power to the DUT 100, and the low voltage power source module class 580 for emulating the module which supplies low voltage power to the DUT 100. The synchronous module class 590 is a class of module emulation program for emulating the synchronous module 150.

Each of the 250 MHz digital test module class 550, the high voltage power source module class 570, the low voltage power source module class 580, and the synchronous module class 590 includes real method function handleEvent( ) for emulating the original function of each of the modules, which is used by replacing (overriding) the handleEvent( ) in the Company B's module class 530.

Each of the synchronous module emulation section 250, the synchronous connection module emulation section 260, one or a plurality of the test module emulation sections 270 etc. included in the test emulator 190 is realized as one instance of the classes of the module emulation programs included in the class hierarchical structure 500.

As described above, each of the synchronous module emulation section 250, the synchronous connection module emulation section 260, the module emulation section of test module emulation section 270 etc., which is included in the test emulator 190, is realized by the module emulation program corresponding to one of the classes included in the class hierarchical structure 500 for example. A user of the test emulator 190 builds substantially the same test environment as the real system of the test apparatus 10 in the test emulator 190 by generating the instance of the module emulation program from the combination of the classes corresponding to the combination of the modules which are to be mounted in the real system of the test apparatus 10. Moreover, in case of creating a new class corresponding to a new module, manhour for creating module emulation program is reduced by creating a new class as an inherited class of one of the existing classes.

Figure 6:
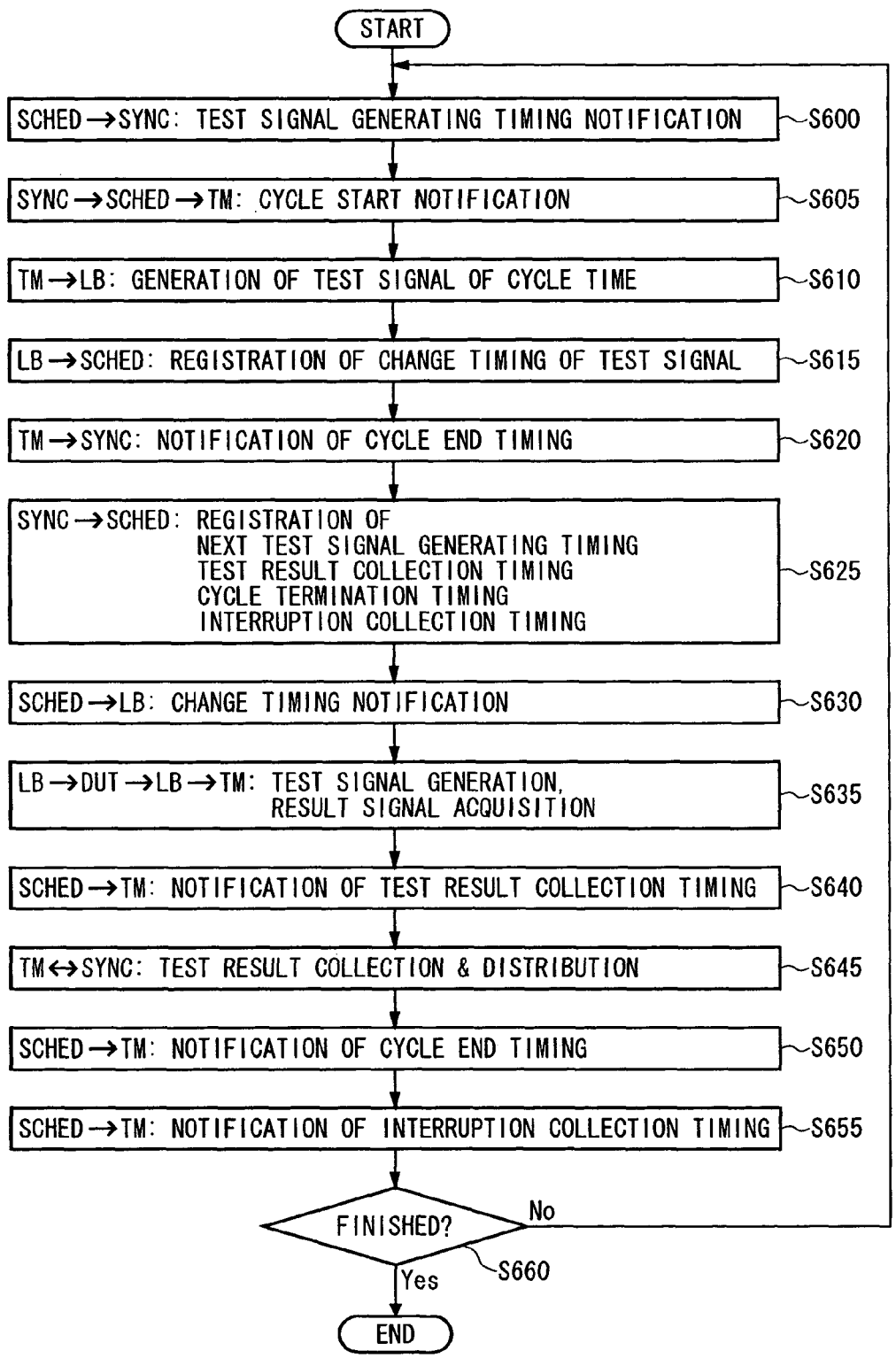
FIG. 6 is a flow chart showing a test signal generating processing flow of the test emulator 190 according to the embodiment of the present invention.

FIG. 6 shows a test signal generating processing flow of the test emulator 190 according to the embodiment of the present invention, which is proceeded by the test module emulation section 270.

When the site control emulation section 230 instructs the start of the test to the synchronous module emulation section 250 where the test program and the test data are stored in the synchronous module emulation section 250, the synchronous connection module emulation section 260 and one or a plurality of the test module emulation sections 270, the test emulator 190 proceeds the test in simulation according to a procedure described below.

First, in case that the timing alignment section 276 outputs the test signal generating timing, the schedule section 277 of the schedule control section 275 (shown as SCHED in the figure) calls the handleEvent( ) function of the synchronous module emulation section 250 (shown as SYNC in the figure), and notifies that the test signal generating timing has come (S600). Thereby, the schedule control section 275 causes the test module emulation section 270 corresponding to the test signal generating timing to generate the test signal in simulation in the cycle time corresponding to the test signal generating timing through the synchronous module emulation section 250. Here, the schedule control section 275 notifies the synchronous module emulation section 250 of the test signal generating timing by including the event identifier, which identifies that the test signal generating timing of the corresponding test module emulation section 270 has come, in a parameter of the handleEvent( ) function.

Next, the synchronous module emulation section 250 notifies the test module emulation section 270 (shown as TM in the figure), which is to generates the test signal in simulation in the test signal generating timing, of the cycle start which is the instructions for starting the processing of the cycle time and generating the test signal (S605). Here, the synchronous module emulation section 250 notifies the test module emulation section 270 of the cycle start through the schedule control section 275 asynchronous to the timings which are aligned by the timing alignment section 276 in order of time by including the event identifier, which instructs the cycle start, in the parameter of a raiseEvent( ) function, and calling the schedule control section 275.

Next, the test module emulation section 270 generates the test signal in simulation in the corresponding cycle time in response to the notice of the cycle start (S610). That is, in S600, when the schedule control section 275 notifies the synchronous module emulation section 250 of the test signal generating timing so as to generate the test signal in simulation in the cycle time corresponding to test signal generating timing, and when the synchronous module emulation section 250, which receives the notice, notifies the test module emulation section 270 of the cycle start through the schedule control section 275, the test module emulation section 270 generates the test signal in simulation in the cycle time. Here, the test module emulation section 270 generates the change timing of the test signal in simulation in the cycle time during the generation of the test signal in the cycle time.

Next, the DUT connection section 280 (shown as LB in the figure) notifies the timing alignment section 276 of the change timing in response to the change timing of the test signal from the test module emulation section 270, and registers it (S615).

Next, the test module emulation section 270 notifies the synchronous module emulation section 250 of the timing for end of the cycle (S620). Here, the test module emulation section 270 generates the test signal by the pattern generator emulation section 430 based on the designation by the test program and the test data, changing each cycle time dynamically. For this reason, the control function processing section 410 in the test module IF emulation section 400 of the test module emulation section 270 acquires the termination timing of each of the cycles from the pattern generator emulation section 430, and notifies the synchronous module emulation section 250 of the end timing, and causes the synchronous module emulation section 250 to generate the next test signal generating timing accurately.

Next, based on the cycle end timing notified from the test module emulation section 270 in S620, the synchronous module emulation section 250 generates the test signal generating timing at which the test module emulation section 270 is to generate the test signal in simulation corresponding to the next cycle time, notifies the timing alignment section 276 of the timing and registers it (S625). Moreover, the synchronous module emulation section 250 further generates a test result collection timing for collecting the test results from the test module emulation section 270, a cycle termination timing for terminating the cycle time of the test module emulation section 270, and the interruption collection timing for collecting the interruption which is generated by the test module emulation section 270 in simulation during the generation of the test signal in the cycle time. Then the synchronous module emulation section 250 notifies the timing alignment section 276 of the timings and registers them (S625). Here, the synchronous module emulation section 250 registers the timings into the timing alignment section 276 by calling the registerEvent( ) function in the schedule control section 275.

In addition, the synchronous module emulation section 250 generates substantially the same timing as the cycle end timing received from the test module emulation section 270 as the test signal generating timing, the test result collection timing, the cycle termination timing, and the interruption collection timing for the next time in the test module emulation section 270.

Next, when the timing alignment section 276 outputs the change timing which is registered in S615, the schedule section 277 notifies the DUT connection section 280 that the change timing has come so as to change the test signal in simulation at the timing (S630).

Next, when the change timing is notified from the schedule section 277, the DUT connection section 280 generates the test signal by changing the test signal in simulation at the change timing, and supplies it to the DUT simulating section 200 (S635). The DUT simulating section 200 simulates the operation of the DUT 100 based on the test signal acquired from the DUT connection section 280. Then, the DUT simulating section 200 generates the result signal in simulation output as a result of the DUT 100 being operated based on the test signal, and supplies it to the test module emulation section 270 through the DUT connection section 280. The test module emulation section 270 compares the result signal with the expected value, and acquires a comparison result.

Next, when the timing alignment section 276 outputs the test result collection timing registered in S625, the schedule section 277 notifies the test module emulation section 270 that the test result collection timing has come so as to collect acceptability of the result based on the result signal supplied from the DUT simulating section 200 to the test module emulation section 270 (S640). When the test result collection timing is notified, the test module emulation section 270 notifies the synchronous module emulation section 250 through the synchronous connection module emulation section 260 of the comparison result of the result signal and the expected value in the cycle time. The synchronous module emulation section 250 judges the acceptability (pass or fail) of the test result based on the comparison result collected from each of the test module emulation sections 270, and notifies each of the test module emulation section 270 of the acceptability of a test result (S645). Based on the acceptability of this test result, the test program and the test data, which are supplied to the plurality of test module emulation sections 270, are described so as to change the sequence of the test performed after the cycle time.

Next, when the timing alignment section 276 outputs the cycle termination timing in S625, the schedule section 277 notifies the test module emulation section 270 that that the termination timing of the cycle has come (S650).

Next, when the timing alignment section 276 outputs the interruption collection timing registered in S625, the schedule section 277 notifies the test module emulation section 270 that the interruption collection timing has come (S655). When the interruption collection timing is notified, the test module emulation section 270 notifies in simulation the site control emulation section 230 through the bus switch emulation section 240 of the interruption, which is generated in simulation in the cycle time at which the test module emulation section 270 generates the test signal just before the interruption collection timing.

The test emulator 190 repeats the processing explained in the above-mentioned steps S600-S655 until the test is finished (S660).

In addition, when the test is done by the plurality of test module emulation sections 270, the schedule control section 275 aligns the timings of each of the operations of the test module emulation sections 270 in order of time, and makes the schedule. For this reason, S600, S630, S640, S650, and S655 about the plurality of test module emulation sections 270 are performed in order of time.

Figure 7:
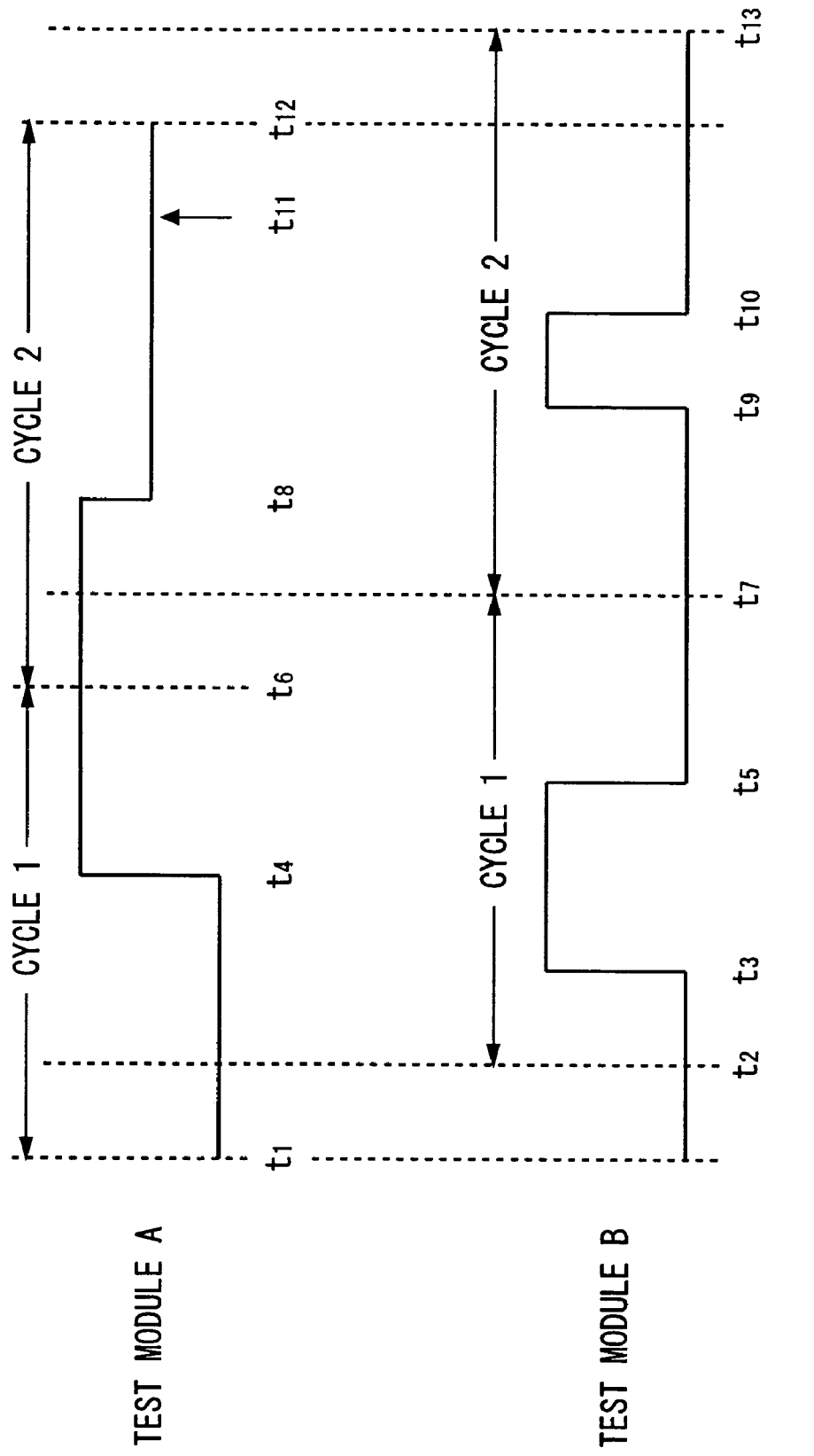
FIG. 7 is a drawing exemplary showing the test signal simulated by the test emulator 190 according to the embodiment of the present invention.

FIG. 7 is a drawing exemplary showing the test signal generated in simulation by the test emulator 190 according to the embodiment of the present invention. In this drawing, the test emulator 190 includes a test module emulation section 270a for emulating a test module A, and a test module emulation section 270b for emulating a test module B, as the test module emulation section 270.

Before time t1, the test signal generating timing t1 of the test module emulation section 270a, and the test signal generating timing t2 of the test module emulation section 270b are registered into the timing alignment section 276. Since the timings are to be output in order of time, the test signal generating timing t1 is output at first. In response to the result, the schedule section 277 notifies the synchronous module emulation section 250 that the test signal generating timing t1 has come, while the time is set forward to t1.

When the test signal generating timing t1 is notified, the synchronous module emulation section 250 notifies the test module emulation section 270a corresponding to the test signal generating timing t1 through the synchronous connection module emulation section 260 and the test module emulation section 270 of the start of the cycle. In response, test module emulation section 270a generates the test signal in simulation in the cycle time indicated to be a cycle 1 in the figure. Here, test module emulation section 270a notifies the DUT connection section 280 that the test signal changes to H level at the change timing t4 in the cycle time. In response, the DUT connection section 280 registers the change timing t4 into the timing alignment section 276.

Next, after the generation of the test signal in the cycle 1 is finished, the test module emulation section 270a notifies the synchronous module emulation section 250 of the cycle end timing t6 of the cycle 1. In response, the synchronous module emulation section 250 generates the test signal generating timing t6, the test result collection timing t6-$\Delta$, the cycle termination timing t6-$\Delta$, and the interruption collection timing t6-$\Delta$ for the next time based on the cycle end timing t6, and registers them into the timing alignment section 276. Here, t6-$\Delta$ a time just before the next test signal generating timing t6.

Next, the timing alignment section 276 aligns the registered timings in order of time, and outputs the test signal generating timing t2. In response, the schedule section 277 sets time forward to t2 and notifies the synchronous module emulation section 250 that the test signal generating timing t2 has come.

When the test signal generating timing t2 is notified, the synchronous module emulation section 250 notifies the test module emulation section 270b corresponding to the test signal generating timing t2 through the schedule control section 275 of the cycle start. In response, test module emulation section 270b generates the test signal of test module emulation section 270b in simulation in the cycle 1. As a result, test module emulation section 270b generates change timings of the test signal t3 and t5, and the DUT connection section 280 registers the change timings into the timing alignment section 276.

Next, test module emulation section 270b notifies the synchronous module emulation section 250 of the cycle end timing t7 of the cycle 1 after the generation of the test signal in a cycle 1 is finished. In response, based on the cycle end timing t7, the synchronous module emulation section 250 generates the test signal generating timing t7, the test result collection timing t7-$\Delta$, the cycle termination timing t7-$\Delta$, and the interruption collection timing t7-$\Delta$ for the next time, and registers them into the timing alignment section 276.

Next, the timing alignment section 276 aligns the registered timings in order of time, and outputs the change timings t3, t4, and t5 one by one. According to each of the change timings, the schedule section 277 notifies the DUT connection section 280 of the change timings. As a result, the DUT connection section 280 changes the test signal in simulation during the change timing, and it is supplied to the DUT simulating section 200.

Next, the timing alignment section 276 outputs the test result collection timing t6-$\Delta$. In response, the schedule section 277 sets the time forward to t6-$\Delta$ and notifies the test module emulation section 270a of the test result collection timing t6-$\Delta$. As a result, collection and distribution of the test result are performed between the test module emulation section 270a and the synchronous module emulation section 250.

Next, the timing alignment section 276 outputs the cycle termination timing t6-$\Delta$. In response, the schedule section 277 notifies the test module emulation section 270a of the end of the cycle 1.

Next, the timing alignment section 276 outputs the interruption collection timing t6-$\Delta$. In response, the schedule section 277 notifies test module emulation section 270a of the outputs interruption collection timing t6-$\Delta$. As a result, the test module emulation section 270a notifies the site control emulation section 230 of the interruption generated in simulation in the cycle 1.

Next, the timing alignment section 276 outputs the test signal generating timing t6. In response, the schedule section 277 sets the time forward to t6 and notifies the synchronous module emulation section 250 that the test signal generating timing t6 has come. Henceforth, the test emulator 190 generates the change timing t8, the result signal acquisition timing t11 indicating the timing at which the result signal is to be acquired, the test signal generating timing t12, the test result collection timing t12-$\Delta$, cycle termination timing t12-$\Delta$, and the interruption collection timing t12 for the next time in the similar manner to the time t1. Then, the test emulator 190 registers these timings into the timing alignment section 276 in the similar manner to the time t1.

Next, the timing alignment section 276 aligns the registered timings in order of time, and outputs the test signal generating timing t7. In response, the schedule section 277 sets the time forward to the t7 and notifies the synchronous module emulation section 250 that the test signal generating timing t7 has come. Henceforth, the test emulator 190 generates the change timings t9 and t10, the test signal generating timing t13, the test result collection timing t13-$\Delta$, the cycle termination timing t13-$\Delta$, and the interruption collection timing t13 for the next time in the similar manner to the time t2. Then, the test emulator 190 registers these timings into the timing alignment section 276 in the similar manner to the time t2.

As described above, according to the test emulator 190 of the present embodiment, the schedule control section 275 aligns various kinds of timings, such as the test signal generating timing, the test signal change timing, the test result collection timing, the result signal acquisition timing, and the interruption collection timing in order of time, so that the scheduling is carried out. For this reason, the test emulator 190 appropriately emulates the operation of the test apparatus 10 in case that the plurality of test modules 170 based on the different cycles are mounted.

Alternatively, in the present embodiment, although the synchronous connection module emulation section 260 registers the test result collection timing, the cycle termination timing, and the interruption collection timing into the timing alignment section 276 in case that the cycle end timing is received from the test module 170, The following method is substituted for the above-mentioned method.

In S625 shown in FIG. 6, based on cycle end timing, the synchronous module emulation section 250 generates the test signal generating timing at which the test module emulation section 270 is to generate the test signal in simulation corresponding to the cycle time, and notifies the timing alignment section 276 of the timing and registers the timing into the timing alignment section 276. On the other hand at this time, the synchronous module emulation section 250 does not generate the test result collection timing, the cycle termination timing, and the interruption collection timing, and does not register them into the timing alignment section 276.

As a result, after the processing in the steps S630 and S635 is done, the test emulator 190 proceeds to the step S600 skipping the steps S640, S650, and S655. Moreover, in case that the timing alignment section 276 outputs the test signal generating timing corresponding to the next cycle time in S600, the schedule section 277 notifies the synchronous module emulation section 250 that the test signal generating timing has come. In response, the synchronous module emulation section 250 instructs the collection of the test result, the notice of the cycle end, and the collection of the interruption to the test module emulation section 270 corresponding to the test signal generating timing before the generation of the test signal generating of the next cycle time.

According to the above-mentioned processing, the schedule control section 275 causes the synchronous module emulation section 250, the synchronous connection module emulation section 260, test module emulation section 270 etc., to perform the processing described in S640, S645, S650, and S655 before the generation of the test signal of the next cycle time. More specifically, the schedule control section 275 causes the synchronous module emulation section 250 and the synchronous connection module emulation section 260 to collect and distribute the acceptability of the test result based on the result signal supplied to the test module emulation section 270 during the generation of the test signal in the cycle time just before the test signal generating timing, and to notify the site control emulation section 230 of the interruption generated in simulation by the test module emulation section 270.

Next, there will be explained examples of specifications of the test emulator 190 according to the present embodiment, and examples of specifications of library in case that the site control emulation section 230 according to the present embodiment accesses the module emulation programs of the synchronous module emulation section 250, the synchronous connection module emulation section 260, test module emulation section 270 etc., through the bus switch emulation section 240.

OASIS Offline Framework User's and Developer's Guide

Version 0.6

© Copyright 2003 by Advantest R&D Center Inc. (ARD)

All rights reserved. All text and figures included in this publication are the exclusive property of ARD. Reproduction of this publication in any manner without the written permission of ARD is prohibited. Information in this document is subject to change without notice.

This document contains trademarks and trade names that are used to refer to either the entities claiming the marks and names, or their products. Advantest disclaims any proprietary interest in trademarks or trade names other than its own.

Advantest R&D Center Inc. (ARD)
3201 Scott Boulevard
Santa Clara, CA 95054 USA

Last modified 03/03/27 19:27

Table of Contents

INTRODUCTION ............................................................................................................. 50

OASIS OFFLINE FRAMEWORK USER'S GUIDE ............................................................. 51
    2.1 OASIS OFFLINE SAMPLE CONFIGURATION FILE ............................................................. 52
        2.1.1 OASIS OFFLINE CONFIGURATION FILE SYNTAX ............................................... 53
        2.1.2 OASIS OFFLINE CONFIGURATION FILE KEYWORDS ........................................ 54
    2.2 CONFIGURATION VERSION ............................................................................................. 54
    2.3 GLOBAL SECTION ......................................................................................................... 54
    2.4 SLOT SECTION ............................................................................................................. 55
        2.4.1 SLOT NUMBERING ........................................................................................ 55
        2.4.2 MODULE DLL CONFIGURATION .................................................................... 56
        2.4.3 CHANNEL RESOURCE SPECIFICATION ........................................................... 56
        2.4.4 DISABLED CHANNELS .................................................................................. 57
    2.5 DUT SECTION .............................................................................................................. 58
        2.5.1 VERILOG CLIENT .......................................................................................... 58
        2.5.2 DUT CABLE ................................................................................................. 58
    2.6 LOAD BOARD CONFIGURATION FILE ............................................................................. 59
    2.7 VERILOG SERVER CONFIGURATION .............................................................................. 60
        2.7.1 SYSTEM REQUIREMENTS FOR VSTIMD ........................................................ 61
        2.7.2 VSTIMD CONFIGURATION IN VSTIMRC .......................................................... 61
        2.7.3 VSTIMD CONFIGURATION IN VERILOG STIMULUS BLOCK ............................. 63

OASIS OFFLINE FRAMEWORK DEVELOPER'S GUIDE ................................................... 66
    3.1 SYSTEM REQUIREMENTS FOR OASIS DEVELOPMENT .................................................. 66
    3.2 OASIS OFFLINE FRAMEWORK CLASS STRUCTURE ...................................................... 66
        3.2.1 CLASS INHERITANCE .................................................................................... 66
        3.2.2 SIMCHANNEL USAGE .................................................................................... 67
        3.2.3 SIMEVENT USAGE ........................................................................................ 68
    3.3 IMPLEMENTATION OF A TESTER MODULE .................................................................... 69
        3.3.1 SIMPLE DIGITAL MODULES ........................................................................... 70
        3.3.2 SIMPLE DIGITAL MODULE BASE CLASS ........................................................ 71
        3.3.3 LOCAL EVENTS ............................................................................................ 77
        3.3.4 SIMPLE DIGITAL DRIVE MODULE .................................................................. 78
        3.3.5 SIMPLE DIGITAL STROBE MODULE ............................................................... 83
    3.4 IMPLEMENTATION OF A DUT MODEL ............................................................................ 90
        3.4.1 SIMPLE DUT MODEL .................................................................................... 90
        3.4.2 CLASS DEFINITION FOR DUT MODEL ........................................................... 91
        3.4.3 CONSTRUCTOR FOR THE DUT MODEL ......................................................... 92

- 3.4.4 getChannel Implementation for the DUT Model ........................................ 92
- 3.4.5 run Method in DUT Model ........................................ 92
- 3.5 OASIS Offline DLL Interface ........................................ 95
  - 3.5.1 DLL Interface for the Digital Modules ........................................ 96
  - 3.5.2 DLL Interface for the DUT Model ........................................ 98

| Revision | Date | Revised By | Description |
|---|---|---|---|
| 0.6 | March 3, 2003 | Conrad Mukai | *Add copyright.* |
| 0.5 | March 1, 2003 | Conrad Mukai | *Take out reference to SimComponent::end().* |
| 0.4 | February 28, 2003 | Conrad Mukai | *Incorporate Higashi's comments on GBUS methods.* |
| 0.3 | February 28, 2003 | Conrad Mukai | *Revisions to reflect code updates.* |
| 0.2 | January 30, 2003 | Conrad Mukai | *Standardize cover sheet.* |
| 0.1 | January 20, 2003 | Conrad Mukai | *Initial Creation.* |

1
Introduction

This document is aimed at two audiences. First it is intended for OASIS end users who wish to configure and run offline simulations. Second it serves the community of OASIS model developers who wish to create either tester or DUT models that run within the OASIS offline framework.

Developing test programs is an expensive and time consuming proposition; hence, an accurate simulation of both the tester components and a DUT is critical in debugging such programs. Without a good simulation environment, test engineers would need to spend long hours on actual test hardware, a critical resource in most semiconductor enterprises. Also, the simulation environment must be simple to use so that it does not get in the way of an engineer's ability to assess their test program. The OASIS simulation framework is such a system.

An OASIS simulation is composed of the OASIS framework, $3^{rd}$ party tester module models in the form of DLLs, and a DUT model, which is either another DLL or a Verilog model running on a UNIX server. Configuration of the simulation is done through text files.

The model developer's environment must also provide an unobtrusive interface, allowing the developer to concentrate on the details of the model's internal behavior. The development environment uses C++ base classes. The developer integrates into the OASIS framework by defining a few virtual functions. The models are distributed by compiling the models into DLLs, which end users link into their simulation using the OASIS configuration files.

The rest of this document is broken into two main sections. The first section is a user's guide describing how a simulation is configured given a set of $3^{rd}$ party DLLs and one or more DUT models. The second section is a programmer's guide describing the OASIS API. It is recommended that developers familiarize themselves with the model configuration since the OASIS framework is the testbench environment used to validate their models.

2
OASIS Offline Framework User's Guide

An OASIS offline simulation is composed of the following:
1. the OASIS offline framework;
2. 3rd party module models in the form of DLLs; and
3. one or more DUT models in the form of more DLLs or as a Verilog model running on a UNIX server.

To assemble these pieces into a simulation, the user must create a configuration file that describes among other things, what modules get loaded and how they are connected to the DUT. This is essentially what most of the configuration is all about. The simulation execution is taken care of by the pattern loaded into the module models by the test program, so the there are only a few simulation parameters that need to be specified in the configuration file.

Before embarking on a lengthy discussion of what is in the configuration file, some background as to what is in each of the aforementioned components is in order. Figure 2.1 shows an overview of a simulation and the relationship each component has with one another.

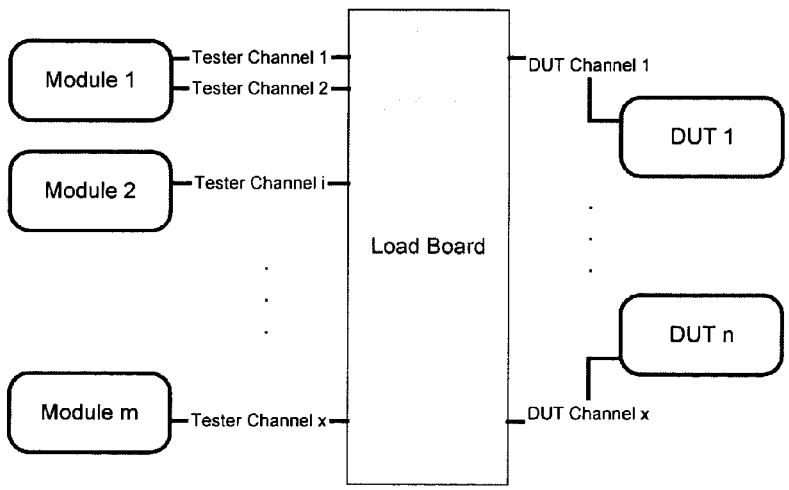

Figure 2.1 Overview of OASIS Offline Simulation.

In Figure 2.1, the OASIS framework supplies the load board model, the tester channels, and the DUT channels. The modules shown on the left side of the diagram are loaded from 3rd party vendor DLLs.

Each block represents a single instance of a module. A DLL can be loaded multiple times to create multiple instances of the same module type.

The DUT models on the right side of the diagram can be either supplied as 3rd party DLLs if the model is written in C++, or a Verilog model running on a UNIX host. In the latter case, the framework provides a special DLL that runs as a Windows client to a UNIX daemon running a Verilog model of the DUT. Both the Windows client and the UNIX daemon are part of the OASIS software package.

The load board model is also configurable. Its configuration file allows the user to map the tester channels to the DUT channels, and to specify a transport delay associated with those channels. All the connections are bidirectional so no special consideration is required to designate connectors as output drivers or input strobes.

2.1 OASIS Offline Sample Configuration File

A listing of a sample configuration is given below:

```
# OASIS version of the configuration
Version 0.0.1;

global
{
    initVoltage 0.5;       # Required. Initial voltage on all
                           # wires.
    LoadBoardFile "channel.txt";  # Required. Tester->DUT map.
    RecoveryRate 2.5;      # Optional. For drive conflict in
                           # analog signals.
}

# For specifying multiple slots of the same configuration.
slot 1, 3
{
    DLL "module1.dll";     # Required. DLL module name.
    params                 # To be passed to DLL.
    {
        test    "param1";
        key     "abc";
    }
    resource step          # Required. Pin type.
    {
        maxAvailable 32;   # Required.
    }
}
slot 2
{
    DLL    "module2.dll";
    Resource Step          # Required. Pin type.
    {
        maxAvailable 32;   # Required.
        disabled     1-4;  # Disabled pins.
    }
}
```

```
slot 4
{
    DLL "dps.dll";
    resource slew
    {
        slewRate 2.0;        # Required for slew. V / nsec
        maxAvailable 32;
        disabled 1-4, 9-12;
    }
}

DUT 1
{
    DLL "DUT1Sim.dll";       # Required.
    params
    {
        param1Name"param1Value";
        param2Name"param2Value";
    }
    resource step    # Required. Pin type.
    {
        maxAvailable 64;
        disabled     36-64;
    }
}
DUT 2
{
    DLL "DUT2Sim.dll";       # Required.
    params
    {
        param1Name"param1Value";
        param2Name"param2Value";
    }
    resource slew    # Required. Pin type.
    {
        slewRate    2.0;     # V / nsec
        maxAvailable 64;
    }
}
```

Listing 2.1 Sample OASIS Offline Configuration File.

2.1.1 OASIS Offline Configuration File Syntax

Listing 2.1 shows that the configuration file has a C-like syntax. The following syntactical rules are used:

1. any characters following the '#' symbol and before the ensuing carriage return is considered a comment;

2. all tokens are white-space delimited, except when enclosed by the double quote character '"';

3. tokens are case insensitive;

4. the statement delimiter is a semicolon (i.e., the ';' character) and can span multiple lines;

5. empty lines are permitted and treated as white space;

6. sections are blocked off with curly braces (i.e., the '{' and '}' characters); and
7. literals are delimited by the double quote character and must be contained in a single line.

2.1.2 OASIS Offline Configuration File Keywords

Table 2.1 lists the keywords used in the OASIS offline configuration file:

| Analog | Disabled | DLL | DUT |
| Global | InitVoltage | MaxAvailable | Params |
| RecoveryRate | Resource | Slew | SlewRate |
| Slot | Step | Version | |

Table 2.1 OASIS Offline Configuration File Keywords.

2.2 Configuration Version

The first entry in the configuration file is the Version declaration. This field is required. This field indicates what OASIS version of the syntax is being used.

2.3 Global Section

As the name implies, global settings are found here. The three global configuration parameters are shown in Listing 2.2:

```
Global
{
    InitVoltage    0.5;
    LoadBoardFile  "loadboard.cfg"
    RecoveryRate   2.5;
}
```

Listing 2.2 Example of global Section.

The InitVoltage parameter is the initial voltage in Volts on all the wires in the simulation at the start. This value is only used at the start of the first pattern. Subsequent patterns start with the state left on the wire by the previous pattern.

The load board configuration references another file. This file is named in the LoadBoardFile parameter. The location of the file is a relative path, then the root of the path is the active configuration directory. For pathnames containing non-alphanumeric characters (e.g., period, slash, or back-slash)

the filename should be contained within double quotes. Section 2.6 contains a description of the contents of this file.

The `RecoveryRate` parameter is an optional parameter used to resolve two analog signals driving against once another. The OASIS offline framework has a simplified built in strength resolution scheme, similar to the one found in Verilog. If two signals drive against one another then a strength parameter set on the signal is used to determine which signal "wins." If the two signals are equal, then the voltage is set to the average of the two driving signals. If two driving voltages are set upon one another and one signal's strength is changed such that it is now weaker than the opposing signal, the voltage on the line will be driven to the stronger signal. This can be done instantaneously for discrete signals; however, analog signals have some lag in their response so driving the voltage to its end state instantaneously would not be accurate. The `RecoveryRate` parameter is used to determine how long it takes a voltage to achieve its steady state level when this case arises. The units for the value specified here is $V\text{-}nsec^{-1}$. If this parameter is not set and two analog signals need to be resolved, a runtime error will occur.

2.4 Slot Section

The `Slot` Section assigns module DLLs to slots in the simulated backplane. The first `Slot` Section from the example is shown here in Listing 2.3:

```
slot 1, 3
{
    DLL "module1.dll";
    params
    {
        test    "param1";
        key     "abc";
    }
    resource step
    {
        maxAvailable 32;
    }
}
```

Listing 2.3 Typical slot configuration.

2.4.1 Slot Numbering

The `Slot` keyword is followed by one or more slot numbers. The list of numbers can be a comma delimited list of single values or a hyphen delimited range of numbers. For example, if we wish to denote Slots 1, 6, 7, 8, and 9, we could use the following:

```
Slot 1, 6-9
{
    # shared configuration
}
```

Listing 2.4 Example of a range of slot numbers.

Slot numbers must be unique within the configuration file (i.e., a slot number cannot be reused).

2.4.2 Module DLL Configuration

The DLL parameter is the filename of the module model. This file must be located in one of the directories specified by the OASIS_MODULE_LIBPATH OASIS variable. Immediately after the DLL specification is the Params Section. The settings here are passed into the DLL factory function as keyword-value pairs when constructing the module model. (see Section 3.5 for more information concerning the OASIS DLL factory function). The Params Section is "optional" only in the sense that some models may not need any parameters at load time. Each module developer is responsible for documenting what parameters are needed by their respective DLL.

2.4.3 Channel Resource Specification

Following the DLL parameters is the resource configuration. This section assigns channels in the slot to a specific model format for the underlying signal. Channel resources are configured by using the keyword Resource followed by the signal type. There are 3 types of signals supported by the OASIS simulation framework, indicated by the following keywords:

1. step;
2. slew; and
3. analog.

The step signal is a square wave. The first slot Section contains a typical resource configuration using the step signal. It is shown in Listing 2.5:

```
resource step
{
    maxAvailable 32;
}
```

Listing 2.5 Typical channel allocation.

The maxAvailable parameter indicates how many channels this slot occupies. This does not indicate how many channels are actually being used by the module. This is explained in Section 2.4.4.

The order of the resources declarations is significant. Since this resource section is the first one in the slot and because this is Slot 1, we can infer that channels 1 through 32 are being used by this resource. To determine what channels are being assigned for Slot 3 by this statement we can look at the number of channels assigned to Slot 2. Because there are 32 channels in Slot 2, we can deduce that Slot 3 occupies Channels 65 through 96.

A slew signal is very similar to a step signal, but instead of instantaneous changes in voltage, the voltage transitions from one level to the next in a finite time. The rate at which the voltage changes is set in the configuration file using the keyword slewRate. This is shown in the configuration of Slot 4 in the example:

```
resource slew
{
    slewRate      2.0;
    maxAvailable 32;
    disabled      1-4, 9-12;
}
```

Listing 2.6 Example of configuring a slewing signal.

The slew rate is in $V\text{-}nsec^{-1}$. Note that one can change the format from step to slew and back again simply by editing the configuration file. You may leave the slewRate parameter in a step block as this will have no effect. This is because the OASIS API does not differentiate between step and slew signals. This is discussed further in Section 3.3.4.4.

The analog signal however, cannot be changed by simply editing the configuration file. Analog signals require a different modeling syntax in the API so the fact that a module is generating analog signals is embedded in the model. An analog signal is essentially a piecewise linear history of the voltage, while step and slew signals have voltage plateaus. The details of how these signals are handled from a programmer's perspective is discussed in the Section 3.3.4.4.

The syntax of analog signals configuration is identical to the other two formats. For example one could specify a block of analog signals as follows:

```
resource analog
{
    maxAvailable 16;
}
```

Listing 2.7 Example of configuring an analog signal.

One more point needs to be made. A single slot can contain several types of signals. The user can specify multiple block types within one slot configuration.

2.4.4 Disabled Channels

The configuration of Slot 2 in Listing 2.1 contains a wrinkle on the channel assignment. Here not all of the channels available are used, leaving some holes in the channel assignment. This is shown in Listing 2.8:

```
resource analog
{
   maxAvailable 32;
   disabled      3, 16-19;
}
```

Listing 2.8 Example of disabled channels.

Here Local Channels 3, 16, 17, 18, and 19 are not used. Since this is the configuration for Slot 2, the local channels are offset by the number of channels in Slot 1 to get the tester channel numbers; hence, Tester Channels 35, 48, 49, 50, and 51 are disabled.

2.5 DUT Section

The syntax for loading DUT models is identical to that for loading the tester modules.

2.5.1 Verilog Client

The OASIS framework provides a DLL for communicating with a UNIX server that runs a Verilog DUT model. An example of a DUT block that loads this DLL is shown in Listing 2.9.

```
DUT 1
{
    DLL "VerilogClient.dll";
    params
    {
        host "VServerHost";
        port 5861;# optional - default is 5861
    }
    step
    {
        maxAvailable 128;
    }
}
```

Listing 2.9 Example of VerilogClient configuration.

The VerilogClient.dll file is included with the OASIS software. The PATH environment variable must include the location of the OASIS DLLs. The params section must be included with this DLL, and the host parameter must be specified in this section. The parameter indicates the hostname of the server. The other parameter that can be specified with this DLL is port. This parameter is optional. The port parameter indicates on which TCP port the server is listening for connections. The default value for this port is 5861.

The listening port on the server can be configured in the vstimd configuration file. This parameter as well as other configurable parameters is covered in Section 2.7.2.

2.5.2 DUT Cable

One other model that comes with the simulation framework is a cable model. These models can be used in much the same way a cable short can be used on a real load board. An example of such a use would be to transmit the trigger signal from a digital module to a PMU to make static measurements.

Listing 2.10 contains an example of the DUT configuration that would be used for the cable model:

```
DUT 3
{
    DLL "Cable.dll";
    Params
    {
        delay 1.0;# nsec
    }
    Resource Step
    {
        MaxAvailable 2;
    }
}
```

Listing 2.10 Example of Cable DUT configuration.

The sole parameter that can be specified for the Cable DUT model is the delay imposed on the signal as it traverses the cable. If the delay is not specified, then the delay defaults to 0.0. Since this is a model for a single cable, only two active channels can be used in the Resource Section (i.e., one channel for each end of the cable).

2.6 Load Board Configuration File

The loadboard configuration specifies which tester channels connect to which DUT channels, and the transport delay associated with that connection. In addition, the configuration file can specify which tester or DUT channels are unconnected.

The load board channel configuration file has the following syntax:

1. comments are delineated with the hash symbol (i.e., '#'), where all characters starting with '#' and ending with the newline are ignored;
2. empty lines are ignored;
3. each record for the map resides on a single line;
4. a record can consist of 2 integers and a floating point; where
    a. the first integer is the tester channel number [1:4096];
    b. the second integer is the DUT channel number [1:4096]; and
    c. the floating point value is the line delay in nanoseconds; or
5. an asterisk (i.e., '*') and an integer; where
    a. an asterisk in the second column indicates that a tester channel is unconnected; or
    b. an asterisk in the first column indicates that a DUT channel is unconnected.

A sample load board configuration file for an 8 pin tester is shown below:

```
# Tester    DUT    delay
  1         2      0.01
```

```
2      61     0.02
3      62     0.00
4      64     0.01
8       *
7       1     0.00
*       3
5       4     0.02
```

Listing 2.11 Example load board configuration file.

An error is raised if either a tester or a DUT channel appears more than once. An error is also raised if the tester and DUT channel types are incompatible. Basically analog signals can only be tied to other analog signals. step and slew signals can be tied to other step or slew signals, but not to an analog one. Table 2.2 contains a summary of these rules.

|        | analog | slew | step |
|--------|--------|------|------|
| analog | Y      | N    | N    |
| slew   | N      | Y    | Y    |
| step   | N      | Y    | Y    |

Table 2.2 Compatibility of signal types across the load board.

2.7 Verilog Server Configuration

The Verilog server is a UNIX daemon that does the following:

1. compiles a Verilog model;
2. forks a process into the background;
3. listens for socket connections from client programs;
4. forks a child process to handle communications with the client;
5. receives pin stimulus and applies it to the Verilog model;
6. sends pin outputs from the Verilog model back to the client;
7. terminates the simulation when a signal from the client is received; and
8. exits the child process.

The Verilog daemon is called vstimd. This program is configured through a configuration file, vstimrc, and PLI calls in the Verilog source file. To invoke the process the vstimd program takes a single argument, namely the top level file for the Verilog model. Thus the user can invoke the daemon process from the command line by entering the following (assuming vstimd is in the user's PATH variable):

```
% vstimd model.v
```

This will result in some splash from the Verilog compilation. If the model compiles correctly, the daemon will fork into the background awaiting client connections. When `vstimd` is first started, it looks for the configuration file `vstimrc`. This file must either be located in the current working directory, or in a path defined by the environment variable `VSTIMROOT`.

2.7.1 System Requirements for vstimd

`vstimd` runs on the Solaris O/S and requires access to Cadence tools. It uses the Verilog-XL simulation environment provided by Cadence. The current version of `vstimd` was built and tested on the following system:

```
SunOS 5.7
Verilog-XL 2.7.5
```

In order to run `vstimd`, the user must add the following directory to their `LD_LIBRARY_PATH` environment variable:

```
${CDS_INSTALL}/tools/lib
``` where `CDS_INSTALL` is the path to the root of the Cadence installation.

2.7.2 vstimd Configuration in vstimrc

The `vstimrc` file has the following syntax:

1. the hash character (i.e., '#') denotes comments, where characters starting with the hash and up to and including a newline are ignored;
2. empty lines with white space only are ignored;
3. each configuration setting is composed of a keyword/value pair, and
4. there is only one keyword/value pair per line.

The set of possible keywords is defined below in Table 2.3.

| Keyword | Value | Description | Default |
|---|---|---|---|
| VIH | Volts | Required. High level for input voltage. | None. |
| VIL | Volts | Required. Low level for input voltage. | None. |
| VOH | Volts | Required. High level for output voltage. | None. |
| VOL | Volts | Required. Low level for output voltage. | None. |
| X_OUTPUT | Volts | Optional. Output voltage for unknown signals. | (VOH+VOL)/2 |

| Keyword | Valu | Description | Default |
|---|---|---|---|
| STIM_FILE | Path to file. | Optional. Use data in the file to exercise the Verilog instead of stimulus from client. The file format is the same as the input log (see LOG_INPUT). The program will not fork a background daemon when run with this configuration set. | None. |
| LOG_INPUT | Path to file basename. | Optional. Log input stimulus to a file. This log file can be used as stimulus for the STIM_FILE setting (see STIM_FILE). The input log and output log can be set to the same file. The actual filename of the log has the form:<br><br>basename.client.date.time<br><br>where, basename is the parameter from the configuration file, client is the hostname of the connecting client program, date is the date of the run, and time is the time of the run. | None. |
| LOG_OUTPUT | Path to file basename. | Optional. Log DUT output to a file. The input log and output log can be set to the same file. The actual filename of the log has the form:<br><br>basename.client.date.time<br><br>where, basename is the parameter from the configuration file, client is the hostname of the connecting client program, date is the date of the run, and time is the time of the run. | None. |
| DISPLAY | ON or OFF. | Optional. Turn on display to stdout and stderr. If the daemon is run as root, this parameter has no effect (i.e., no display is available for root daemon). Error messages from a root daemon will appear in /var/adm/messages. | OFF |
| WORK_DIR | Path to directory. | Optional. Working directory for the process. If the daemon is run as root, this parameter has no effect (i.e., the working directory will be /). | ./ or / for root process. |
| PORT | TCP Port. | Optional. Set the listening port for the daemon. | 5861 |
| MAX_CONNECTS | Connection count. | Optional. Set the maximum number of concurrent client connections. If this value is set to 0 the limit is removed (i.e., all validated connections will be accepted). | 5 |

Tabl 2.3 vstimrc configuration parameters.

2.7.3 vstimd Configuration in Verilog Stimulus Block

A few PLI calls must be added to the stimulus block to integrate the Verilog model with vstimd. The stimulus block is a Verilog module that has the following characteristics:

1. it is the highest level module in the simulation;
2. it contains a single instance of the DUT model; and
3. it has instances of registers and net objects that are connected to pins on the DUT model.

The following is an example of the PLI calls that must be added. Note that all the calls should be put inside the initial section of the stimulus block.

```
initial
begin
    $loadmap("PINMAP");
    $setenddelay(1000);
    $getstim;
end
```

Listing 2.12 Example of PLI calls to integrate with vstimd.

2.7.3.1 $loadmap PLI

The first PLI call shown in Listing 2.12 is $loadmap. This call specifies a configuration file that maps the DUT channels used in the client simulation to Verilog registers and net objects used in the stimulus block. An example of such a file is shown below in Listing 2.13:

```

# channel      Type    Verilog
#                      object

    1           b      a_wire[0]
    2           b      a_wire[1]
    3           b      a_wire[2]
    4           b      a_wire[3]
    5           b      a_wire[4]
    6           b      a_wire[5]
    7           b      a_wire[6]
    8           b      a_wire[7]

9           b      b_wire[0]
   10           b      b_wire[1]
   11           b      b_wire[2]
   12           b      b_wire[3]
   13           b      b_wire[4]
   14           b      b_wire[5]
   15           b      b_wire[6]
   16           b      b_wire[7]
```

```
17          i        g_N
18          i        dir
```

Listing 2.13 Example of a $loadmap configuration file.

The $loadmap configuration file has the following syntax:

1. the hash character (i.e., '#') denotes comments, where characters starting with the hash and up to and including a newline are ignored;

2. empty lines with white space only are ignored;

3. each record is composed of a DUT channel number, a type code, and the name of a Verilog register or net object; and 4. there is only one record per line.

The DUT channel number corresponds to the channel numbers assigned on the client. The type code is a single character with the following possible values:

| Code | Description |
| --- | --- |
| b | Bidirectional pin. |
| i | Input pin. |
| o | Output pin. |
| p | Power pin. |

Table 2.4 Pin codes in $loadmap configuration file.

The registers and net objects correspond to objects in the stimulus block. For example, the Verilog objects shown in Listing 2.13 would be declared with the following Verilog statements in the stimulus block:

```
reg dir, g_N ;
wire[7:0]  a_wire, b_wire ;
```

Listing 2.14 Declaration of pin connections in Verilog model.

Note that if the register or net object is a member of a bus, then each instance of the register or net must be identified using the normal Verilog syntax (e.g., a_wire[0]).

2.7.3.2 $setenddelay PLI

The $setenddelay specifies how many simulation time units should be executed after the receipt of an end simulation message from the client. This number should be set to the amount of time that it would take for signals within the DUT to propagate to the output pins.

2.7.3.3 $g_tstim PLI

This call initiates the I/O over the socket connection with the client. Once this call is made no further PLI calls need to be made explicitly in the Verilog code. vstimd will automatically schedule events with the Verilog simulation based upon messages from the client.

3
OASIS Offline Framework Developer's Guide

Tester module and DUT models which integrate into the OASIS simulation framework, are created by deriving C++ classes from some base classes provided by OASIS. The derivation involves implementing a few virtual functions in the base class. In addition, the framework provides some classes that facilitate I/O between tester modules and DUT models. Finally, by implementing the OASIS Offline Standard Interface to the resulting DLL the model will be available to the OASIS framework. This means that the developer's model can be loaded, connected to other models, and run by simply configuring the simulation properly and starting the OASIS runtime system.

3.1 System Requirements for OASIS Development

OASIS development requires the following:

1. Microsoft Windows 2000;
2. Microsoft Visual Studio 7.0; and
3. the OASIS SDK.

The OASIS SDK includes a specific version of the Standard Templates Library (STL). Please refer to your OASIS installation instructions to insure that you are using the correct STL when compiling your code.

3.2 OASIS Offline Framework Class Structure

Before we begin delving into the details of deriving C++ classes, some background information would be useful. As mentioned previously, the main task of implementing modules or DUT models that integrate into the OASIS Offline Framework is to derive some specific classes from base classes provided by OASIS.

3.2.1 Class Inheritance

Figure 3.1 contains a class diagram that illustrates the inheritance relationships between 3$^{rd}$ party classes and the OASIS base classes. The methods shown are the ones of particular interest to developers.

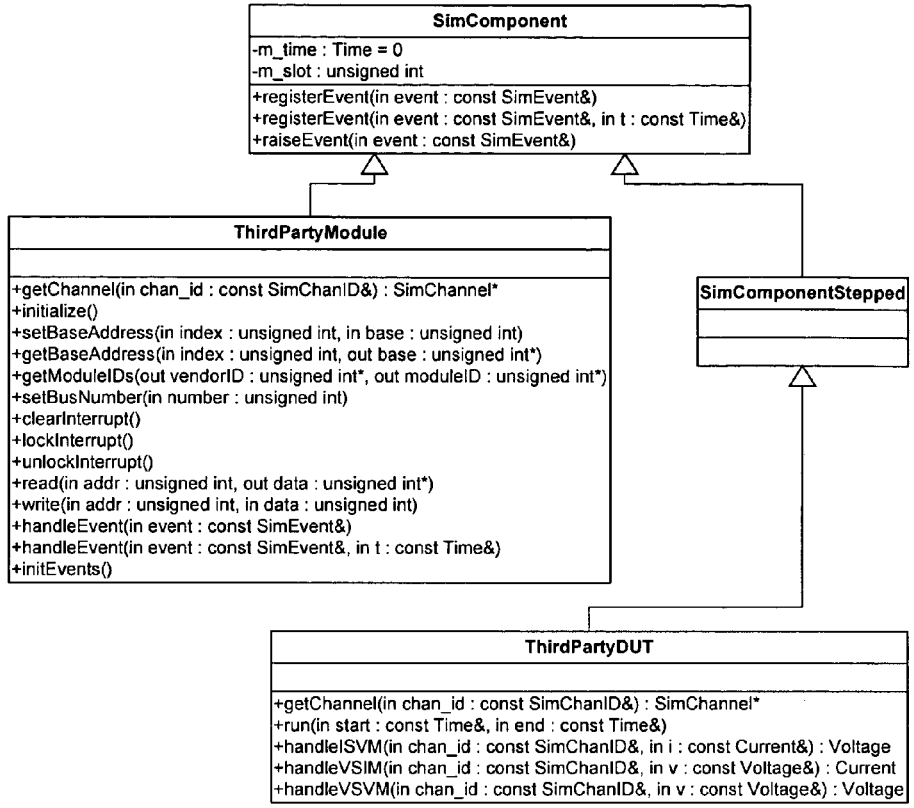

Figure 3.1 Inheritance Tree for OASIS Simulation Classes.

The methods listed inside the ThirdPartyModule and ThirdPartyDUT classes are the virtual methods that must be implemented to define the behavior of the model. The registerEvent and raiseEvent methods in the SimComponent base class are services that give access to OASIS Simulation Engine.

There are also several framework classes that are used in the interface. Figure 3.2 and Figure 3.3 show static usage diagrams for channel and event classes respectively.

3.2.2 SimChannel Usage

In general, tester modules and DUT models will contain an array of SimChannel objects. Each instance of SimChannel corresponds to an I/O channel for the model. Channels are identified using SimChanID objects. The SimChannel class allows the module or DUT model to write the voltage time history to the output channel, and to read voltages at specific times from input channels. If an input channel needs to be scanned for edges in a time window, then an instance of a SimWaveformIter can be obtained from the SimChannel::getWaveformIter method. The SimWaveformIter object allows the calling routine to iterate through all the edge in a finite time window.

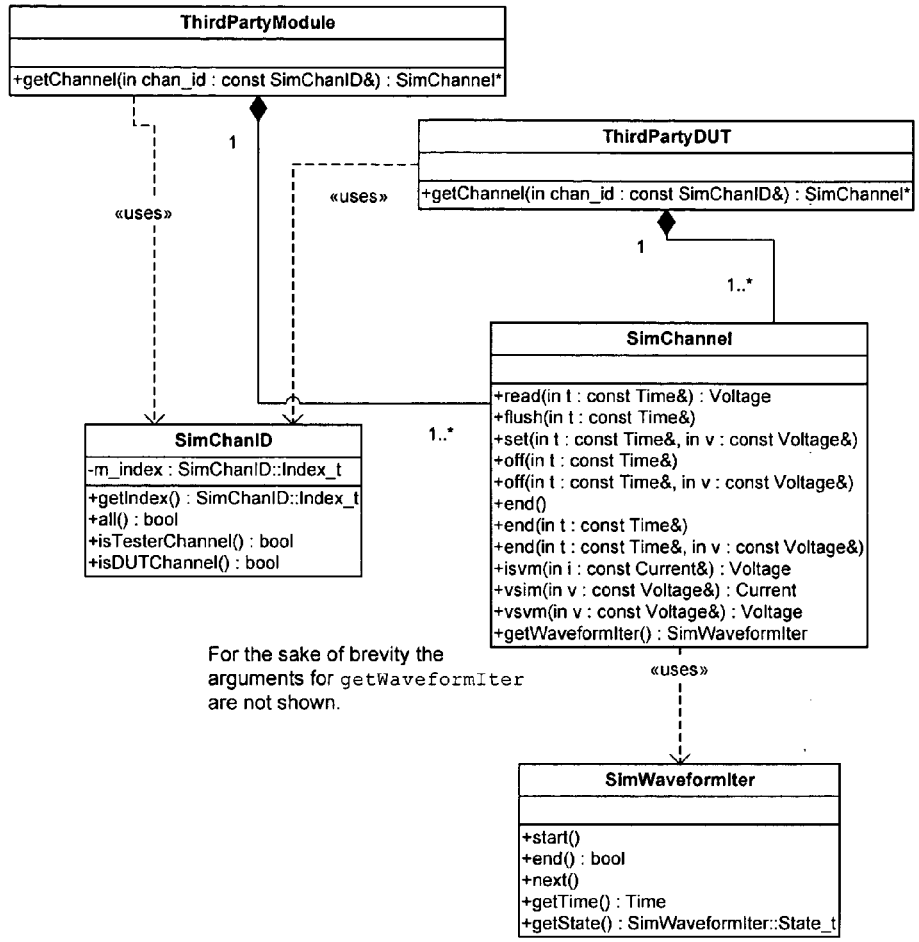

Figure 3.2 Usage diagram for channel objects.

3.2.3 SimEvent Usage

The other key element used in communicating between the framework and 3rd party models are events. Events are encapsulated in the SimEvent class. Instances of SimEvent are created by the SimEventMgr class. Typically, a model will have one instance of SimEventMgr; however, if a model sends special events to other modules then multiple SimEventMgr instances may be required. This is discussed further in Section 3.3.2.

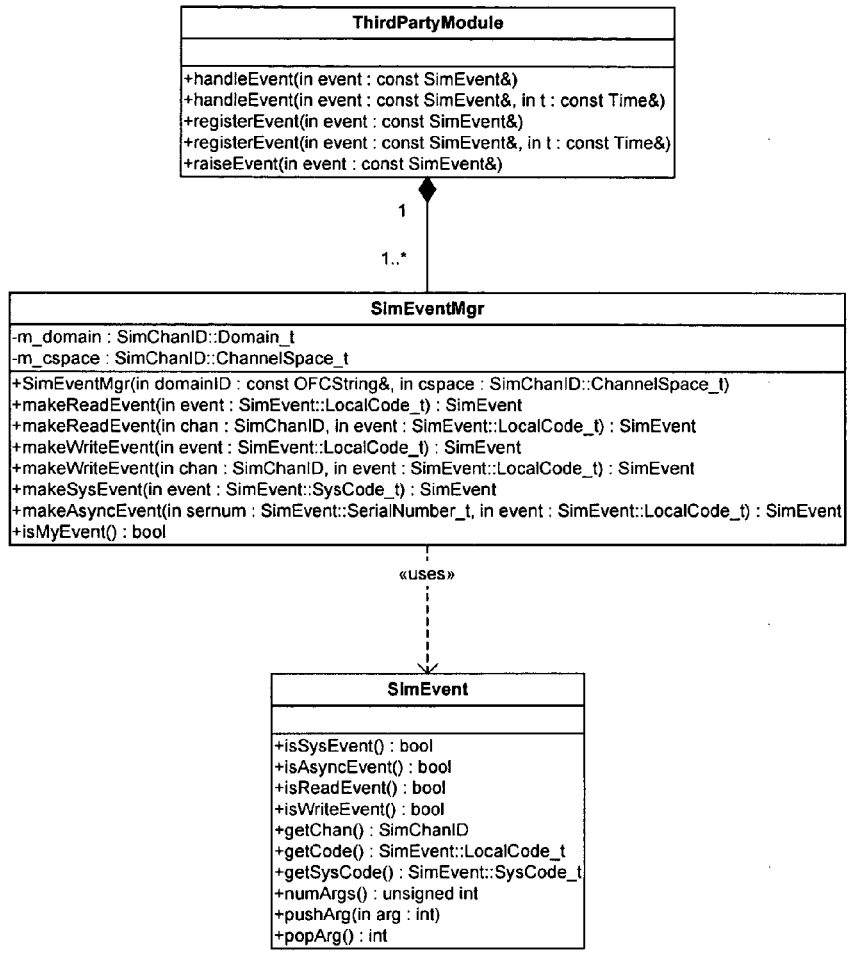
Figure 3.3 Usage diagram for event objects.
3.3 Implementation of a Tester Module
To create a tester module for the OASIS Offline Framework the user should go through the following check list:
1. design module structure determining what registers and memories that need to be modeled and the strategy for supporting pattern execution;
2. write the module constructor;

3. implement `getChannel()`;
4. implement bus I/O;
5. implement `initialize()` for one time pre-simulation setup;
6. implement `initEvents()` for setup before every pattern execution;
7. implement `end()` for all processing that happens at the end of every pattern;
8. implement `handleEvent()`; and
9. write a DLL interface that exports the module's factory and clean-up functions.

In order to facilitate discussion of these topics, we will create simple drive and strobe digital modules as examples. The process to create analog modules is similar, except when writing out the voltage history. This difference will be highlighted in Section 3.3.4.4.

3.3.1 Simple Digital Modules

Our simple drive module will do the following:

1. support 8 drive channels;
2. allow the user to program a single cycle period for all 8 channels;
3. allow the user to program the timing of a single edge in a cycle for each channel;
4. allow the user to set one high and one low level that all 8 channels will use;
5. generate a drive high or drive low during pattern execution for each of the 8 channels; and
6. support a pattern depth of 100 vectors.

Our simple strobing module will do the following:

1. support 8 strobing channels;
2. allow the user to program a single cycle period for all 8 channels;
3. allow the user to program the timing of a single strobe in a cycle for each channel;
4. allow the user to set one high or low strobe level that all 8 channels will use;
5. generate a strobe high or strobe low during pattern execution for each of the 8 channels; and
6. support a pattern depth of 100 vectors.

These modules are mirror images of one another, so that most of the code that is written for one will work for the other. The only difference being that the drive module will write to a channel while the strobe module will read from a channel.

Based upon our module "specifications" we need the following items in our tester module class:

1. an array of 8 `SimChannel` objects;
2. a channel index indicating the offset of the first local channel within the system channel space;

3. one register for the period;
4. 8 registers for the edge timings;
5. one register for high level, and another register for the low level
6. vector memory that is 8 bits wide and 100 vectors deep;
7. a pattern pointer to keep track of which vector to execute;
8. one SimEventMgr to create event objects.

The last item in the list should be a member of every module used in the framework. In some cases there may be more than one SimEventMgr object; hence it is left up to the developer to instantiate as many of these as are needed. In our example, we need only one. The basis for determining how many SimEventMgr objects will be needed is discussed in Section 3.3.2.1.

Now that we have our shopping list of items to create, we are almost ready to write the constructor. First though, we need to make some assumptions about the fidelity of our hardware. Our timing registers (for period and edge placement) will be 32 bit registers (coincidentally the size of int) where the min bit is 1 *psec*. Our level registers will also be 32 bits where the min bit is 1 *mV*.

A note to the reader. The following code is for explanatory purposes only. It is not indicative of the extremely high coding standards used in the actual OASIS project.

3.3.2 Simple Digital Module Base Class

Since our modules are almost identical, we will use a single base class to implement all the common features, then finish off the implementation by deriving a drive and strobe class from our base.

```
#include "SimComponent.h"
#include "SimChannel.h"
#include "SimChanID.h"

class MyBaseModule : public OASIS::SimComponent
{
public:

// constructor
    MyBaseModule(const SimChanID& start);

// channel access
    OASIS::SimChannel* getChannel(const OASIS::SimChanID& chan_id);

// bus I/O
    void setBaseAddress(unsigned int index, unsigned int base);
    void getBaseAddress(unsigned int index, unsigned int* base);
    void getModuleIDs(unsigned int* vendorID, unsigned int* moduleID);
    void setBusNumber(unsigned int number);
    void clearInterrupt();
    void lockInterrupt();
    void unlockInterrupt();
    void read(unsigned int addr, unsigned int* data);
    void write(unsigned int addr, unsigned int data);
```

```
protected:
    // internal types
    typedef unsigned int   slot_t;
    typedef unsigned int   reg_t;
    typedef unsigned char  vector_t;
    typedef unsigned char  vecaddr_t OASIS::SimChannel            m_channels[8];
    OASIS::SimChanID::Index_t    m_start;
    slot_t                       m_slot;
    reg_t                        m_base;
    reg_t                        m_period;
    reg_t                        m_edges[8];
    reg_t                        m_high;
    reg_t                        m_low;
    vector_t                     m_pattern[100];
    vecaddr_t                    m_patPtr;
    OASIS::SimEventMgr           m_evtMgr;
    bool                         m_intrLock;
};
```

Listing 3.1 Declaration of MyBaseModule class.

The initEvents and handleEvent methods are implemented in each of the derived classes, so it is not declared here, making this a virtual class.

3.3.2.1 Simple Digital Base Class Constructor

Now that we have the members declared, we can write the constructor:

```
MyBaseModule::MyBaseModule(const OASIS::SimChanID& start)
: OASIS::SimComponent(), m_channels(), m_start(start.getIndex()),
  m_base(0), m_period(0), m_edges(), m_high(0), m_low(0), m_pattern(),
  m_patPtr(0), m_evtMgr("MyCompany", OASIS::SimChanID::TESTER_SPACE),
  m_intrLock(false)
{
}
```

Listing 3.2 Example of a module constructor.

The one item that stands out here is the constructor for the SimEventMgr object. The constructor for SimEventMgr takes a string and an enumerated type SimChanID::ChannelSpace_t. The string is a unique identifier for the module vendor called a domain. This prevents collisions in the event space. In some cases though, two or more vendors may wish to share events. In that case the parties must agree upon a domain identifier to share. For example if Company X and Company Y wished to send events to one another, they could agree to use the domain identifier of "OurXYDomain." As long as no other vendor or group of vendors used that domain then the events generated by the event manager initialized with this string would be unique.

The second argument is an enumerated type identifying which type of channel index will be used in creating events. There are two types of channel indices, which are:

1. OASIS::SimChanID::TESTER_SPACE; and

2. `OASIS::SimChanID::DUT_SPACE`.

Since we are using channels on the tester side of the load board we indicate tester channels.

3.3.2.2 Implementation of getChannel

Now we can implement `getChannel`. The purpose of this routine is to return empty channel objects during simulation startup so that the channel object can be initialized. This initialization process is how the modules and DUT models get "wired" to the load board.

The code for `getChannel` in our case is simply:

```
OASIS::SimChannel*
MyBaseModule::getChannel(const OASIS::SimChanID& chan_id)
{
    return &m_channels[chan_id.getIndex() - m_start];
}
```

Listing 3.3 Example of a getChannel implementation.

Note that we are naively assuming that we will always be passed valid channel numbers. The `SimChanID` class is simply a wrapper around a channel index. Table 3.1 lists all the `SimChanID` methods.

| Method | Description |
| --- | --- |
| `SimChanID::Index_t getIndex()` | Returns the channel index. The `isTesterChannel` and `isDUTChannel` methods indicate if the index if for the tester or DUT space respectively. If the `all` method returns `true` then the result of this method is undefined. |
| `bool all()` | Indicates if event applies to all channels. If this returns `true`, then result of `getIndex` is undefined. |
| `bool isTesterChannel()` | Indicates if the event is for a tester channel. |
| `bool isDUTChannel()` | Indicates if the event is for a DUT channel. |

Table 3.1 SimChanID methods.

3.3.2.3 Bus Setup Methods

Before the pattern starts, the bus emulation communicates with each module to set up the global address space. The module provides implementations of the following functions to support this activity.

```
// base address methods
void MyBaseModule::setBaseAddress(unsigned int index, unsigned int base)
{
```

```
    m_base = base;
}
void MyBaseModule::getBaseAddress(unsigned int index, unsigned int* base)
{
    *base = m_base;
}

// set the slot number
void MyBaseModule::setBusNumber(unsigned int number)
{
    m_slot = number;
}
```

Listing 3.4 Example of bus set up methods.

The base address is the reference address for each module's local address space. The OASIS bus allows up to 3 base addresses to be used for various modes. These modes are:

1. broadcast;
2. multi-cast; and
3. single-cast.

In our example all three modes use the same base address so the index argument is ignored.

The number variable is a software version of the physical slot number. Note that while this number may not correspond to the physical slot number, there is a one to one correspondence between the value passed into the setBusNumber routine and a module's physical slot number. Our model saves this value but does not make use of it.

3.3.2.4 Implementation of Bus I/O Methods

The virtual methods read and write support bus I/O. These routines must support the global address space that spans all the modules in the tester. Because of this we always subtract the base address offset from the address passed into each routine to convert to a local address. In order to implement these functions for our example, we need to define an address space for our module. Table 3.2 contains the local address space for our drive and strobe modules relative to the base address.

| Name   | Address | Description   |
|--------|---------|---------------|
| PERIOD | 0x00    | Cycle period. |
| EDGE_0 | 0x04    | Timing edge 0. |
| ...    |         |               |
| EDGE_7 | 0x20    | Timing edge 7 |
| HIGH   | 0x24    | High level.   |
| LOW    | 0x28    | Low level.    |

| Name | Address | Description |
|---|---|---|
| VECTOR[0] | 0x2c | Vector 0. |
| VECTOR[1] | 0x2d | Vector 1. |
| . | | |
| . | | |
| . | | |
| VECTOR[99] | 0x8b | Vector 99. |

Table 3.2 Address Space for example module.

Based on this address space map we can implement our read and write routines. The read and write routine could look something like the following:

```
void MyBaseModule::read(unsigned int addr, unsigned int* data)
{
    addr -= m_base;
    if (addr == 0x00)
    {
        *data = m_period;
    }
    else if (addr <= 0x20)
    {
        *data = m_edges[(addr >> 2) - 1];
    }
    else if (addr == 0x24)
    {
        *data = m_high;
    }
    else if (addr == 0x28)
    {
        *data = m_low;
    }
    else
    {
        *data = m_pattern[addr - 0x2c];
    }
}
```

Listing 3.5 Example of a read implementation.

```
void MyBaseModule::write(unsigned int addr, unsigned int data)
{
    addr -= m_base;
    if (addr == 0x00)
    {
        m_period = data;
    }
    else if (addr <= 0x20)
    {
        m_edges[(addr >> 2) - 1] = data;
    }
    else if (addr == 0x24)
```

```
    {
        m_high = data;
    }
    else if (addr == 0x28)
    {
        m_low = data;
    }
    else
    {
        m_pattern[addr - 0x2c] = (vector_t) data;
    }
}
```

Listing 3.6 Example of a write implementation.

Once again for the sake of clarity we blithely fail to do any error trapping for invalid inputs.

3.3.2.5 Interrupt Handling

When an interrupt is raised by a module, the Site Controller must lock out any further interrupts. This is done by calling the lockInterrupt method for each component. Once the interrupt is processed the lock is undone by calling unlockInterrupt on each component. In our example we maintain the lock in our base class so that derived classes can test the lock condition to see if it is alright to raise an interrupt. The code to manage the lock is as follows:

```
void MyBaseModule::lockInterrupt()
{
    m_intrLock = true;
} void MyBaseModule::unlockInterrupt()
{
    m_intrLock = false;
}
```

Listing 3.7 Example of interrupt handling code.

Some modules may queue up interrupts. Because of this, the bus model needs a mechanism to clear out pending interrupts before proceeding. The clearInterrupt method is used for this purpose. Since we are not maintaining an interrupt queue, we will simply make this a no-op method:

```
void MyBaseModule::clearInterrupt()
{
}
```

Listing 3.8 A do nothing clearInterrupt implementation.

3.3.3 Local Events

Now that all the common features have been taken care of, we are now ready to discuss how we implement a module's behavior during pattern execution. The OASIS offline simulation is an event driven process. Modules register for events. When the event occurs each module that registered for the event has its handleEvent method called.

For OASIS, offline simulation events are characterized with the SimEvent class. There are two types of events, synchronous or asynchronous. Asynchronous events can be broken down further to system events and local asynchronous events. Currently, there is only one system event, which is INT1 or the system interrupt. This is discussed further in Section 3.3.2.5.

3.3.3.1 Local Asynchronous Events

Local asynchronous events are used to handle inter-module communications. As the name applies there is no time associated with this event. To indicate that a module wishes to receive a particular asynchronous event, it should register for it through the overloaded registerEvent method that takes no time argument. If a module needs to raise an event, the raiseEvent method should be invoked. Note that the event object supports arguments to be added to an event. The receiving module should handle asynchronous events in the overloaded handleEvent method that has no time argument.

Local asynchronous events are identified by two parameters, the serial number and the event code. The serial number allows particular modules to identify themselves. The event code is used to distinguish individual events. Currently the OASIS event object supports 32768 serial number identifiers [0:32767]. Each vendor has its own serial number space. The event code space supports 256 events [0:255]. Each vendor/serial number combination has its own event code space. SimEvent objects are created by the SimEventMgr class. Table 3.3 summarizes the methods used to create local asynchronous events as well as the other event types. Once created, the event can be used in either the registerEvent or raiseEvent methods.

The Advantest SYNC module uses local asynchronous events to communicate with other modules. If one were to develop a module that interacts with the Advantest SYNC module, then that module would have to register for and handle the particular events being raised by the SYNC module.

3.3.3.2 Local Synchronous Events

The most common type of event used is the local synchronous event (or simply synchronous event). These events are used by modules to schedule read or write (drive or strobe for digital modules) events. Synchronous events are only used by a module to receive notification at a specific time, and is never used for inter-module communications.

As previously mentioned, the only way an event can be created is through an instance of the SimEventMgr class. The constructor for this class is covered in Section 3.3.2.1. The methods for creating a SimEvent are summarized in Table 3.3. As you can see, each of these methods create objects with all the various combinations of the properties outlined above.

| Method | D scription |
|---|---|
| `SimEvent makeReadEvent(SimEvent::LocalCode_t event)` | Create a read event for all channels in the module. |
| `SimEvent makeReadEvent(SimChanID::Index_t chan, SimEvent::LocalCode_t event)` | Create a read event for channel chan. |
| `SimEvent makeWriteEvent(SimEvent::LocalCode_t event)` | Create a write event for all channels in the module. |
| `SimEvent makeWriteEvent(SimChanID::Index_t chan, SimEvent::LocalCode_t event)` | Create a write event for channel chan. |
| `SimEvent makeAsyncEvent(SimEvent::SerialNumber_t sernum, SimEvent::LocalCode_t event)` | Create an asynchronous event for a particular serial number. |
| `SimEvent makeSysEvent(SimEvent::SysCode_t event)` | Create a system event. |

Table 3.3 SimEventMgr methods for creating events.

In the methods above, the local code is an integer from 0 to 255 that the developer uses to identify specific tasks. It allows the module to connect the registration of an event with the handling of the event. What this means specifically is that we need to create a set of codes that we will use during a pattern execution.

For our example the following definitions will be used as the set of local codes used in our example:

```
const SimEvent::LocalCode_t DRIVE_CYCLE  = 0;
const SimEvent::LocalCode_t STROBE_CYCLE = 1;
```

Listing 3.9 Local code definitions used in digital module.

3.3.4 Simple Digital Drive Module

The class declaration for the drive module is as follows:

```
include "MyBaseModule.h"  // base class header class MyDriveModule : public MyBaseModule
{
public:

// constructor
    MyDriveModule(const OASIS::SimChanID& start);

// access to vendor/module data
```

```
    void getModuleIDs(unsigned int* vendorID, unsigned int* moduleID);

// initialize simulation
    void initEvents();

// handle events
    void handleEvent(const OASIS::SimEvent& event);
    void handleEvent(const OASIS::SimEvent& event, const OASIS::Time& t);
};
```

Listing 3.10 Simple drive module class declaration.

3.3.4.1 Simple Digital Drive Module Constructor

The drive module constructor is implemented as follows:

```
MyDriveModule::MyDriveModule(const OASIS::SimChanID& start)
: MyBaseModule(start)
{
}
```

Listing 3.11 Example of a drive module constructor.

3.3.4.2 Access to Vendor/Module Data

Each module must return its vendor and module ID data. The vendor ID is assigned by an OASIS governing body. The module ID is assigned by each vendor. For the purposes of this example we will assume that the vendor ID has been copied to the static constant variable MY_VENDOR_ID. The module ID is assumed to have been assigned by our mythical vendor and copied to the static constant variable MY_DRIVE_MODULE_ID.

```
void MyDriveModule::getModuleIDs(unsigned int* vendorID,
                                 unsigned int* moduleID)
{
    *vendorID = MY_VENDOR_ID;
    *moduleID = MY_DRIVE_MODULE_ID;
}
```

Listing 3.12 Example of getModuleIDs implementation.

3.3.4.3 initEvents for the Drive Module

As mentioned previously, the OASIS offline simulation is an event driven process. To start this process, each module's initEvents method is called at the beginning of the simulation to give it an opportunity to register for its first set of events.

Using the definitions from Section 3.3.3, we can implement the initEvents method for the drive module.

```
void MyDriveModule::initEvents()
{
    registerEvent(m_evtMgr.makeWriteEvent(DRIVE_CYCLE), 0.0);
}
```

Listing 3.13 Example of drive module initEvents implementation.

What this code is doing is creating a write event with a local code of DRIVE_CYCLE for all channels and registering that event for time 0.0, which is the start of the simulation.

Before proceeding, this is a good time to describe all of the services provided by the SimComponent base class for event registration and event raising. Table 3.4 lists all the event registration and raising methods provided by SimComponent.

| Method | Description |
| --- | --- |
| void registerEvent(const OASIS::SimEvent& event) | Register for an asynchronous event. If the system or some other module raises this event, then this module's asynchronous handleEvent (i.e., the overloaded method that does *not* have a time argument) method will be called. |
| void registerEvent(const OASIS::SimEvent& event, const OASIS::Time& t) | Register for a timed event. For write events the module's handleEvent method for timed events (i.e., the overloaded method that has a time argument) will be called when the simulation reaches the specified time. For read events, the simulation time must be reached and all specified channels must be ready for reading (see Section 3.3.4.4 to see what term "ready for reading" means). |
| void raiseEvent(const OASIS::SimEvent& event) | Raise an asynchronous event. All other modules that registered for this event will be notified with handleEvent. |

Table 3.4 Event management methods in SimComponent.

3.3.4.4 handleEvent for the Drive Module

We are now ready to implement the functional behavior of the module during the pattern execution. First we present the code for handleEvent.

```
void MyDriveModule::handleEvent(const OASIS::SimEvent& event,
                                const OASIS::Time& t)
{
    // t is the start of the cycle since that is the time we
```

```
    // registered for

// write the edge into each channel
    for (chanaddr_t c = 0; c < 8; c++)
    {
        // write the edge to the output channel
        m_channels[c].set(t + m_edges[c] * 1.0e-12,
                         (m_pattern[m_patPtr] & 1 << c ? m_high : m_low)
                         * 1.0e-3);

// terminate the write
        m_channels[c].end(t + m_period * 1.0e-12);
    }

// register for the next start of cycle
    if (m_patPtr++ < 100)
    {
        registerEvent(m_evtMgr.makeWriteEvent(DRIVE_CYCLE),
                      t + m_period * 1.0e-12);
    }
}
```

Listing 3.14 Example of drive module handleEvent implementation.

Our drive module writes out the edges for all the channels in the current cycle. The elements in the m_channels array are used to do this. As you recall m_channels is an array of SimChannel objects. It has the following methods for writing onto a channel.

| Method | Description |
| --- | --- |
| `void set(const OASIS::Time& t, const OASIS::Voltage& v)` | Specify a time and voltage point in the time history. If this is driving against another signal, then the voltage set here will prevail if the opposing drive is turned off. |
| `void off(const OASIS::Time& t)` | Turn off the drive. This leaves the voltage unchanged but allows the voltage to be reset if an opposing signal is turned on. |
| `void off(const OASIS::Time& t, const OASIS::Voltage& v)` | Turn off the drive and reset the voltage. If this signal is driving against an opposing signal with the drive on, the opposing signal will prevail. |
| `void end()` | Indicate channel is ready for reading. The terminating time is the maximum time specified in either a set or off call. |
| `void end(const OASIS::Time& t)` | Indicate that this channel is ready for reading up to and including the specified time. |
| `void end(const OASIS::Time& t, const OASIS::Voltage& v)` | Indicate that this channel is ready for reading up to and including the specified time and set the voltage at that time. |

Tabl 3.5 SimChannel methods for writing to a channel.

The most used call is set. This writes a point into the voltage time history. The form of the waveform depends upon the how the channel is configured. For example, Figure 3.4 shows the waveform resulting from a series of set calls.

In all three cases the starting voltage is v0. After the two set calls the waveforms shown above are the result. For a step channel the voltage transition is instantaneous, so that any reading between t1 and t2 will return a voltage of v1. In a slew channel, the voltage transition from its current state to the commanded state takes a finite amount of time. The slope of the transition is determined by the slewRate parameter in the slew section of the configuration file. Finally, for the analog channel, the voltage does not level off. Voltages between time points are computed through a piece-wise linear interpolation. If a reading is taken beyond the last point, then the value is extrapolated from the last two points; hence if no points are added beyond the set call for t2, the dashed line represents what voltage would be read from the channel.

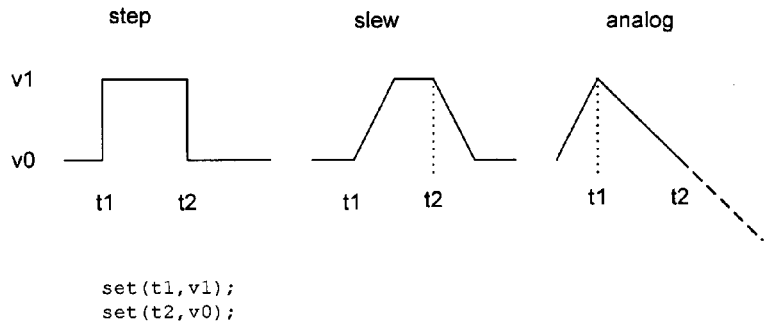

```
set(t1,v1);
set(t2,v0);
```

Figure 3.4 Waveforms for different channel configurations.

The voltage readings resulting from off and end calls follow the same pattern. If voltage is not specified, then it is computed by from the other points in the manner described above. The user must take care when specifying only time for off or end calls on an analog channel. If the time is past the last point, then the value will be extrapolated from the last 2 time points. This could lead to unexpected results. It is recommended that the user always use the time/voltage form of off and end when specifying the voltage history on analog channels.

As indicated in Table 3.5, the off method is primarily used to turn off the drive on the voltage. This comes into play when two components are writing to opposite side of a channel simultaneously. If one side calls set, then that voltage is considered to be driven. If the other side calls off, then that voltage is considered to be passive. In those cases the driving voltage will prevail and after the voltage on both sides gets resolved the voltage read from either channel will be the voltage input with the set command. If both sides call set or both side call off, then voltage history will be set to the mean value.

The end call indicates to the framework that the channel is ready for resolution, and subsequently for reading by a component on the other side of the channel. If end is not called on a channel, then the signals on that channel will not propagate through the rest of the simulation since the components on the opposite side of the channel will never be signaled to read from the channel. Typically the user will make several set calls to specify the voltage over a time range, and then call end once at the end of the time range. Section 3.4.5.2 discusses the relationship between end and set calls in more detail.

For now we are not concerned with asynchronous events so we will make the asynchronous event handler a no-op.

```
MyDriveModule::handleEvent(const OASIS::SimEvent& event)
{
}
```

Listing 3.15 Example of a do nothing handleEvent implementation.

3.3.5 Simple Digital Strobe Module

The class declaration for the strobe module is very similar to the drive module. The one difference is that we need to model fail vector memory. Our model will record up to 10 fails. The channel and vector for each fail will be saved. Because of this we will add the following addresses for fail vector memory.

| Name | Address | Description |
| --- | --- | --- |
| FM_CHAN[0] | 0x8c | Fail channel 0 |
| FM_CHAN[1] | 0x8d | Fail channel 1 |
| ... | | |
| FM_CHAN[9] | 0x95 | Fail channel 9 |
| FM_VEC[0] | 0x96 | Fail vector 0. |
| FM_VEC[1] | 0x97 | Fail vector 1. |
| ... | | |
| FM_VEC[9] | 0xa5 | Fail vector 9. |
| unused | 0xa6-0xa7 | Gap to next 4 byte boundary. |
| FM_COUNT | 0xa8 | Fail count. |

Table 3.6 Fail vector memory addresses.

By doing this means that we will also have to amend the read and write functions defined by the base class; however since the other addresses defined in the base class are valid for our strobe module, we will reuse this function in our new implementation.

```
include "MyBaseModule.h"  // base class header
```

```
class MyStrobeModule : public MyBaseModule
{
public:

// constructor
    MyStrobeModule(const OASIS::SimChanID& start);

// access to vendor/module data
    void getModuleIDs(unsigned int* vendorID, unsigned int* moduleID);

// bus I/O
    void read(unsigned int addr, unsigned int* data);
    void write(unsigned int addr, unsigned int data);

// initialize simulation
    void initEvents();

// handle events
    void handleEvent(const OASIS::SimEvent& event);
    void handleEvent(const OASIS::SimEvent& event, const OASIS::Time& t);

private:

// internal types
    typedef unsigned char chanaddr_t;

// fail vector memory
    chanaddr_t m_fcm[10];
    vecaddr_t  m_fvm[10];
    reg_t      m_failCnt;
};
```

Listing 3.16 Simple strobe module class declaration.

3.3.5.1 Simple Digital Strobe Module Constructor

The strobe module constructor is implemented as follows:

```
MyStrobeModule::MyStrobeModule(const OASIS::SimChanID& start)
: MyBaseModule(start), m_fcm(), m_fvm(), m_failCnt(0)
{
}
```

Listing 3.17 Example of a drive module constructor.

3.3.5.2 Access to Strobe Module Data

As we did with the drive module, we need to identify our strobe module.

```
void MyStrobeModule::getModuleIDs(unsigned int* vendorID,
                                   unsigned int* moduleID)
{
    *vendorID = MY_VENDOR_ID;
    *moduleID = MY_STROBE_MODULE_ID;
```

}

Listing 3.18 Implementation of getModuleIDs for MyStrobeModule.

3.3.5.3 Bus I/O for the Strobe Module

In order to access we need to provide read and write functions that access these additional addresses. We use the base class I/O functions to get to the registers and memories in the base class.

```
void MyStrobeModule::read(unsigned int addr, unsigned int* data)
{
    // data in base class
    if (addr - m_base < 0x8c)
    {
        MyBaseModule::read(addr, data);
        return;
    }

// subtract the offset
    addr -= m_base;

// fail channel memory
    if (addr < 0x96)
    {
        *data = m_fcm[addr - 0x8c];
    }

// fail vector memory
    else if (addr < 0xa6)
    {
        *data = m_fvm[addr - 0x96];
    }

// fail count
    else
    {
        *data = m_failCnt;
    }
}
```

Listing 3.19 Example of a read implementation for fail vector memory.

```
void MyStrobeModule::write(unsigned int addr, unsigned int data)
{
    // data in base class
    if (addr - m_base < 0x8c)
    {
        MyBaseModule::write(addr, data);
        return;
    }

// subtract the offset
    addr -= m_base;

// fail channel memory
```

```
        if (addr < 0x96)
        {
            m_fcm[addr - 0x8c] = data;
        }

// fail vector memory
        else if (addr < 0xa6)
        {
            m_fvm[addr - 0x96] = data;
        }

// fail count
        else
        {
            m_failCnt = data;
        }
    }
```

Listing 3.20 Example of a write implementation for fail vector memory.

3.3.5.4 initEvents for the Strobe Module

The implementation of initEvents for the strobe module is similar to that of the drive module. One obvious difference is that we need to register for read events instead of write events. A more subtle but equally significant difference has to do with the time that we register for. Because of the way the simulation works there is one fundamental difference between write events and read events. When a write event occurs the handleEvent method should write edges *after* the time specified by the Time argument. For a read event, the handleEvent method should strobe the channel *before* the time specified by the Time argument. Because of this we register for an event at the end of the first cycle instead of the beginning.

```
void MyStrobeModule::initEvents()
{
    registerEvent(m_evtMgr.makeReadEvent(STROBE_CYCLE),
                  m_period * 1.0e-12);
}
```

Listing 3.21 Example of strobe module initEvents implementation.

3.3.5.5 handleEvent for the Strobe Module

The implementation for handleEvent for the strobe module is as follows:

```
void MyStrobeModule::handleEvent(const OASIS::SimEvent& event,
                                 const OASIS::Time& t)
{
    // t is the end of the cycle since that is the time we
    // registered for // compute the start of cycle since all edges are relative to it
    OASIS::Time t0 = t - m_period * 1.0e-12;
```

```
        // strobe each channel
        for (chanaddr_t c = 0; c < 8; c++)
        {
            // make sure fail vector memory is not full
            if (m_failCnt == 10)
            {
                return;
            }

// strobe the input channel
            Voltage v = m_channels[c].read(t0 + m_edges[c] * 1.0e-12);

// test high
            if (m_pattern[m_patPtr] & 1 << c)
            {
                // fail
                if (v < m_high * 1.0e-3)
                {
                    m_fcm[m_failCnt] = c;
                    m_fvm[m_failCnt++] = m_patPtr;
                }
            }

// test low
            else
            {
                // fail
                if (v > m_low * 1.0e-3)
                {
                    m_fcm[m_failCnt] = c;
                    m_fvm[m_failCnt++] = m_patPtr;
                }
            }

// terminate the read
            m_channels[i].flush(t);
        }

// register for the next end of cycle
        if (m_patPtr++ < 100)
        {
            registerEvent(m_evtMgr.makeReadEvent(STROBE_CYCLE),
                          t + m_period * 1.0e-12);
        }
    }
```

Listing 3.22 Example of strobe module handleEvent implementation.

Besides saving results into fail vector memory, we can see that the new wrinkle in this routine is the introduction of reading methods in SimChannel. The read methods in SimChannel are summarized in Table 3.7:

Method                                                                 Description

| Method | Description |
| --- | --- |
| OASIS::Voltage read(const OASIS::Time& t) | Return the voltage from the channel at the specified time. The value is based upon the waveforms discussed in Section 3.3.4.4. |
| void flush(const OASIS::Time& t) | Indicate that the waveform data is available for clean up. This method is used to recover unneeded memory during a simulation. |
| OASIS::SimWaveformIter getWaveformIter(const OASIS::Voltage& vhi, const OASIS::Voltage& vlo, const OASIS::Time& start, const OASIS::Time& end) | Search for edges over a given time window. The voltages define levels for high and low. The returned object will iterate through all the edges and indicate the state of the waveform after the edge. |

Table 3.7 SimChannel methods for reading from a channel.

The read method is fairly self explanatory. It provides a way for a module to determine the voltage at a specific time. It is important to remember that reads must occur *before* the time argument for handleEvent.

The flush method is a way for the system to recover unused resources. It indicates to the framework that the module will no longer be reading data from a channel prior to the indicated time, so it is alright for the system to delete records for the voltage history on the channel prior to that time. To be a good member of the OASIS developer community it is strongly recommended to call flush after reading from a channel. This will keep the simulation from encountering out of memory errors.

The getWaveformIter method is for finding edges in a time window. The object returned from the routine iterates through all the edges found in a given time window. Edges are defined by the voltage parameters passed into the routine. The vhi and vlo arguments define voltage thresholds that indicate if a voltage is considered high, low, or tristate. Voltage greater than vhi are high, voltage lower than vlo are low, and all other levels are tristate. Edges occur when a voltage transitions from one state to another. When a voltage crosses from a low state or a tristate to high then that edge state is considered high, and the crossing time is the edge time. If a voltage crosses from high to tristate, or from low to tristate, then that edge is considered tristate and the crossing time is the edge time. If a voltage crosses from tristate to low or from high to low then that edge is considered low and the crossing time is the edge time. Table 3.8 contains a list of SimWaveformIter methods for accessing information from the iterator object.

| Method | Description |
| --- | --- |
| void start() | Return the iterator back to the first edge. When getWaveformIter is called, the iterator object returned is at the first edge. |
| bool end() | Test if the iterator is at the end of the edge |

| Method | Description |
|---|---|
| | sequence. The results from `getTime` or `getState` when end is `true` are undefined. |
| `void next()` | Move the iterator to the next edge. |
| `OASIS::Time getTime()` | Return the time of the current edge. If end returns `true` the result is undefined. |
| `OASIS::SimWaveformIter::State_t getState()` | Return the state of the current edge as defined above. The edge applies to the state of the underlying waveform *after* the edge time. |

Table 3.8 SimWaveformIter methods.

The return value from `getState` is an enumerated type with the following values:

| Constant | Definition |
|---|---|
| `OASIS::SimWaveformIter::H` | High edge. |
| `OASIS::SimWaveformIter::L` | Low edge. |
| `OASIS::SimWaveformIter::Z` | Tristate edge. |

Table 3.9 SimWaveformIter::State_t values.

As an example of how the SimWaveformIter object is used, here is some code that would print out the edge time and state for channel 0 of our strobing module for a time window [t0, t1].

```
for (OASIS::SimWaveformIter wf_iter
        = m_channel[0].getWaveformIter(h_high * 1.0e-3, m_low * 1.0e-3,
                                       t0, t1);
     !wf_iter.end(); wf_iter.next())
{
    std::cout << "t: " << wf_iter.getTime().getValue() << ", state: "
              << (wf_iter.getState() == OASIS::SimWaveformIter::H ? 'H'
                : wf_iter.getState() == OASIS::SimWaveformIter::L ? 'L'
                : 'Z') << std::endl;
}
```

Listing 3.23 Example of SimWaveformIter usage.

Finally for completeness, we define the asynchronous handleEvent methods as a no-op.

```
MyDriveModule::handleEvent(const OASIS::SimEvent& event)
{
}
```

Listing 3.24 Example of a do nothing handleEvent implementation for the strobe module.

3.4 Implementation of a DUT Model

DUT modeling uses the same approach as tester modules; however, the simulation of DUTs is not event driven. Hence, SimComponentStepped the base class for DUT models, supplies implementations for initEvents, handleEvent, and bus I/O methods. Instead the function run must be implemented to define the DUT model behavior during pattern execution. The run function specifies that the model must propagate its internal states over a given time window. Also, since DUT models do not interact with the tester bus, the read and write functions have no-op implementations in SimComponentStepped.

1. design DUT model structure and the strategy for supporting pattern execution;
2. write the DUT model constructor;
3. implement getChannel();
4. implement run();
5. implement end(); and
6. write a DLL interface that exports the module's factory and clean-up functions.

3.4.1 Simple DUT Model

As an example we will use a simple DUT model. The model will consist of 8 wires, where one end of the wire will always be driven by the tester and the other end will always output back to the tester. To simplify the model even more, we will require that the DUT occupy 16 contiguous channels on the load board. Figure 3.5 contains a diagram of the model.

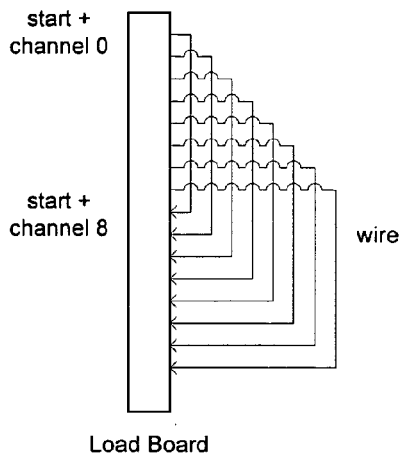

Figure 3.5 Simple DUT Model.

Each wire will apply a 1 *nsec* delay to the input. The input and output levels will be configurable.

3.4.2 Class Definition for DUT Model

Based on the model description we can create a class definition.

```
#include "SimComponentStepped.h"
#include "SimChannel.h"
#include "SimChanID.h"
include "OASISEngTypes.h" // for Time and Voltage class MyDUTModel : public OASIS::SimComponentStepped
{
public:

// constructor
    MyDUTModel(const SimChanID& start, const OASIS::Voltage& vih,
              const OASIS::Voltage& vil, const OASIS::Voltage& voh,
              const OASIS::Voltage& vol);

// get channels
    SimChannel* getChannel(const OASIS::SimChanID& chan_id);

// run method
    void run(const OASIS::Time& t0, const OASIS::Time& tf);

private:

// offset
    OASIS::SimChanID::Index_t m_start;

// channels
    OASIS::SimChannel m_inputs[8];
```

```
    OASIS::SimChannel m_outputs[8];

// levels
    OASIS::Voltage m_vih;
    OASIS::Voltage m_vil;
    OASIS::Voltage m_voh;
    OASIS::Voltage m_vol;
    OASIS::Voltage m_vz;
};
```

Listing 3.25 Class definition for the DUT model.

3.4.3 Constructor for the DUT Model

The DUT model constructor for our example is as follows:

```
MyDUTModel::MyDUTModel(const OASIS::SimChanID& start,
                      const OASIS::Voltage& vih,
                      const OASIS::Voltage& vil,
                      const OASIS::Voltage& voh,
                      const OASIS::Voltage& vol)
  : OASIS::SimComponentStepped(), m_start(start.getIndex()), m_imputs(),
    m_outputs(), m_vih(vih), m_vil(vil), m_voh(voh), m_vol(vol),
    m_vz((voh + vol) / 2)
{
}
```

Listing 3.26 Example of a constructor for a DUT model.

3.4.4 getChannel Implementation for the DUT Model

In our getChannel implementation we need to use the offset to return the proper channel object.

```
OASIS::SimChannel*
MyDUTModel::getChannel(const OASIS::SimChanID& chan_id)
{
    OASIS::SimChanID::Index_t local = chan_id.getIndex() - m_start;
    return local < 8 ? &m_inputs[local] : &m_outputs[local - 8];
}
```

Listing 3.27 Example of getChannel for a DUT model.

Once again for the sake of brevity and clarity, we don't bother to do any error trapping in our example.

3.4.5 run Method in DUT Model

The main part of DUT modeling is the implementation of the run method. The run method takes two arguments, a start time and an end time. These arguments indicate that the DUT model should advance its internal states from the start time to the end time based upon stimulus from the input pins and output any data resulting from these changes to the DUT state. Inputs should be received from the SimChannel objects as outlined in Section 3.3.5.5. Outputs are also sent to SimChannel objects. This is discussed in Section 3.3.4.4. In addition, outputs can occur after the end time; however, care must be taken when writing to the output channel. This is discussed in Section 3.4.5.2.

3.4.5.1 Implementation of the run Method for the DUT Model

Usually, the implementation of the run method can be broken down into 3 parts:

1. scanning the input pins for stimulus;
2. updating the internal states of the DUT; and
3. outputing data to the output channels.

This does not mean that the code should be separated into different structural units that handle each of these tasks. This only indicates that we will use this functional description to help us design an implementation of run.

Our implementation of the device is as follows:

```
void MyDUTModel::run(const OASIS::Time& t0, const OASIS::Time& tf)
{
    // loop through each wire
    for (unsigned i = 0; i < 8; i++)
    {
        // loop through all the edges from the input channel
        for (OASIS::SimWaveformIter wf_iter
                = m_inputs[i].getWaveformIter(m_vih, m_vil, t0, tf);
             !wf_iter.end(); wf_iter.next())
        {
            // write edges with 1 nsec delay
            switch (wf_iter.getState())
            {
            case OASIS::SimWaveformIter::H:
                m_outputs[i].set(wf_iter.getTime() + 1.0e-9, m_voh);
            case OASIS::SimWaveformIter::L:
                m_outputs[i].set(wf_iter.getTime() + 1.0e-9, m_vol);
            case OASIS::SimWaveformIter::Z:
                m_outputs[i].set(wf_iter.getTime() + 1.0e-9, m_vz);
            }
        }

// terminate write for each output channel
        m_outputs[i].end(tf);

// flush each input channel
        m_inputs[i].flush(tf);
    }
}
```

Listing 3.28 Example of run for a DUT model.

3.4.5.2 set and end Calls.

Note that even if an output edge were to fall outside the execution time window, we still write it to the output channel. Also note that we always use tf when calling end. This means that we can sometimes call set with a time greater than the time passed to end. This is perfectly legal, and in fact is required for the model to run correctly. Calling end indicates to the system that the object on the other side of the channel can safely read the channel up to the specified time because the signal will not change. The framework insures that this is true by blocking any writes to the channel for times earlier than the last end call. This can cause problems in subsequent run calls to the DUT model.

Figure 3.6 illustrates this. The sequence on the top represents a series of set calls where the last call is past the end of the time window. The next sequence shows where the end call is made at the first tf, effectively blocking writes to any portion in the first time window. In the next time window the old tf is now the new t0, and the DUT needs to place some edges before the edge set during the previous calls to run. Since end was called at the proper time, this is allowed.

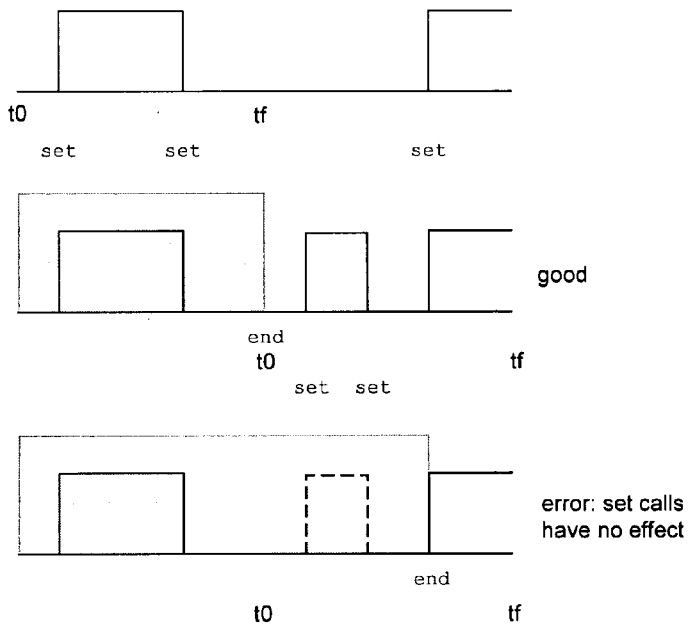

Figure 3.6 Calling set and end.

In the last sequence, we see what happens when end is called with the same time parameter as the last set call. Here the new edges cannot be inserted because they are blocked by the poorly placed end call. It is important to remember never to terminate a write outside of the run time window unless you are certain that it will not block any edges.

These same principals also hold true for edges delayed outside of a cycle boundary in a cycle based tester module.

3.5 OASIS Offline DLL Interface

The last step in creating a module for the OASIS Offline Framework is to build a DLL and export the functions that:

1. creates an instance of your model; and
2. that perform any clean up.

What the interface allows the developer to do is specify input parameters to the factory function. These parameters are loaded from the simulation configuration file.

The factory function should have the following prototype:

```
const OASIS::OFCStatus&
OAISimCreateComponent(OASIS::SimComponent*& sc,
                      const OASIS::SimChanID& start,
                      const OASIS::SimChanVectors& channels,
                      const OASIS::SimDLLParams& params);
```

Listing 3.29 Prototype for the OASIS DLL Interface Factory Function.

The SimChanVector and SimDLLParams are instances of STL templates. They are defined as follows:

```
typedef std::vector<OASIS::SimChanID> OASIS::SimChanVector;
typedef std::map<OASIS::OFCString, OASIS::OFCString> OASIS::SimDLLParams;
```

Listing 3.30 Special types for the OASIS Offline DLL Interface.

The return parameter is a status object. See the documentation on OFCStatus to see how to create and use this object. The sc parameter is an output parameter. It passes back the instantiated model object back to the framework. The start parameter indicates the first channel allocated to this module as defined by the simulation configuration file. The channels parameter is a list of all the channels that are used. Note that the first element in channels may not necessarily coincide with start. channels is a list of enabled channels, hence if the first channel is disabled it will not be in the channels list, but it will be the value for start. Finally, the params argument is a list of keyword/value pairs that the factory function should use to configure the object creation.

The clean up function has the following prototype:

```
void OAISimReleaseComponent(OASIS::SimComponent* sc);
```

Listing 3.31 Prototype for the OASIS DLL Interface Clean-up Function.

The developer should use this routine to release any resources that may need to be taken care of before the simulation ends.

3.5.1 DLL Interfac for the Digital Modules

One use of the parameters is to actually specify the type of object to generate. In this way a developer can package several models into one DLL. This is the approach we will take with out digital module example. Here is a listing for the code that exports both the drive and strobe digital modules:

```
#include "SimDLLInterface.h"
#include "MyDriveModule.h"
#include "MyStrobeModule.h"
#include "OFCException.h"

extern "C"
{

__declspec(dllexport) const OASIS::OFCStatus&
OAISimCreateComponent(OASIS::SimComponent*& sc,
                      const OASIS::SimChanID& start,
                      const OASIS::SimChanVector& channels,
                      const OASIS::SimDLLParams& params)
{
    // status object
    ROUTINE("OAISimCreateComponent");
    static OASIS::OFCStatus status;

// try block for exceptions
    try
    {
        // check if type is defined
        SimDLLParams::const_iterator p_iter = params.find("type");
        if (p_iter == param.end())
        {
            SET_ERROR(status, ERR_MAP_ENTRY_KEY_NOT_DEFINED);
            status.addParam("Key", "type");
            return status;
        }

// drive module
        if (p_iter->second == "drive")
        {
            sc = new MyDriveModule(start);
        }

// strobe module
        else if (p_iter->second == "strobe")
        {
            sc = new MyStrobeModule(start);
        }

// error
        else
        {
            SET_ERROR(status, ERR_INVALID_ARGUMENT_ERROR);
            status.addParam("Argument", p_iter->second);
            return status;
        }
    }

// catch block
```

```
        catch (OASIS::OFCException& e)
        {
            status = e.getStatus();
        }

// return status
        return status;
    }

}
```

Listing 3.32 Example for the Digital Module Factory Function.

There are several things to discuss here. First note that the user must become familiar with coding DLLs for the Microsoft Windows O/S, in particular the special preprocessor macros for exporting functions.

Next, looking inside the factory function, note that `OFCStatus` is declared `static`. This is required since a reference to it is passed out as the return argument. Because the variable must persist after we return to the calling routine we cannot declare this variable on the temporary stack.

Moving on you can see that we have broken with our tradition of not trapping errors. This is not brought on by a sudden wave of guilt to write better code, but rather to demonstrate how `OFCStatus` is used. When an error is trapped, the `SET_ERROR` macro is called to set the error in the status object. Error codes are defined in `OASISErrorCodes.h`. These codes are tied to parameterized error messages. The values for the parameters are set using the `OFCStatus` member function `addParam`. For more information regarding the use of `OFCStatus` the user should read the online documentation.

The last point made here is the usage of the parameter to specify what type of module to create. If the use of `SimDLLParams` is looks unfamiliar, then refer to the myriad books on STL (Standard Templates Library).

Assuming that the digital module would be compiled and linked into a module called `MyDigitalModule.dll`, entries in the configuration file that would set the parameters for the drive and strobe module would be:

```
    slot 1
    {
        DLL "MyDigitalModule.dll"
        params
        {
            type drive;
        }
        step
        {
            maxAvailable 8;
        }
    }
    slot 2
    {
        DLL "MyDigitalModule.dll";
        params
        {
            type strobe;
```

```
    }
    step
    {
        maxAvailable 8;
    }
}
```

Listing 3.33 Configuration Settings for Digital Module.

The code for the clean up routine is relatively trivial: Here we simply clean up the dynamic memory allocated in the factory function.

```
extern "C"
{

__declspec(dllexport) void
OAISimReleaseComponent(OASIS::SimComponent* sc)
{
    delete sc;
}

}
```

Listing 3.34 Example of Digital Module Clean-up Function.

3.5.2 DLL Interface for the DUT Model

The DLL interface for the DUT model is similar to the tester module. The code for DUT DLL interface is as follows:

```
#include "SimDLLInterface.h"
#include "MyDUTModel.h"
#include "OFCException.h"
include <cstdlib> static OASIS::Voltage getVoltage(const OASIS::OFCString& key,
                                 const OASIS::SimDLLParams& params)

extern "C"
{

__declspec(dllexport) const OASIS::OFCStatus&
OAISimCreateComponent(OASIS::SimComponent*& sc,
                      const OASIS::SimChanID& start,
                      const OASIS::SimChanVector& channels,
                      const OASIS::SimDLLParams& params)
{
    // status object
    ROUTINE("OAISimCreateComponent");
    static OASIS::OFCStatus status;

// try block to for exceptions
    try
    {
```

```
        // create a new DUT
        sc = new MyDUTModel(start, getVoltage("vih", params),
                            getVoltage("vil", params),
                            getVoltage("voh", params),
                            getVoltage("vol", params));
    }

// catch block
    catch (OASIS::OFCException& e)
    {
        status = e.getStatus();
    }

// return status
    return status;
}

} static OASIS::Voltage getVoltage(const OASIS::OFCString& key,
                                 const OASIS::SimDLLParams& params)
{
    // check if type is defined
    SimDLLParams::const_iterator p_iter = params.find(key);
    if (p_iter == params.end())
    {
        ROUTINE("getVoltage");
        OASIS::OFCStatus status;
        SET_ERROR(status, ERR_MAP_ENTRY_KEY_NOT_DEFINED);
        status.addParam("Key", "type");
        throw OASIS::OFCException(status);
    }
    return OASIS::Voltage(atof(p_iter->second.c_str()));
}
```

Listing 3.35 Example for the DUT Model Factory Function

Assuming the above code is compiled into a DLL called MyDUTModel.dll, then the configuration settings for the DUT could look something like the following:

```
DUT 1
{
    DLL "MyDUTModel.dll";
    params
    {
        vih "2.0";
        vil "0.4";
        voh "2.0";
        vol "0.4";
    }
    step
    {
        maxAvailable 16;
    }
}
```

Listing 3.36 Configuration Settings for DUT Model.

Once again the release code is relatively trivial (and actually identical to the digital module code):

```
extern "C"
{

__declspec(dllexport) void
OAISimReleaseComponent(OASIS::SimComponent* sc)
{
    delete sc;
}

}
```

Listing 3.37 Example of DUT Model Clean-up Function.

OPENSTAR Bus Access Library

Version 0.1

OPENSTAR Bus Access Library, Version 0.1 Last modified 03/03/27 19:39

© Copyright 2003 Advantest Corporation

All rights reserved. All text and figures included in this publication are the exclusive property of Advantest Corporation. Reproduction of this publication in any manner without the written permission of Advantest Corporation is prohibited. Information in this document is subject to change without notice.

This document contains trademarks and trade names that are used to refer to either the entities claiming the marks and names, or their products. Advantest disclaims any proprietary interest in trademarks or trade names other than its own.

Advantest America Corporation. (AAC)
3201 Scott Boulevard
Santa Clara, CA 95054 USA

Table of Contents

| | |
|---|---|
| OPENSTAR BUS ACCESS LIBRARY | 101 |
| 1 APPLICATION | 106 |
| 2 GENERAL FUNCTIONS FOR CONTROLLING THE TESTER MODULE | 109 |
|    2.1 Bus Access Using Program IO | 109 |
|       2.1.1 Write Using Program IO | 110 |
|       2.1.2 Read Using Program IO | 111 |
|       2.1.3 Block Write Using Program IO | 112 |
|       2.1.4 Block Read Using Program IO | 113 |
|       2.1.5 Continuous Block Write Using Program IO | 114 |
|       2.1.6 Continuous Block Read Using Program IO | 115 |
|    2.2 Bus Access Using DMA Function | 116 |
|       2.2.1 Synchronous Write Using DMA Function | 118 |
|       2.2.2 Synchronous Read Using DMA Function | 119 |
|       2.2.3 Asynchronous Write Using DMA Function | 120 |
|       2.2.4 Asynchronous Read Using DMA Function | 121 |
|       2.2.5 Waiting for Completion of Asynchronous DMA Transfer | 123 |
|       2.2.6 Status of Asynchronous DMA Transfer | 123 |
|    2.3 Interrupt Handling | 124 |
|       2.3.1 Registration of Interrupt Handler | 126 |
|       2.3.2 Registration of Bus Error Interrupt Handler | 127 |
|       2.3.3 Registration of Bus Timeout Interrupt Handler | 128 |
|       2.3.4 Registration of Sync Error Interrupt Handler | 129 |
|    2.4 Control of Library/OPENSTAR Bus | 130 |
|       2.4.1 FIFO Flush Wait | 130 |
|       2.4.2 Resetting Module | 131 |
|       2.4.3 Bus Initialization | 132 |
|       2.4.4 Bus Release | 133 |
| 3 FUNCTIONS SPECIFICALLY FOR CONFIGURATION/DIAGNOSTICS | 134 |
|    3.1 Configuration Control (Special Function) | 134 |
|       3.1.1 Bus Configuration Write | 134 |
|       3.1.2 Bus Configuration Read | 135 |
|    3.2 Interrupt control (Special function) | 135 |
|       3.2.1 Bus I/F Board Interrupt Enable | 136 |
|       3.2.2 Bus I/F Board Interrupt Disable | 136 |
|       3.2.3 Bus I/F Board Interrupt Read | 137 |

3.2.4 Bus I/F Board Interrupt Clear .................................................................................. 138
3.2.5 Setting Number of Modules to Be Synchronized .................................................. 139

| Revision | Date | Revised By | Description |
|---|---|---|---|
| 0.1 | February 10, 2003 | Kiyoshi Fukushima | *Initial Creation* |

1 APPLICATION

These specifications are functional specifications for the library to access the OPENSTAR Bus and the offline Bus Emulator. Unless otherwise specifically noted, the offline OPENSTAR Bus access library has functions equivalent to those of the online one.

The OPENSTAR Bus is a bus that is connected from the Site CPU to the Tester Module through the Bus Switch and in which the data for controlling the Tester Module flows.

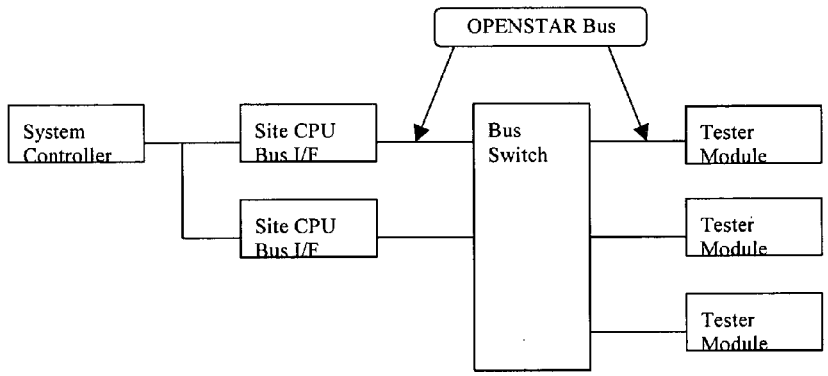

The OPENSTAR Bus access library functions on the Site CPU and provides basic functions to control OPENSTAR Bus. The positioning in the software is as shown in the following diagram.

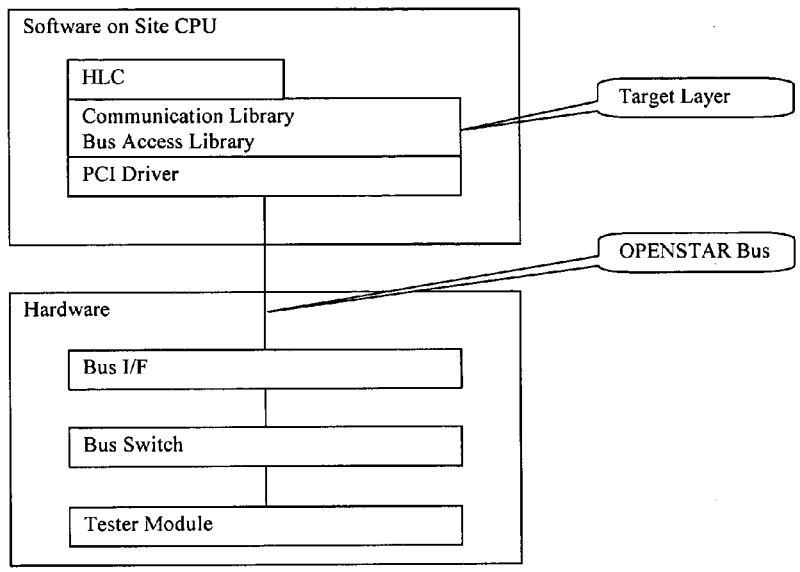

<Offline>

The offline OPENSTAR Bus access library provides basic functions to control the OPENSTAR Bus Emulator. The OPENSTAR Bus Emulator operates as a tester emulator process and is positioned on the front end. The OPENSTAR Bus access library conducts interprocess communication with the OPENSTAR Bus Emulator.

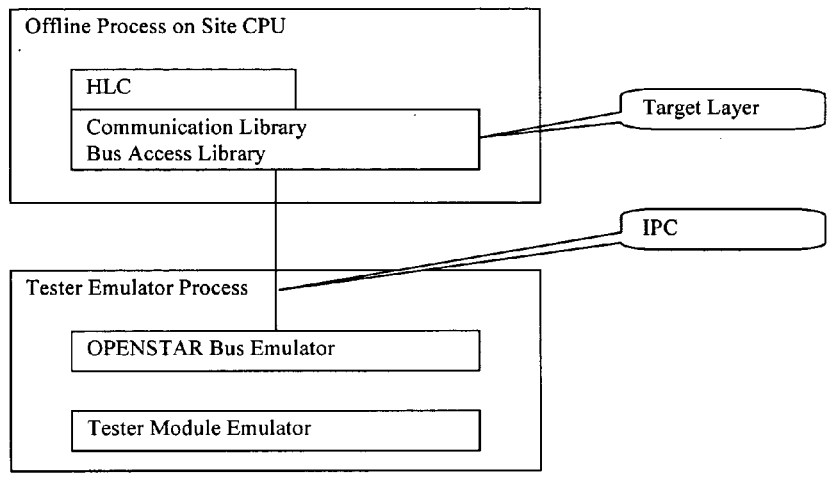

2 General Functions for Controlling the Tester Module

This chapter describes general functions used in the module driver. In the module driver, this library is used to access registers and memories in the tester module and read and write the data necessary for device measurement. The main functions described in this chapter are as follows:

1. Bus access using program IO

2. Bus access using the DMA function

3. Interrupt handling

4. Control of library/OPENSTAR Bus

2.1 Bus Access Using Program IO

There are two types of accesses to the OPENSTAR Bus, one in which MW (Machine Word) is directly written on the register of the Tester Module connected to the bus and the other in which the HLC (High Level Command) is transferred to the Tester Module. In both cases, Address and Data flow on the OPENSTAR Bus. If recognized as HLC by the Address on the Tester Module side, the processing corresponding to the HLC is performed on the Tester Module side. For writing data from the Site CPU to the Tester Module, the same data is sent to each Tester Module connected to the Site CPU and each Tester Module acquires the corresponding data.

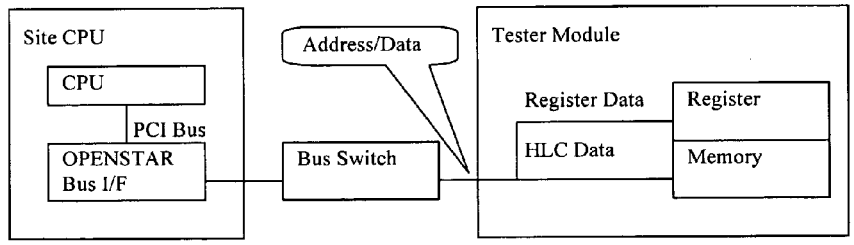

FIFO is placed in the OPENSTAR Bus and Tester Module and, therefore, if any data is transferred from the Site CPU to the Tester Module, the write action of the CPU is stopped without waiting for the completion of the write action of the Tester Module. The time until the data is actually stored in the register is influenced by the availability of FIFO existing between the CPU and the register of the target. For making sure that the data has definitely reached all Tester Modules, use the flush waiting function of the FIFO. With flush waiting of FIFO using the read of the register in the Tester Module, it can be confirmed that only the FIFO of the Tester Module to be read has been flushed.

In the example shown in the following diagram, if read of the register is executed against the Tester Module 2, the read action is made to wait until the FIFO of the Tester Module 2 is flushed, but there is no guarantee that the FIFO of the Tester Module 1 has been flushed. If this guarantee is desired, make sure, using the flush waiting function of the FIFO in the Tester Module, that the FIFO of each Tester Module has been flushed and execute reading.

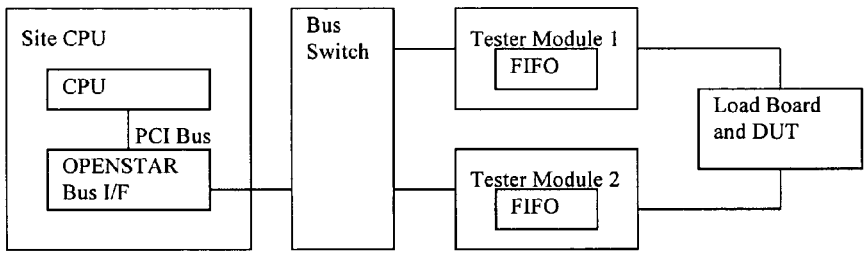

<Offline>

No FIFO is placed in the offline OPENSTAR Bus Emulator. Therefore, if PIO write is executed against a Tester Module Emulator that does not have FIFO, it returns from the function after storing data to the register of the Tester Module Emulator.

However, taking into consideration the case of online and coexistence with Modules with other FIFO, use the flush waiting function of the FIFO wherever synchronization is required.

If any data is written in the Tester Module Emulator having FIFO the same as in online, the write process is immediately ended after storing data in the FIFO of the Tester Module Emulator.

2.1.1 Write Using Program IO

Write the data to the register in the Tester Module. The Site CPU terminates write operation before the written data reaches the Tester Module.

[Name]

BCL_GBI_write

[Syntax]

int BCL_GBI_write(unsigned int address, unsigned int data);

[Argument]

address                  Machine word address data                     Data to be written

[Return value]

BCL_GBI_OK         Normal termination

BCL_GBI_ERROR     Error

[Reference]

BCL_GBI_init, BCL_GBI_finish, BCL_GBI.h

[Others]

Posted write action

2.1.2 Read Using Program IO

Read the data in the register of the Tester Module. The Site CPU waits until the data is read. Read of the target register is made to wait until the data in the FIFO between the CPU and the target register is flushed.

[Name]

BCL_GBI_read

[Syntax]

int BCL_GBI_read(unsigned int address, unsigned int *data);

[Argument]

address                  Machine word address data                     Pointer to the variable to read the data

[Return value]

BCL_GBI_OK         Normal termination

BCL_GBI_ERROR     Error

[Reference]

BCL_GBI_init, BCL_GBI_finish, BCL_GBI.h

[Others]

Non-posted read action

2.1.3 Block Write Using Program IO

Write the blocks of data to the register in the Tester Module. Specify the data format using the address and the data as a pair. The OPENSTAR Bus executes the write cycles for the specified number of times.

When writing data in multiple addresses, it can be executed with higher speed than writing with the BCL_GBI_write() function every time. This is because the calling of the function is needed only once and multiple exclusions are not executed.

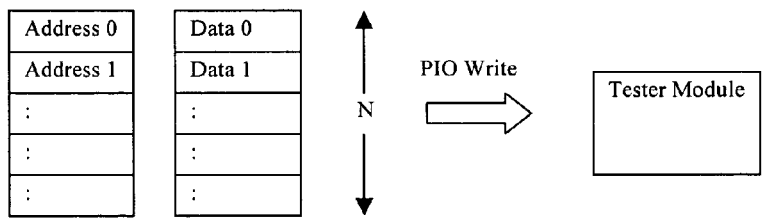

[Name]

BCL_GBI_writeBlock

[Syntax]

int BCL_GBI_writeBlock(unsigned int *address, unsigned int *data, unsigned int number);

[Argument]

| | |
|---|---|
| address | Pointer to the array in which the address is stored |
| data | Pointer to the array in which the data is stored |
| number | The number of data to be written |

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

[Others]

Posted write action

2.1.4 Block Read Using Program IO

Read the data in the register of the Tester Module as blocks. The address of the register can be specified with discontinuous values. The OPENSTAR Bus executes the read cycles for the specified number of times.

When reading data in multiple addresses, it can be executed with higher speed than reading with the BCL_GBI_read() function every time. This is because the calling of the function is needed only once and multiple exclusions are not executed.

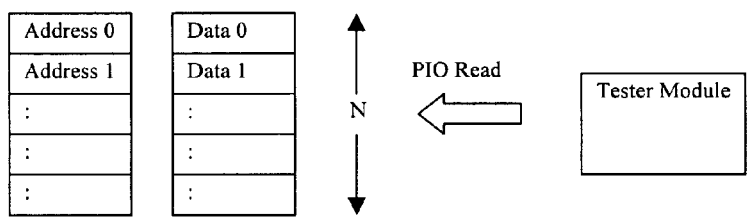

[Name]

BCL_GBI_readBlock

[Syntax]

int BCL_GBI_readBlock(unsigned int *address, unsigned int *data, unsigned int number);

[Argument]

address　　Pointer to the array in which the address is stored data　　Pointer to the array to read the data number　　The number of data to be read

[Return value]

BCL_GBI_OK　　　　Normal termination

BCL_GBI_ERROR          Error

[Reference]

BCL_GBI_init, BCL_GBI_finish, BCL_GBI.h

[Others]

Non-posted read action

2.1.5 Continuous Block Write Using Program IO

The data array is written to the register placed in the evenly spaced addresses of the Tester Module. The data array is written from the specified starting address and the offset value is added to the address every time the data is written. The offset value can be specified as a value between 0 and 0x3fffff. The OPENSTAR Bus executes the write cycles for the specified number of times. The cycle is executed for the specified number of turns.

When writing data to multiple fixed offset addresses, it can be executed with higher speed than that of the writing using the BCL_GBI_writeBlock(). This is because of the fact that the adding of addresses is conducted by hardware and, therefore, the number of packets flowing on the PCI bus becomes smaller.

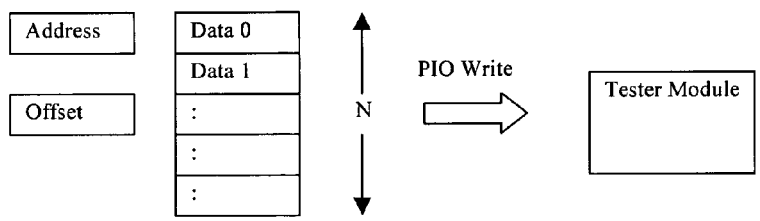

[Name]

BCL_GBI_writeSeq

[Syntax]

int BCL_GBI_writeSeq(unsigned int address, unsigned int *data, unsigned int number,
            unsigned int offset);

[Argument]

| | |
|---|---|
| address | Machine word address |
| data | Pointer to the array in which the data is stored |
| number | The number of data to be written |
| offset | The offset value to be added to the address for each data transfer. |

Specifiable up to 0 to 0x3fffff

If any value exceeding 26 bits is specified, the value equivalent to the 26 bits in the lower positions is set.

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

[Other]

Posted write action

2.1.6 Continuous Block Read Using Program IO

The data array is read from the register placed in the evenly spaced addresses of the Tester Module. The data array is read from the specified starting address and the offset value is added to the address every time the data is read. The offset value can be specified as a value between 0 and 0x3fffff. The OPENSTAR Bus executes the read cycle the specified number of times.

When reading data from multiple fixed offset addresses, it can be executed with higher speed than reading with the BCL_GBI_readBlock() function every time. This is because of the fact that the adding of addresses is conducted by hardware and, therefore, the number of packets flowing on the PCI bus becomes smaller.

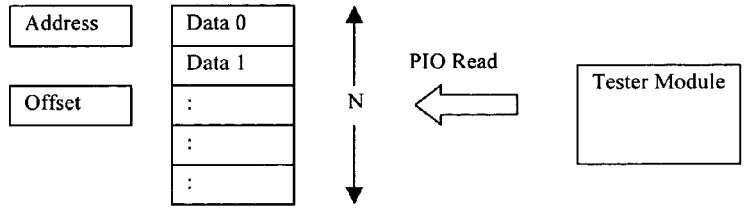

[Name]

BCL_GBI_readSeq

[Syntax]

int BCL_GBI_readSeq(unsigned int address, unsigned int *data, unsigned int number, unsigned int offset);

[Argument]

| | |
|---|---|
| address | Machine word address |
| data | Pointer to the array to read the data |
| number | The number of data to be read |
| offset | The offset value to be added to the address for each data transfer. |
| | Specifiable up to 0 to 0x3fffff |
| | If any value exceeding 26 bits is specified, the value equivalent to the 26 bits in the lower positions is set. |

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

[Other]

Non-posted read action

2.2 Bus Access Using DMA Function

The following eight types of functions are available for data transfer using DMA.

| No. | functions |
|---|---|
| 1 | Synchronous DMA write with burst/single |
| 2 | Synchronous DMA read with burst/single |
| 3 | Asynchronous DMA write with burst/single |

| 4 | Asynchronous DMA read with burst/single |

1. Synchronous/asynchronous DMA

In the case of synchronous DMA, the function waits for termination of the DMA and then terminates. Although the function terminates only after the termination of the DMA, the transferred data may remain in the FIFO in the OPENSTAR Bus I/F or Tester Module in certain cases.

In the case of asynchronous DMA, the function terminates without waiting for the DMA termination. Therefore, it is required that the lifecycle of the data area be guaranteed by the user. Furthermore, if any function using the DMA is executed before the transfer of the asynchronous DMA has been completed, the function is forced to wait until the previous DMA transfer is completed.

The transfer ID is prepared as the identification information to wait for the completion of asynchronous DMA processing. This transfer ID is 32-bit data without a code and, if the number of DMA transfers exceeds 32 bits, it returns to 0 and is reused.

2. Burst/Single DMA

In burst DMA transfer, data is transferred with packets specific to burst on the OPENSTAR Bus. In this transfer, one address and N (64 at the maximum) data are taken as a packet and the transfer of packets is repeated until the transfer of the specified number of data is completed. Therefore, high-speed transfer is possible.

In addition, in carrying out DMA transfer, the increasing value for the address on the Tester Module side can be specified. This increasing value is used to calculate the top address of the packet for transfer of the packet after the second group.

(Address of the packet) = (Specified increasing value)
　　　　　　　　　　　　(Number of data in the preceding packet)
　　　　　　　　　　　+ (Top address of the preceding packet)

In addition, because the register with which burst transfer is possible depends on the Tester Module, it is necessary to check if the register is a usable one.

| address | data0 | data1 | data2 | | | data63 |

In single DMA transfer, the address and data are transferred as a set on the OPENSTAR Bus, the same as in program IO. Therefore, the transfer speed is lower than that for burst DMA, but transfer to any register is possible. When conducting DMA transfer, the increasing value for the address on the OPENSTAR Bus side can be specified. This increasing value is added to the address every time an address is generated.

| address0 | data0 | address1 | data1 | address2 | data2 | |

<Offline>

In the case of offline, even if burst transfer is specified, it is treated internally as a single transfer. Therefore, transfer to any register that does not support burst transfer is possible. Taking online use into consideration, however, avoid any use for registers in which burst transfer is not supported by hardware. In addition, offline synchronous and asynchronous DMAs are the same as those online.

2.2.1 Synchronous Write Using DMA Function

Transfers data placed in the memory of the Site CPU to the Tester Module using DMA. This function can specify burst or single for synchronous write.

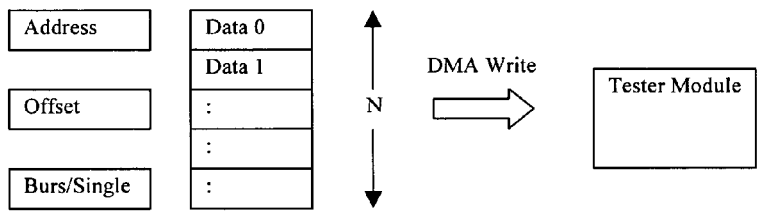

[Name]

BCL_GBI_writeSyncDMA

[Syntax]

int BCL_GBI_writeSyncDMA(unsigned int address, unsigned int *data, unsigned int number, unsigned int offset, unsigned int mode);

[Argument]

| | |
|---|---|
| address | Machine word address |
| data | Pointer to the array in which the data is stored |
| number | The number of data to be written |
| | Specifiable up to 1 to 0x400000(4MW) |
| offset | The offset value to be added to the address for each data transfer |
| | Specifiable up to 0 to 0x3fffff |

If any value exceeding 26 bits is specified, the value equivalent to the lowest 26 bits is set.

mode     Burst or single operation mode

BCL_GBI_DMA_BURST

BCL_GBI_DMA_SINGLE

[Return value]

BCL_GBI_OK     Normal termination

BCL_GBI_ERROR     Error

[Reference]

BCL_GBI_init, BCL_GBI_finish, BCL_GBI.h

2.2.2 Synchronous Read Using DMA Function

Data using the DMA from the register in the Tester Module is read to the memory of the Site CPU. This function can specify burst or single for synchronous read.

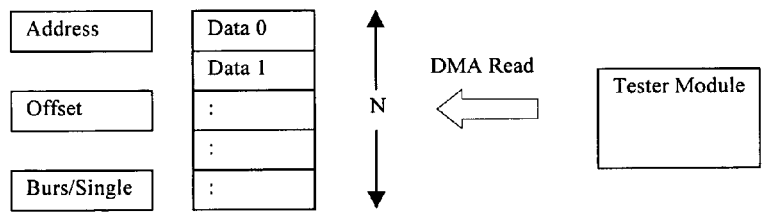

[Name]

BCL_GBI_readSyncDMA

[Syntax]

int BCL_GBI_readSyncDMA(unsigned int address, unsigned int *data, unsigned int number, unsigned int offset, unsigned int mode);

[Argument]

address     Machine word address

| | |
|---|---|
| data | Pointer to the array to read the data |
| number | The number of data to be read |
| | Specifiable up to 1 to 0x400000(4MW) |
| offset | The offset value to be added to the address for each data transfer |
| | Specifiable up to 0 to 0x3ffffff |
| | If any value exceeding 26 bits is specified, the value equivalent to the lowest 26 bits is set. |
| mode | Burst or single operation mode |
| | BCL_GBI_DMA_BURST |
| | BCL_GBI_DMA_SINGLE |

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

2.2.3 Asynchronous Write Using DMA Function

The data placed in the memory of the Site CPU is transferred to the Tester Module using DMA. This function can specify burst or single for asynchronous write.

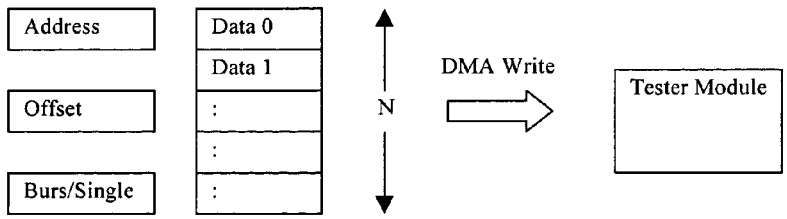

[Name]

BCL_GBI_writeAsyncDMA

[Syntax]

int BCL_GBI_writeSyncDMA(unsigned int address, unsigned int *data, unsigned int number, unsigned int offset, unsigned int mode,unsigned int *transferID);

[Argument]

| | |
|---|---|
| address | Machine word address |
| data | Pointer to the array in which the data is stored |
| number | The number of data to be written |
| | Specifiable up to 1 to 0x400000(4MW) |
| offset | The offset value to be added to the address for each data transfer |
| | Specifiable up to 0 to 0x3fffff |
| | If any value exceeding 26 bits is specified, the value equivalent to the lowest 26 bits is set. |
| mode | Burst or single operation mode |
| | BCL_GBI_DMA_BURST |
| | BCL_GBI_DMA_SINGLE |
| transferID | Pointer for ID for waiting for completion of transfer |

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

2.2.4 Asynchronous Read Using DMA Function

Data using the DMA from the register in the Tester Module is read to the memory of the Site CPU.
This function can specify burst or single for asynchronous read.

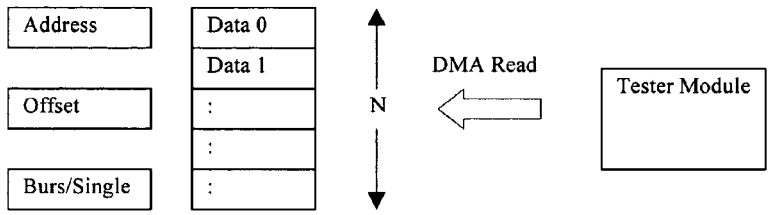

[Name]

BCL_GBI_readAsyncDMA

[Syntax]

int BCL_GBI_readAsyncDMA(unsigned int address, unsigned int *data, unsigned int number, unsigned int offset, unsigned int mode, unsigned int *transferID);

[Argument]

| | |
|---|---|
| address | Machine word address |
| data | Pointer to the array to read the data |
| number | The number of data to be read |
| | Specifiable up to 1 to 0x400000(4MW) |
| offset | The offset value to be added to the address for each data transfer |
| | Specifiable up to 0 to 0x3fffff |
| | If any value exceeding 26 bits is specified, the value equivalent to the lowest 26 bits is set. |
| mode | Burst or single operation mode |
| | BCL_GBI_DMA_BURST |
| | BCL_GBI_DMA_SINGLE |
| transferID | Pointer for ID for waiting for completion of transfer |

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

2.2.5 Waiting for Completion of Asynchronous DMA Transfer

Waits for the completion of transfer in asynchronous transfer using the DMA. This function terminates when the DMA is completed or the specified time has elapsed. Because the resolution uses 1 ms 32-bit signed timer, the range for time specification is 0 - (INT_MAX/1000). If any specification is made outside this range, it is treated the same as when BCL_GBI_INFINITE is specified.

In transferID is specified with a wrong value, BCL_GBI_OK is returned immediately and this function is terminated.

[Name]

BCL_GBI_waitDMA

[Syntax]

int BCL_GBI_waitDMA(unsigined int transferID, double timeOut);

[Argument]

| | |
|---|---|
| transferID transfer | ID waiting for completion of transfer returned in asynchronous mode |
| timeOut | Waiting time |
| | >= 0 : timeout period [s] |
| | BCL_GBI_INFINITE : waits until the DMA terminates. |

[Return value]

| | |
|---|---|
| BCL_GBI_OK | DMA terminates normally. |
| BCL_GBI_TIMEOUT | Timeout |
| BCL_GBI_ERROR | The DMA terminates abnormally. |

[Reference]

BCL_GBI_init, BCL_GBI_finish, BCL_GBI.h

2.2.6 Status of Asynchronous DMA Transfer

Gives notice of the current status of asynchronous DMA transfer. If a wrong transferID is specified, gives notice of the same status as the termination of the DMA.

[Name]

BCL_GBI_getConditionDMA

[Syntax]

int BCL_GBI_getConditionDMA(unsigned int transferID);

[Argument]

transferID    ID waiting for completion of transfer returned in asynchronous mode transfer

[Return value]

BCL_GBI_BUSY    DMA being executed

BCL_GBI_OK    DMA terminates normally.

BCL_GBI_ERROR    DMA terminates abnormally.

[Reference]

BCL_GBI_init, BCL_GBI_finish, BCL_GBI.h

2.3 Interrupt Handling

In the OPENSTAR Bus access library, functions for carrying out basic interrupt operation are provided. There are four types of interrupts operable using the OPENSTAR Bus access library.

1. Bus error interrupt (only for online)

Up to 65 interrupt handlers can be registered.

2. Bus timeout interrupt

Up to 65 interrupt handlers can be registered.

3. Sync error interrupt (only for online)

Up to 65 interrupt handlers can be registered.

4. Interrupt generated from the Tester Module

Up to 2 interrupt handlers can be registered with each bus number.

It is executed with interrupt thread together with above-mentioned interrupt.

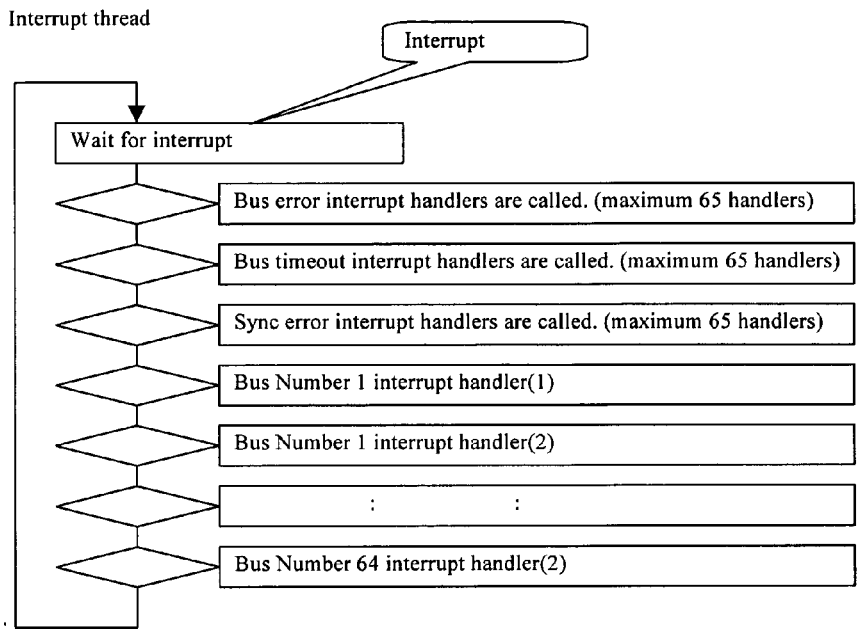

Bus error, Bus timeout or Sync error interrupt generated by the OPENSTAR Bus I/F disables the interrupt inside the interrupt thread and then executes the interrupt handlers of the registered target in turns. After execution of the target interrupt handlers is completed, the interrupt thread clears the factor of the interrupt and enables the interrupt internally.

For acceptance of interrupt, control of enable/disable can be controlled by the function of this library separately from enable/disable inside the interrupt thread. For the interrupt generated in the Tester Module, the interrupt thread disables the interrupt internally and executes the lock of the interrupt for the Tester Module. Then, interrupt handlers corresponding to the bus number causing the interrupt are executed by turns. After completing the execution of the target interrupt handlers, the interrupt thread clears the factor of the interrupt for the Tester Module. Then the lock of the interrupt is released and the interrupt is enabled internally.

For acceptance of interrupt, control of enable/disable can be controlled by the function of this library separately from enable/disable inside the interrupt thread. Inhibition/permission for interrupt can be controlled both on the OPENSTAR Bus board and the Tester Module.

Inhibition/permission on the OPENSTAR Bus I/F side simply enables/disables the interrupt from the Tester Module. Lock/unlock of interrupt on the Tester Module side controls generation of interrupt on the source of interrupt on the Tester Module side. During lock, generation of new interrupt in the Tester Module is inhibited and change in the status related to interrupt is also inhibited. After unlock, generation of interrupt on the Tester Module side becomes possible.

2.3.1 R gistration of Int rrupt Handl r

The interrupt handler function at the time of occurrence of the interrupt from the Tester Module is registered. When an interrupt has occurred, the registered function is executed with the exclusive thread for the interrupt handler. The interrupt handler is registered together with the bus number, and the interrupt handler that has the same registered bus number as that of the Tester Module that reported the interrupt is activated.

In addition, the value set at the time of registration is returned to the interrupt handler. Two interrupt handlers can be registered at the same time for each bus number. Bus numbers can be specified from 1 to 64. If successfully registered, the key number is returned as the return value. If registration is carried out using this key number, the re-registration and deletion of the interrupt handler with this key number becomes possible. If any registration is carried out by specifying 0 as the key number, the interrupt handler will be set to a vacant key number. If there is no vacant key number, an error occurs and (-1) will be returned as the return value. With respect to execution of interrupt handlers in the case in which two interrupt handlers have been registered, the execution is carried out from the younger key number.

Deletion of the interrupt handler is registered by setting the address of the callback function to BCL_GBI_IGNORE_MODULE_HANDLER.The interrupt thread does not execute the interrupt handler of BCL_GBI_IGNORE_MODULE_HANDLER.If both of two interrupt handlers for each bus number become BCL_GBI_IGNORE_MODULE_HANDLER, interrupt handlers of that bus number return to the default. (The standard interrupt handler in the access library will be set.)

[Name]

BCL_GBI_addInterruptHandler

[Syntax]

int BCL_GBI_addInterruptHandler(unsigned int BusNo, int KeyNo,

BCL_GBI_MODULE_HANDLER handler, unsigned int arg);

[call back function]

void InterruptRoutine(unsigned int BusNo, unsigned int Factor, unsigned int arg);

[Argument]

| | |
|---|---|
| BusNo | Bus number |
| KeyNo | Key number |
| handler | Call back function address |
| arg | Value to be given to interrupt handler |
| Factor | interrupt factor (dependent on each module) |

[Return value]

.

Key number to which interrupt handler is registered

If it is (-1), registration failed (invalid bus number or key number).

[Reference]

BCL_GBI_init, BCL_GBI_finish, BCL_GBI.h

2.3.2 Registration of Bus Error Interrupt Handler

The error processing function for the case in which error occurred in the OPENSTAR Bus is registered. If any error occurs in the OPENSTAR Bus, the interrupt thread executes the registered function. In addition, if any error occurs in the OPENSTAR Bus, the interrupt is cleared by the interrupt thread. It is not necessary to clear inside the interrupt handler.

Up to 65 interrupt handlers for Bus error can be registered. If successfully registered, the key number is returned as the return value. If registration is carried out using this key number, the re-registration and deletion of the interrupt handler with this key number becomes possible. If any registration is carried out by specifying 0 as the key number, the interrupt handler will be set to a vacant key number. If there is no vacant key number, an error occurs and (-1) will be returned as the return value. Deletion of the interrupt handler is registered by setting the address of the callback function to BCL_GBI_IGNORE_BUSERROR_HANDLER.

The interrupt thread does not execute the interrupt handler of BCL_GBI_IGNORE_BUSERROR_HANDLER. If all 65 interrupt handlers become BCL_GBI_IGNORE_BUSERROR_HANDLER, they return to the default. (The standard interrupt handler in the access library will be set.) Bus error may occur due to an error in communication of the OPENSTAR Bus or failed hardware.

<Offline>

Because there is no factor to cause any error in the Bus offline, the handler registered with this function does not function.

[Name]

BCL_GBI_addBusErrorInterruptHandler

[Syntax]

int BCL_GBI_addBusErrorInterruptHandler(int KeyNo,

BCL_GBI_MODULE_HANDLER handler, unsigned int arg);

[call back function]

void BusErrorInterruptRoutine(unsigned int arg);

[Argument]

| | |
|---|---|
| KeyNo | Key number |
| handler | Call back function address |
| arg | Value to be given to interrupt handler |

[Return value]

Key number to which interrupt handler is registered

If it is (-1), registration failed (invalid bus number or key number).

[Reference]

BCL_GBI_init, BCL_GBI_finish, BCL_GBI.h

2.3.3 Registration of Bus Timeout Interrupt Handler

The error processing function for the case in which timeout occurs in the OPENSTAR Bus is registered. If any timeout occurs in the OPENSTAR Bus, the interrupt thread executes the registered function. In addition, if any timeout occurs in the OPENSTAR Bus, the interrupt is cleared by the interrupt thread.

It is not necessary to clear inside the interrupt handler. Up to 65 interrupt handlers for Bus timeout can be registered. If successfully registered, the key number is returned as the return value. If registration is carried out using this key number, the re-registration and deletion of the interrupt handler with this key number becomes possible. If any registration is carried out by specifying 0 as the key number, the interrupt handler will be set to a vacant key number. If there is no vacant key number, an error occurs and (-1) will be returned as the return value. Deletion of the interrupt handler is registered by setting the address of the callback function to BCL_GBI_IGNORE_TIMEOUT_HANDLER.

The interrupt thread does not execute the interrupt handler of BCL_GBI_IGNORE_TIMEOUT_HANDLER. If all 65 interrupt handlers become BCL_GBI_IGNORE_TIMEOUT_HANDLER, they return to the default. (The standard interrupt handler in the access library will be set.) Bus timeout occurs at the time of read in the condition in which a cable is disconnected or the receiver does not exist. Failed hardware can also be the cause.

[Name]

BCL_GBI_addTimeoutInterruptHandler

[Syntax]

int BCL_GBI_addTimeoutInterruptHandler(int KeyNo,

BCL_GBI_TIMEOUT_HANDLER handler, unsigned int arg);

[call back function]

void TimeoutInterruptRoutine(unsigned int address, unsigned int Factor, unsigned int arg);

[Argument]

| | |
|---|---|
| KeyNo | Key number |
| handler | Call back function address |
| address | Machine work address when a timeout has occurred |
| Factor | Factor that caused the timeout |
| |     BCL_GBI_FACTOR_MODULE   Tester Module |
| |     BCL_GBI_FACTOR_CONFIG    Configuration |
| arg | Value to be given to interrupt handler |

[Return value]

Key number to which interrupt handler is registered

If it is (-1), registration failed (invalid bus number or key number).

[Reference]

BCL_GBI_init, BCL_GBI_finish, BCL_GBI.h

2.3.4 Registration of Sync Error Interrupt Handler

The error processing function for the case in which Sync error occurred in the OPENSTAR Bus is registered. If any Sync error occurs in the OPENSTAR Bus, the interrupt thread executes the registered function. In addition, if any Sync error occurs in the OPENSTAR Bus, the interrupt is cleared by the interrupt thread. It is not necessary to clear inside the interrupt handler.

Up to 65 Interrupt handlers for Sync error can be registered. If successfully registered, the key number is returned as the return value. If registration is carried out using this key number, the re-registration and deletion of the interrupt handler with this key number becomes possible. If any registration is carried out by specifying 0 as the key number, the interrupt handler will be set to a vacant key number. If there is no vacant key number, an error occurs and (-1) will be returned as the return value.

Deletion of the interrupt handler is registered by setting the address of the callback function to BCL_GBI_IGNORE_SYNCERROR_HANDLER. The interrupt thread does not execute the interrupt handler of BCL_GBI_IGNORE_SYNCERROR_HANDLER.If all 65 interrupt handlers become BCL_GBI_IGNORE_SYNCERROR_HANDLER, they return to the default. (The standard interrupt handler in the access library will be set.)

Sync error may be caused by improper setting of software or faulty design of hardware. Failed hardware can also be the cause.

<Offline>

Because there is no factor to cause any Sync error in the Bus offline, the handler registered with this function does not function.

[Name]

BCL_GBI_addSyncErrorInterruptHandler

[Syntax]

int BCL_GBI_addSyncErrorInterruptHandler(int KeyNo,

BCL_GBI_SYNCERROR_HANDLER handler, unsigned int arg);

[call back function]

void SyncErrorInterruptRoutine(unsigned int arg);

[Argument]

| | |
|---|---|
| KeyNo | Key number |
| handler | Call back function address |
| arg | Value to be given to interrupt handler |

[Return value]

Key number to which interrupt handler is registered

If it is (-1), registration failed (invalid bus number or key number).

[Reference]

BCL_GBI_init, BCL_GBI_finish, BCL_GBI.h

2.4 Control of Library/OPENSTAR Bus

2.4.1 FIFO Flush Wait

Flush of FIFO in all Tester Modules connected to the OPENSTAR Bus that is connected to the Site CPU is waited for. FIFOs exist in the OPENSTAR Bus I/F board and Tester Module. If this function is terminated, it means that all the data that existed in the FIFO immediately before executing this function are written to the Tester Module. Because the CPU issues a read cycle to the PCI bus during execution of this function, the bus is locked by hardware until the FIFO is flushed. Therefore, a delay may occur in DMA transfer, interrupt acceptance, etc. Furthermore, in certain cases, timeout may occur because of execution of this function. Furthermore, in certain cases, timeout may occur because of execution of this function.

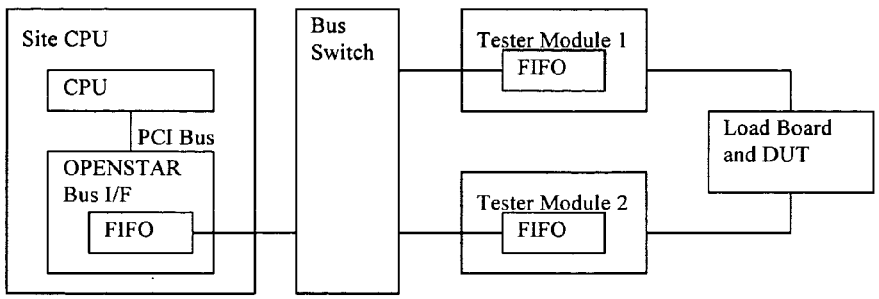

<Offline>

Offline, FIFO of OPENSTAR Bus I/F Emulator does not exist. In addition, the existence of FIFO in the Tester Module is vendor-dependent.

[Name]

BCL_GBI_waitFlushFIFO

[Syntax]

int BCL_GBI_waitFlushFIFO(void);

[Argument]

None

[Return value]

| | |
|---|---|
| BCL_GBI_OK | Flush completed |
| BCL_GBI_ERROR | Error |

[Reference]

BCL_GBI_init, BCL_GBI_finish, BCL_GBI.h

2.4.2 Resetting Module

Tester Modules connected to the Site CPU are reset. In this function, the following processing is conducted.

1. Sending out the bus reset packet to the OPENSTAR Bus
2. Sending out the packet to clear the interrupt to the OPENSTAR Bus
3. Sending out the unlock packet for the interrupt to the OPENSTAR Bus The resetting action and the time needed depend on each Tester Module.

[Name]

BCL_GBI_resetModule

[Syntax]

int BCL_GBI_resetModule(void);

[Argument]

None

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

2.4.3 Bus Initialization

The OPENSTAR Bus access library is initialized. When using the OPENSTAR Bus access library, it is necessary to carry out this initialization at first. In this function, the following processes are executed.

1. Initialization of the variable of the access library

2. Activation of the thread for executing the interrupt handler

The interrupt on the OPENSTAR Bus I/F is in disabled status.

<Offline>

In the case of offline, inter-process communication with the OPENSTAR Bus Emulator is prepared by this function.

[Name]

BCL_GBI_init

[Syntax]

int BCL_GBI_init(unsigned int siteNo);

[Argument]

siteNo     Site number (1 to 8)

[Return value]

BCL_GBI_OK     Normal termination

BCL_GBI_ERROR     The site number is out of definition.

[Reference]

BCL_GBI_init, BCL_GBI_finish, BCL_GBI.h

2.4.4 Bus Release

Process for ending the use of the OPENSTAR Bus access library is carried out.

[Name]

BCL_GBI_finish

[Syntax]

int BCL_GBI_finish(unsigned int siteNo);

[Argument]

siteNo     Site number (1 to 8)

[Return value]

BCL_GBI_OK     Normal termination

BCL_GBI_ERROR     The site number is out of definition.

[Reference]

BCL_GBI_init, BCL_GBI_finish, BCL_GBI.h

3 Functions Specifically for Configuration/Diagnostics

This chapter describes the functions used for hardware configuration and hardware diagnostics. If used for any purpose other than hardware configuration and hardware diagnosis, data transfer to the tester module or interruption operation cannot be performed properly. Use these functions for hardware configuration and hardware diagnosis after learning the hardware structures of OPENSTAR bus I/F board, bus switch and tester module, etc.

No runtime error occurs in this library during operation, but, if used in any function other than bus configuration and hardware diagnosis, functions of this library and the OPENSTAR bus I/F board with respect to interruption of the device driver are not guaranteed.

3.1 Configuration Control (Special Function)

The function described in this chapter is a function used for configuration of OPENSTAR bus I/F and the tester module. Because data transfer to the tester module becomes impossible if carelessly operated, use it after becoming thoroughly familiar with the structure of the hardware and software.

3.1.1 Bus Configuration Write

Data is written to the OPENSTAR Bus I/F and Tester Module configuration register. This function is terminated after the configuration data is stored in the OPENSTAR Bus I/F and the Tester Module.

[Name]

BCL_GBI_writeBusConfig

[Syntax]

int BCL_GBI_writeBusConfig(unsigned int address, unsigned int config);

[Argument]

address        Configuration data address config           Configuration data to be written

[Return value]

BCL_GBI_OK              Normal termination

BCL_GBI_ERROR        Error

[Reference]

BCL_GBI_init, BCL_GBI_finish, BCL_GBI.h

3.1.2 Bus Configuration Read

Data are read from the OPENSTAR Bus I/F and Tester Module configuration register.

[Name]

BCL_GBI_readBusConfig

[Syntax]

int BCL_GBI_readBusConfig(unsigned int address, unsigned int *config);

[Argument]

address        Configuration data address config         Pointer to the variable to store configuration data

[Return value]

BCL_GBI_OK        Normal termination

BCL_GBI_ERROR     Error

[Reference]

BCL_GBI_init, BCL_GBI_finish, BCL_GBI.h

3.2 Interrupt control (Special function)

The function described in this chapter is a function used for bus configuration and hardware diagnostics. Because interruption of the OPENSTAR bus I/F board is directly controlled, if operated carelessly, the device driver of the OPENSTAR bus I/F board and this library cannot execute interrupt processing.

3.2.1 Bus I/F Board Interrupt Enable

Various interrupt signals are enabled on the OPENSTAR Bus I/F board. There are four types of interrupt signals: interrupt from the Tester Module, Bus error, Bus timeout and Sync error. Those signals can be set as the bit information defined as follows. In specifying multiple interrupt signals, set them as logical OR. This function terminates after making sure that the interrupt has been enabled on the OPENSTAR Bus I/F.

[Name]

BCL_GBI_interruptEnable

[Syntax]

int BCL_GBI_interruptEnable(unsigned int status);

[Argument]

| status | Interrupt signal specification | |
|---|---|---|
| | BCL_GBI_INT_MODULE | Interrupt from the Tester Module |
| | BCL_GBI_INT_BUSERROR | Bus error |
| | BCL_GBI_INT_TIMEOUT | Bus timeout |
| | BCL_GBI_INT_SYNCERROR | Sync error |

[Return value]

| BCL_GBI_OK | Normal termination |
|---|---|
| BCL_GBI_ERROR | Error |

[Reference]

BCL_GBI_init, BCL_GBI_finish, BCL_GBI.h

3.2.2 Bus I/F Board Interrupt Disable

Various interrupt signals are disabled on the OPENSTAR Bus I/F board. There are four types of interrupt signals: interrupt from the Tester Module, Bus error, Bus timeout and Sync error. Those signals can be set as the bit information defined as follows. In specifying multiple interrupt signals, set them as logical OR. This function terminates after making sure that the interrupt has been disabled on the OPENSTAR Bus I/F.

[Name]

BCL_GBI_interruptDisable

[Syntax]

int BCL_GBI_interruptDisable(unsigned int status);

[Argument]

status          Interrupt signal specification

| | |
|---|---|
| BCL_GBI_INT_MODULE | Interrupt from the Tester Module |
| BCL_GBI_INT_BUSERROR | Bus error |
| BCL_GBI_INT_TIMEOUT | Bus timeout |
| BCL_GBI_INT_SYNCERROR | Sync error |

[Return value]

| | |
|---|---|
| BCL_GBI_OK | Normal termination |
| BCL_GBI_ERROR | Error |

[Reference]

BCL_GBI_init, BCL_GBI_finish, BCL_GBI.h

3.2.3 Bus I/F Board Interrupt Read

Various interrupt signals are read on the OPENSTAR Bus I/F board. There are four types of interrupt signals: interrupt from the Tester Module, Bus error, Bus timeout and Sync error. Those signals can be read as the bit information defined as follows:

[Name]

BCL_GBI_interruptRead

[Syntax]

int BCL_GBI_interruptRead(unsigned int *status);

[Argument]

status          Pointer to the variable to read the interrupt signal

| | |
|---|---|
| BCL_GBI_INT_MODULE | Interrupt from the Tester Module |
| BCL_GBI_INT_BUSERROR | Bus error |
| BCL_GBI_INT_TIMEOUT | Bus timeout |

| | BCL_GBI_INT_SYNCERROR | Sync error |

[Return value]

| | BCL_GBI_OK | Normal termination |
| | BCL_GBI_ERROR | Error |

[Reference]

BCL_GBI_init, BCL_GBI_finish, BCL_GBI.h

3.2.4 Bus I/F Board Interrupt Clear

Various interrupt signals are cleared on the OPENSTAR Bus I/F board. There are four types of interrupt signals: interrupt from the Tester Module, Bus error, Bus timeout and Sync error. Those signals can be set as the bit information defined as follows. In specifying multiple interrupt signals, set them as logical OR. This function clears the interrupt on the OPENSTAR Bus I/F after the FIFO of each Tester Module immediately before this function was executed has been flushed. This function terminates after making sure that the interrupt has been cleared on the OPENSTAR Bus I/F.

[Name]

BCL_GBI_interruptClear

[Syntax]

int BCL_GBI_interruptClear(unsigned int status);

[Argument]

status    Interrupt signal specification

| | BCL_GBI_INT_MODULE | Interrupt from the Tester Module |
| | BCL_GBI_INT_BUSERROR | Bus error |
| | BCL_GBI_INT_TIMEOUT | Bus timeout |
| | BCL_GBI_INT_SYNCERROR | Sync error |

[Return value]

| | BCL_GBI_OK | Normal termination |
| | BCL_GBI_ERROR | Error |

[Reference]

BCL_GBI_init, BCL_GBI_finish, BCL_GBI.h

3.2.5 Setting Number of Modules to Be Synchronized

The number of all Tester Modules connected to the OPENSTAR Bus that is connected to the Site CPU is set on the OPENSTAR Bus I/F board. With this setting, the number of modules to synchronize FIFO is determined.

<Offline>

Offline, FIFO of OPENSTAR Bus I/F Emulator does not exist. In addition, the existence of FIFO in the Tester Module is vendor-dependent.

[Name]

BCL_GBI_setSyncCount

[Syntax]

int BCL_GBI_setSyncCount(unsigned int number);

[Argument]

number       Number of modules to be synchronized

[Return value]

BCL_GBI_OK        Normal termination

BCL_GBI_ERROR        Error

[Reference]

BCL_GBI_init, BCL_GBI_finish, BCL_GBI.h

As described above, according to the present invention, there is provided the test emulator, the test module emulator, and the record medium storing the programs for emulating appropriately the test apparatus which is used with various modules.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A computer readable medium storing therein instructions for causing a computer to function as an emulating apparatus, the emulating apparatus including a plurality of test modules for supplying a test signal to each of devices under test, the emulating apparatus comprising:

a plurality of test module emulation sections configured to generate the test signal based on different cycles;

a control emulation section for emulating a control apparatus for controlling the test of the devices under test;

a synchronous emulation section connected to each of the plurality of test module emulation sections, for generating test signal generating timings, at which each of said plurality of test module emulation sections is to generate the test signal in simulation corresponding to cycle time of said test module emulation section, based on instructions from said control emulation section;

a timing alignment section connected to the synchronous emulation section, for aligning the plurality of test signal generating timings generated by said synchronous emulation section in order of time, and outputting them one by one; and a schedule section connected to the timing alignment section and the test module emulation section, for causing said test module emulation section corresponding to one of the test signal generating timings output by said timing alignment section to generate the test signal in simulation in the cycle time corresponding to the test signal generating timing.

2. A test apparatus for testing devices under test, the test apparatus including a system controller, an emulating apparatus and a plurality of test modules for supplying a test signal to each of devices under test, wherein the emulating apparatus comprises:

a test module emulating apparatus;

a control emulation section connected to the system controller, for controlling the test of the devices under test;

a synchronous emulation section connected to the test module emulating apparatus, for generating a plurality of test signal generating timings, at which the test module emulating apparatus is to generate the test signal in simulation corresponding to cycle time of said test module emulating apparatus, based on instructions from said control emulation section;

a timing alignment section connected to the synchronous emulation section, for aligning the plurality of test signal generating timings generated by said synchronous emulation section in order of time, and outputting them one by one; and a schedule section connected to the timing alignment section and the test module emulating apparatus, for causing said test module emulating apparatus corresponding to one of the test signal generating timings output by said timing alignment section to generate the test signal in simulation in the cycle time corresponding to the test signal generating timing, wherein the test module emulating apparatus comprises a pattern generator emulation section for generating the test signal in simulation in the cycle time corresponding to one of the test signal generating timings based on instructions from said schedule section.

3. The test apparatus as claimed in claim 2, wherein the test module emulating apparatus further comprises a test module interface emulation section for notifying a synchronous emulation section of cycle end timing at which the cycle corresponding to one of the test signal generating timings ends, and causing said synchronous emulation section to further generate the test signal generating timing at which the test module emulating apparatus is to generate the test signal in simulation for the next time based on the cycle end timing.

4. A computer readable medium storing therein instructions for causing a computer to function as a test module emulating apparatus including a plurality of test modules for supplying a test signal to each of devices under test, the emulating apparatus connecting to a system controller and being a part of the test apparatus, the test module emulating apparatus being a part of the emulating apparatus, wherein the emulating apparatus comprises:

a control emulation section connected to the system controller, for controlling the test of the devices under test;

a synchronous emulation section connected to the test module emulating apparatus, for generating a plurality of test signal generating timings, at which said test module emulating apparatus is to generate the test signal in simulation corresponding to cycle time of said test module emulating apparatus, based on instructions from said control emulation section;

a timing alignment section connected to the synchronous emulation section, for aligning the plurality of test signal generating timings generated by said synchronous emulation section in order of time, and outputting them one by one; and a schedule section connected to the timing alignment section and the test module emulating apparatus, for causing said test module emulating apparatus corresponding to one of the test signal generating timings output by said timing alignment section to generate the test signal in simulation in the cycle time corresponding to the test signal generating timing, wherein the instructions cause the computer to function as a pattern generator emulation section for generating the test signal in simulation in the cycle time corresponding to one of the test signal generating timings based on instructions from said schedule section.

* * * * *